(12) United States Patent
Weissacher et al.

(10) Patent No.: US 9,347,804 B2
(45) Date of Patent: May 24, 2016

(54) TEST HEAD MANIPULATOR

(71) Applicant: inTEST Corporation, Mount Laurel, NJ (US)

(72) Inventors: Herman Josef Weissacher, Rimsting (DE); Wei Guan, Rosenheim (DE); Christopher L. West, Medford, NJ (US); Charles Paul Nappen, Woodbury, NJ (US); Steven J. Crowell, Merchantville, NJ (US)

(73) Assignee: inTEST Corporation, Mount Laurel, NJ (US)

( * ) Notice: Subject to any disclaimer, the term of this patent is extended or adjusted under 35 U.S.C. 154(b) by 222 days.

(21) Appl. No.: 14/143,560

(22) Filed: Dec. 30, 2013

(65) Prior Publication Data

US 2014/0202269 A1 Jul. 24, 2014

Related U.S. Application Data

(62) Division of application No. 12/528,186, filed as application No. PCT/US2008/002134 on Feb. 19, 2008, now Pat. No. 8,618,822.

(60) Provisional application No. 60/955,515, filed on Aug. 13, 2007, provisional application No. 60/894,515, filed on Mar. 13, 2007, provisional application No. 60/903,015, filed on Feb. 23, 2007.

(51) Int. Cl.
*G01R 31/00* (2006.01)
*G01D 11/30* (2006.01)
*G01R 31/28* (2006.01)

(52) U.S. Cl.
CPC ............ *G01D 11/30* (2013.01); *G01R 31/2891* (2013.01)

(58) Field of Classification Search
CPC .......... G01R 31/2887; G01R 31/2891; G01R 31/2893; G01R 31/2601; G01R 31/2855; G01R 31/2862; G01R 31/31905
See application file for complete search history.

(56) References Cited

U.S. PATENT DOCUMENTS

| 4,527,842 A | * | 7/1985 | Teramachi | ............ | F16C 29/064 |
| | | | | | 384/45 |
| 4,943,020 A | * | 7/1990 | Beaucoup | ................ | B23Q 1/48 |
| | | | | | 248/123.11 |

(Continued)

FOREIGN PATENT DOCUMENTS

| AU | 7141481 A | 12/1981 |
| FR | 2806024 A1 | 9/2001 |

(Continued)

OTHER PUBLICATIONS

International Search Report for PCT/US2008/002134, Jul. 1, 2008.

(Continued)

*Primary Examiner* — Tung X Nguyen
(74) *Attorney, Agent, or Firm* — Caesar Rivise, PC

(57) ABSTRACT

A test head manipulator system comprising a base structure, a main arm unit configured to support a test head and to be moved relative to the base structure, an actuator having a range of motion of L, and an enhancement mechanism positioned between the main arm unit and the actuator and configured such that movement of the actuator a first distance causes the main arm unit to move a second distance that is greater than the first distance. Additionally, a fluid control system for controlling a test head manipulator system. The pneumatic control system includes a regulator configured to controllably provide an output pressure to the main fluid actuator, and a second fluidly controlled actuator configured to adjust the regulator to modify the output pressure provided to the main fluid actuator. The second actuator is configured to be positively positioned in at least four operating modes with each operating mode causing the regulator to provide a different output pressure to the main fluid actuator.

18 Claims, 72 Drawing Sheets

(56) References Cited

U.S. PATENT DOCUMENTS

| | | | |
|---|---|---|---|
| 6,378,864 B1 | 4/2002 | Iesaka | |
| 6,483,336 B1 * | 11/2002 | Harris | G01R 1/0408 269/21 |
| 7,685,885 B2 * | 3/2010 | Cowgill | G01N 3/04 73/760 |
| 2006/0219145 A1 | 10/2006 | Trendelkamp | |

FOREIGN PATENT DOCUMENTS

| | | |
|---|---|---|
| JP | 2001-328797 | 11/2001 |
| KR | 20010018348 | 3/2001 |
| WO | WO 2005/015245 | 2/2005 |

OTHER PUBLICATIONS

CN Office Action issued in corresponding Chinese Application No. 200880005589.7.

Preliminary Notice of First Office Action issued in R.O.C. Patent Application No. 97106236.

* cited by examiner

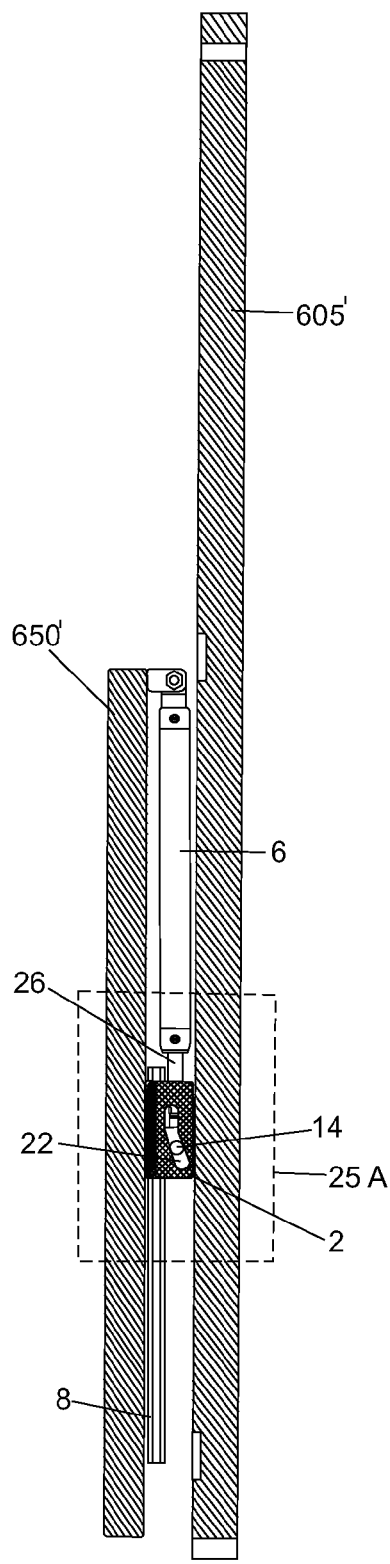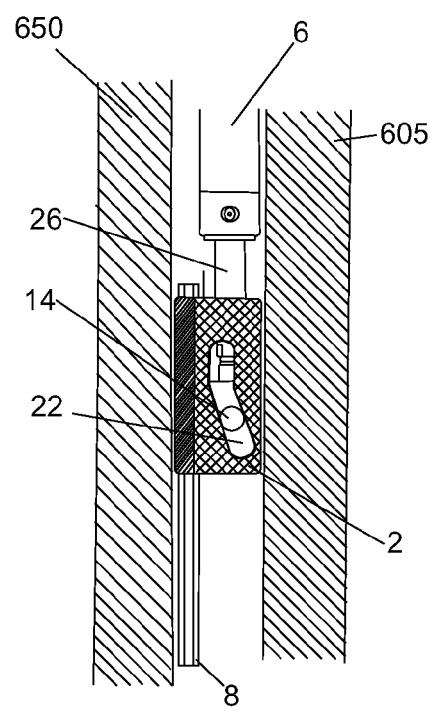
FIG. 25
FIG. 25 A

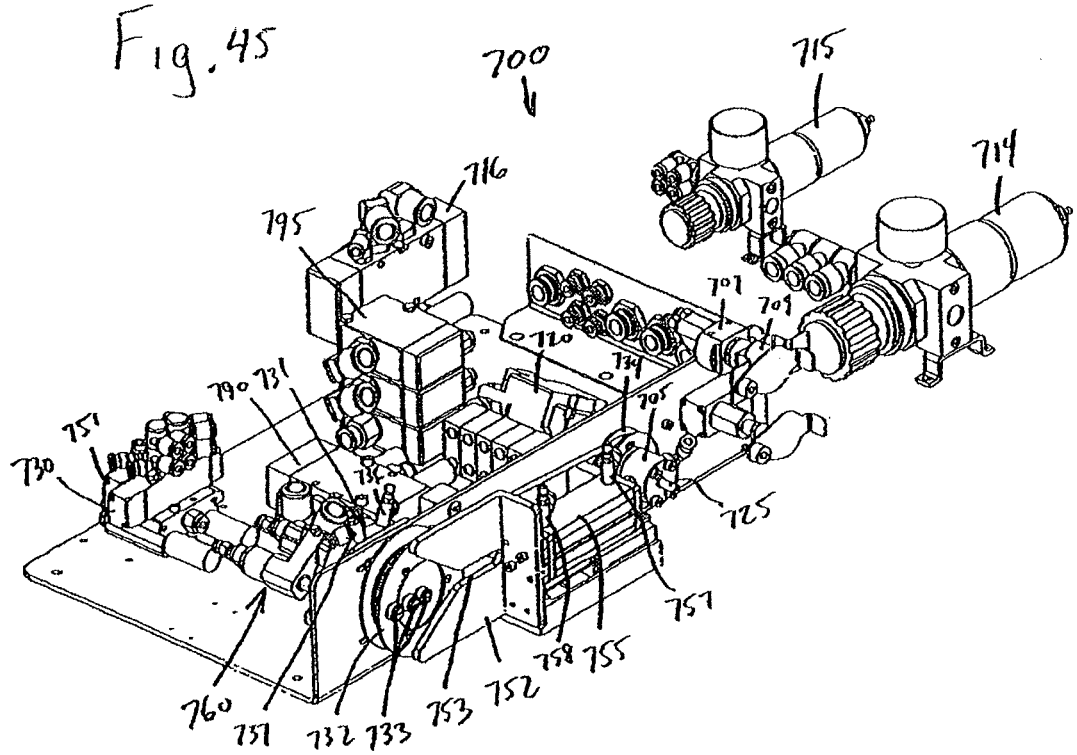

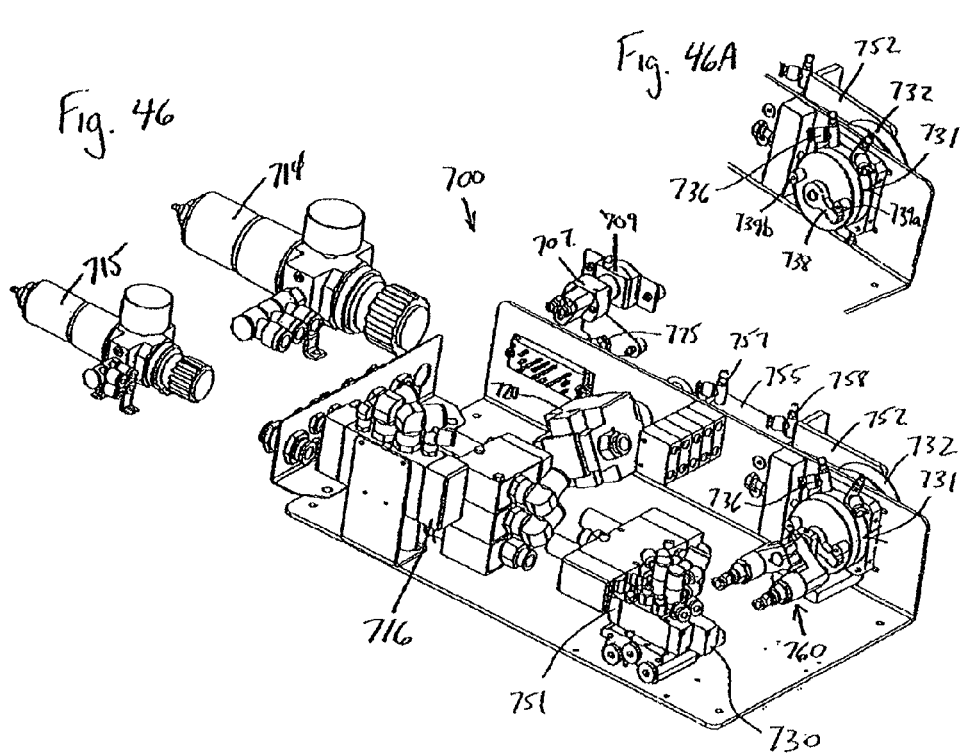
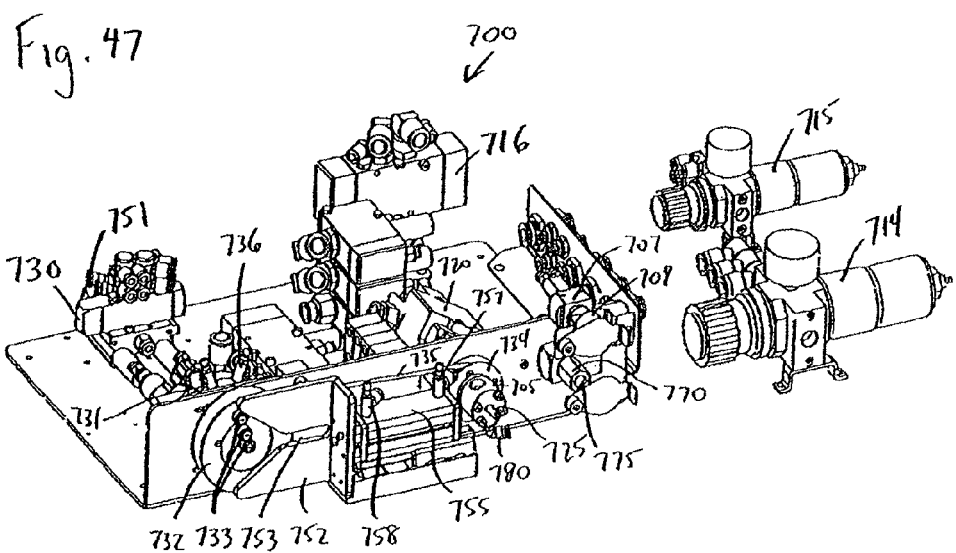

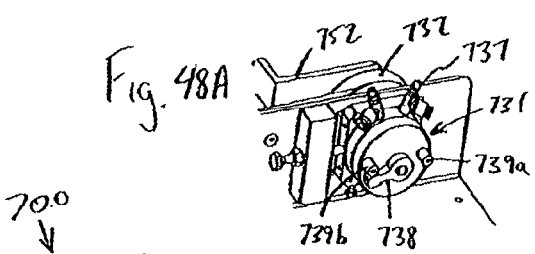
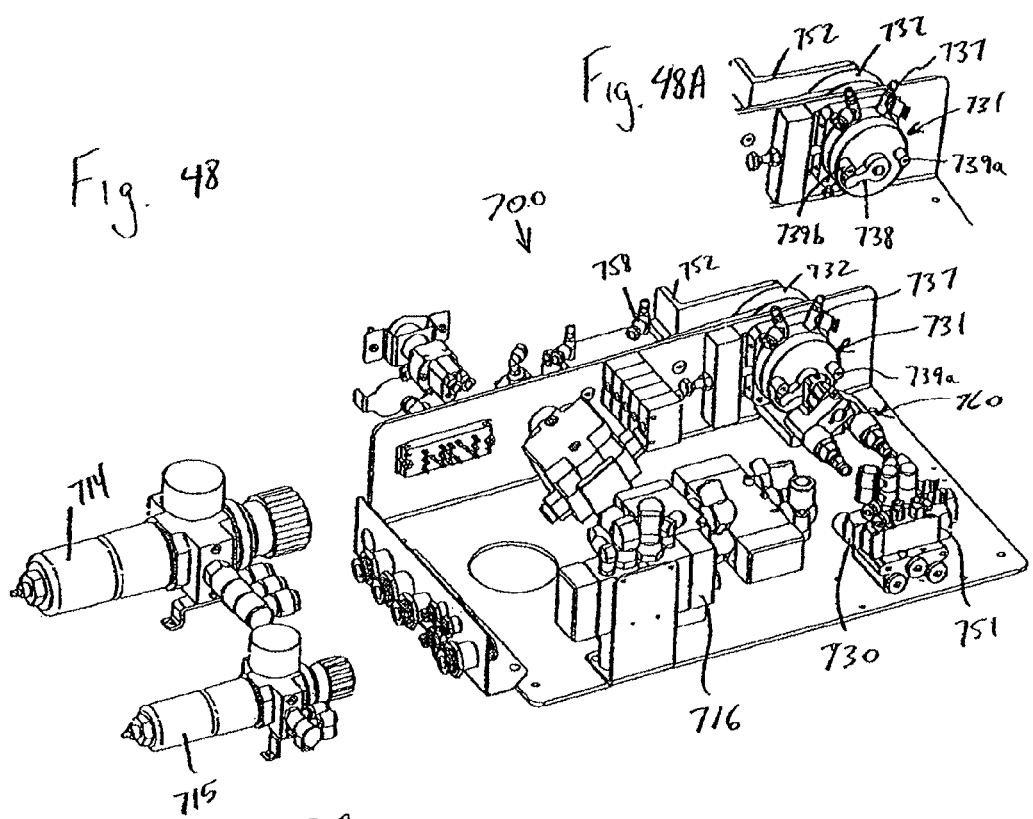
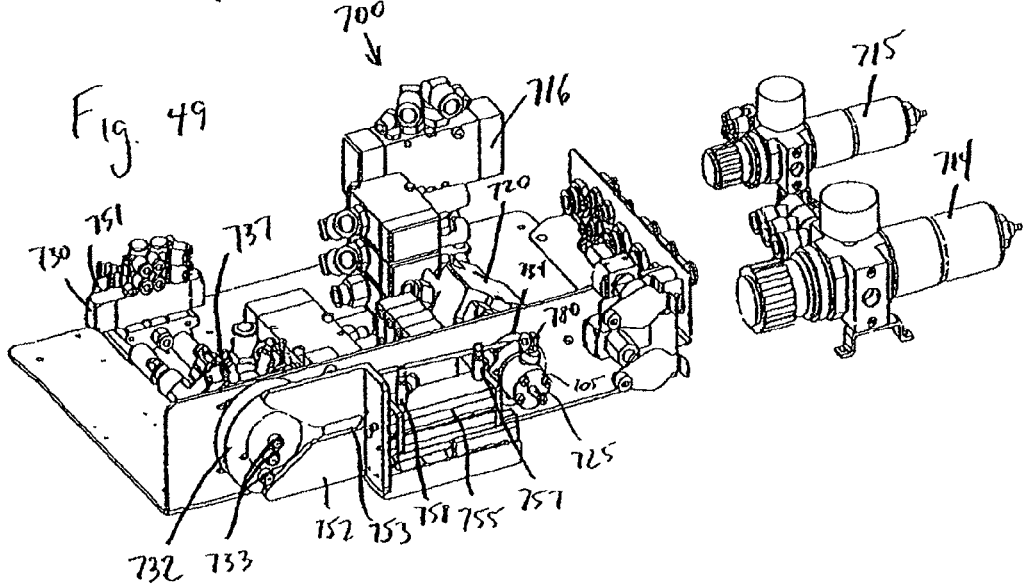

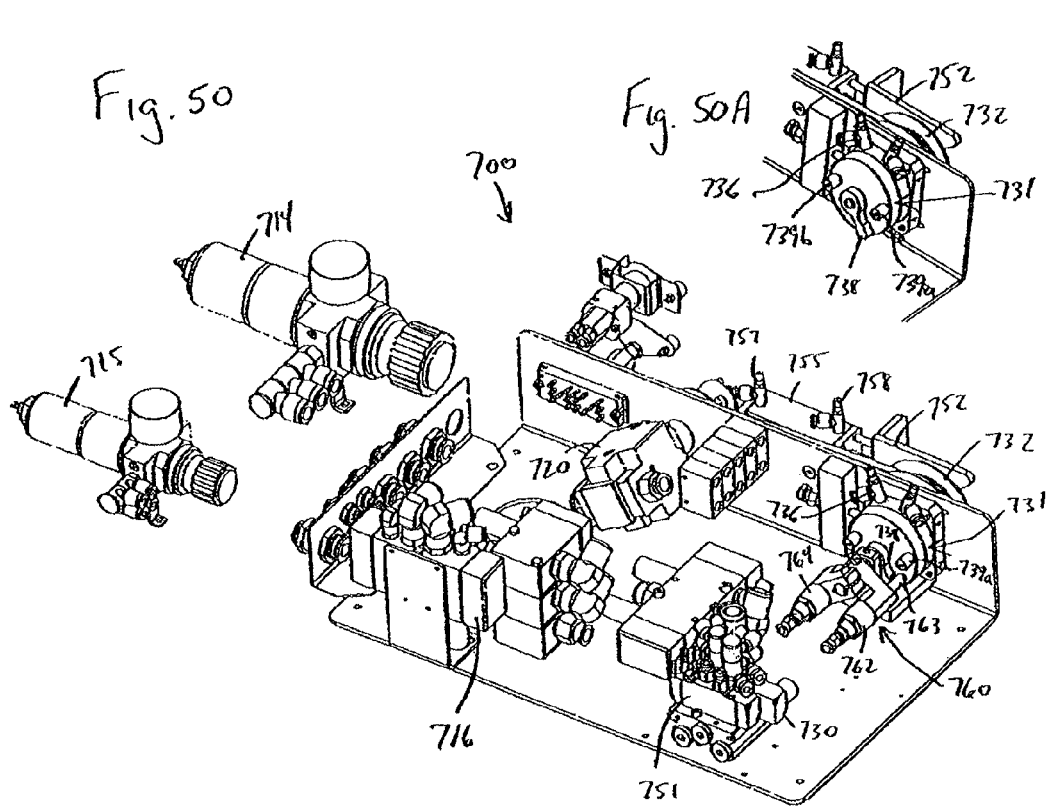
Fig. 50
Fig. 50A
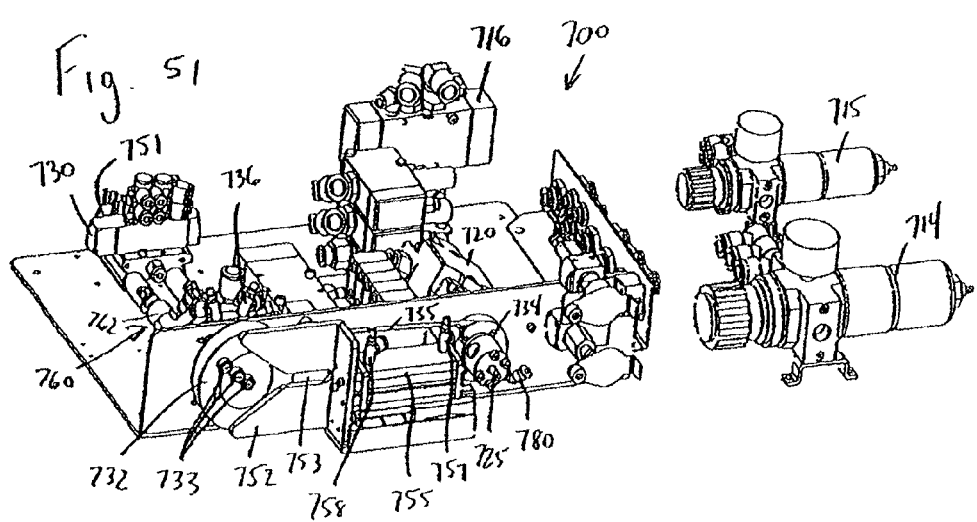
Fig. 51

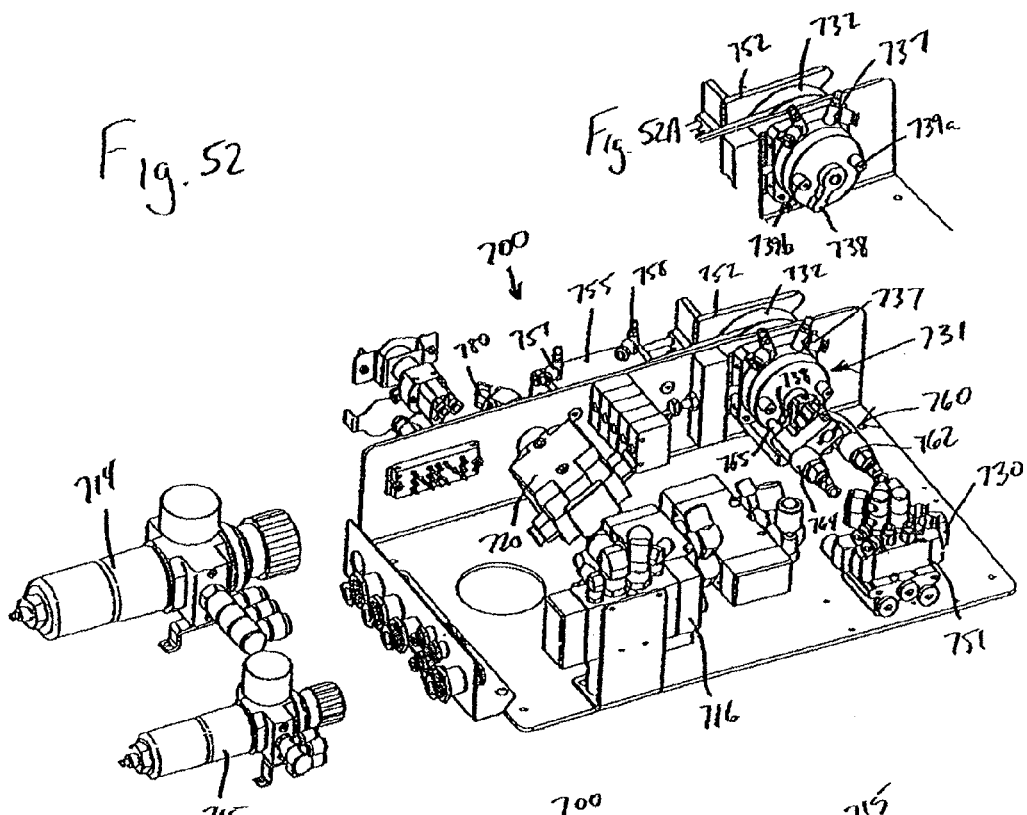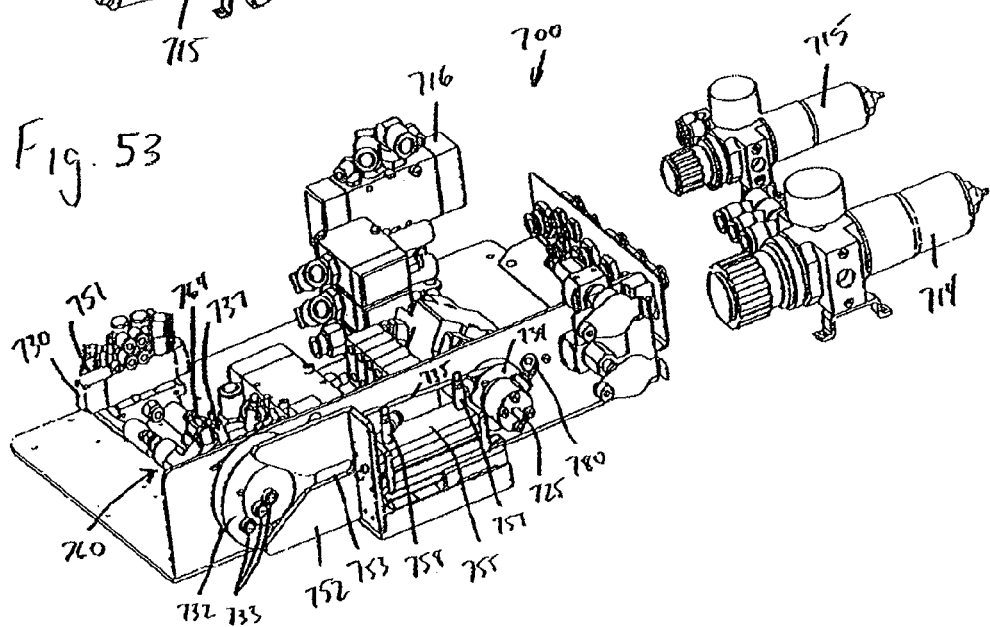

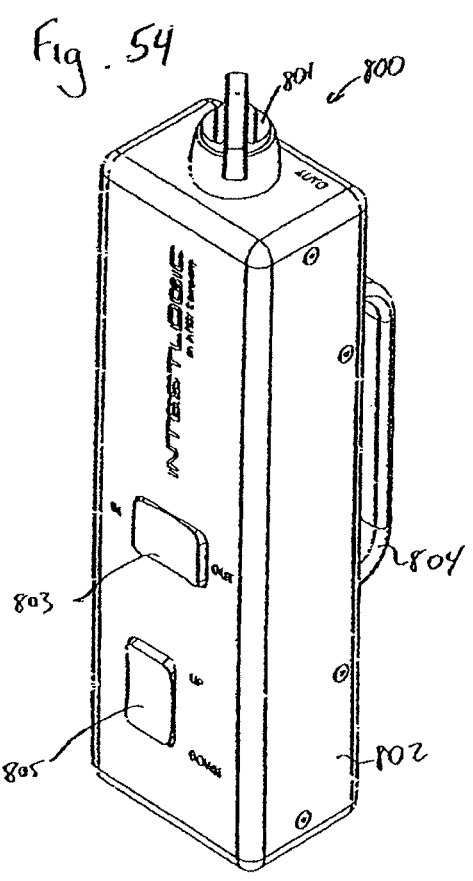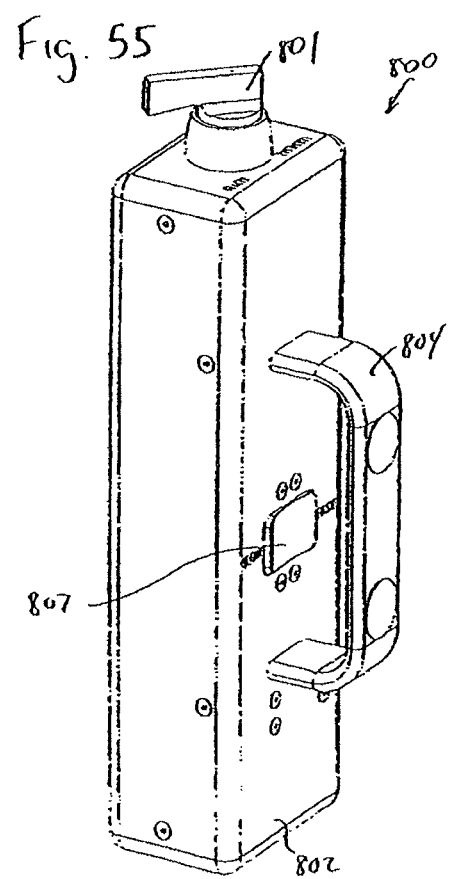

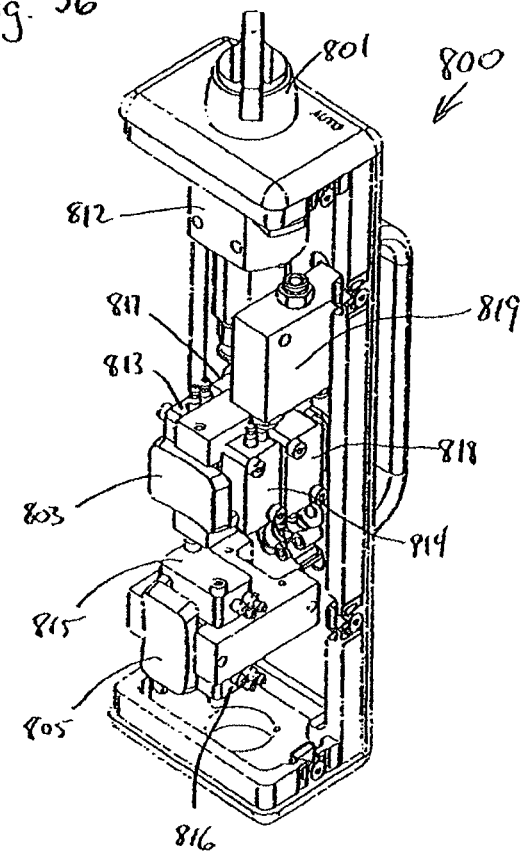

TEST HEAD MANIPULATOR

CROSS REFERENCE TO RELATED APPLICATIONS

This application is a Divisional of U.S. National Phase application Ser. No. 12/528,186, filed Sep. 13, 2010, now U.S. Pat. No. 8,618,822, which is a 371 of PCT International Application No. PCT/US2008/002134, filed Feb. 19, 2008, which claims priority to U.S. Provisional Patent Application Ser. No. 60/903,015, filed Feb. 27, 2007; U.S. Provisional Patent Application Ser. No. 60/894,515, filed Mar. 13, 2007; and U.S. Provisional Patent Application Ser. No. 60/955,515, filed Aug. 13, 2007; which are incorporated fully herein by reference.

BACKGROUND OF THE INVENTION

The present invention relates to systems for positioning and manipulating loads, and more particularly, to systems for positioning and manipulating test heads.

Test heads are often utilized in the testing of integrated circuits. In order to use a test head to test integrated circuits, the test head is typically "docked" to a piece of peripheral equipment such as a prober or a device handler (hereinafter "peripheral"). A test head manipulator is typically used to position and manipulate the test head during the docking operation.

In docking a test head to a peripheral, it is desirable that the test head be moveable in a number of directions (i.e., that the test head have a number of degrees of freedom). Further, it is, also desirable to have the test head be compliantly moveable with respect to various degrees of freedom (i.e., the test head is substantially weightless or may be moved with a relatively small amount of externally applied force with respect to each of the degrees of freedom).

If a test head can move (in conjunction with the test head manipulator) along and rotate about each of X-axis, Y-axis, and Z-axis, the manipulator is said to provide at least six (6) degrees of freedom. If a test head can be moved compliantly, both linearly and rotationally, with respect to its own axes then the test head is said to be compliant with six (6) degrees of freedom.

Because test heads are typically very expensive, it is often desirable to use the same test head to dock with various different peripherals. For example, the same test head may be used to dock in a horizontal plane with a device handler (e.g., a test head may dock with a device handler from below the device handler) and a prober (e.g., a test head may dock with a prober from above the prober). In order to dock with various different types of peripherals, a test head manipulator desirably has a long vertical stroke (e.g., a long vertical range of motion). However, because of size constraints on test heads and the associated manipulators, this is not always practical. Additionally, certain test head manipulator systems utilize pneumatic cylinders to position and manipulate test heads in the vertical direction. In such a design, the vertical stroke provided by the test head manipulator is limited by the stroke of the pneumatic cylinder arrangement. Often, with larger test heads, the stroke of a pneumatic cylinder arrangement may be inadequate to provide a vertical range of motion adequate for docking a test head with the different types of peripherals.

As provided above, in systems for the docking of a test head, it is sometimes desirable to provide complaint motion in each of the test head's six (6) degrees of freedom. This means that during docking, a test head manipulator desirably balances the test head in a substantially weightless condition in each of the these six (6) degrees of freedom such that an operator can move the test head manually in each of the directions with relatively little force. However, as test heads have become larger and heavier, the physical force required to manually manipulate the test head in certain directions (even in a compliant state) may be difficult if not impossible for certain operators to provide.

As such, it would be desirable to provide a test head positioning and manipulation system addressing the above recited deficiencies.

SUMMARY OF THE INVENTION

In one aspect, the present invention provides, a test head manipulator system comprising a base structure, a main arm unit configured to support a test head and to be moved along a first axis relative to the base structure, an actuator having a range of motion of L along an axis parallel to the first axis, and an enhancement mechanism positioned between the main arm unit and the actuator and configured such that movement of the actuator a first distance causes the main arm unit to move along the first axis a second distance that is greater than the first distance.

In another aspect of the invention, the enhancement mechanism includes a lift carriage which is associated with and moves with the actuator.

In yet another aspect of the invention, the enhancement mechanism further includes a strap which is looped about the lift carriage and which has a first end secured relative to the base structure and a second end secured relative to the main arm unit.

In an alternative aspect, the present invention provides a fluid control system for controlling a test head manipulator system which includes a main fluid actuator configured to vertically position a test head relative to a base structure. The fluid control system includes a regulator configured to controllably provide an amount of fluid to the main fluid actuator, and a second fluidly controlled actuator configured to adjust the regulator to modify the amount of fluid provided to the main fluid actuator. The second actuator is configured to be positively positioned in at least four operating modes with each operating mode causing the regulator to provide a different amount of fluid to the main fluid actuator.

In another aspect of the invention, the second actuator is configured to be positively positioned in a fifth operating mode which is a neutral mode.

In yet another aspect of the invention, the fluid control system further comprises a fluidly actuated safety lock configured to lock the vertical position of the test head relative to the base structure if a fluid pressure in the main fluid actuator is below a threshold value.

In still yet another aspect of the invention, the fluid control system further comprises a fluid rate control including at least one flow control valve which is fluidly actuable between an open position and closed position to increase or decrease, respectively, a rate of fluid flow to the main fluid actuator.

In yet another aspect, the present invention provides a fluid control system for controlling a test head manipulator system which includes a main fluid actuator configured to vertically position a test head relative to a base structure. The fluid control system includes a regulator configured to controllably provide an output pressure to the main fluid actuator at a first given rate along a first flow path. A supplemental flow path extends between the regulator and the main fluid actuator. A supplemental valve is positioned along the supplemental flow path and has a non-actuated, closed position. A controller is configured to determine a vertical extension of the main fluid actuator and actuate the supplemental valve when the main fluid actuator is vertically extended within a given range.

In still another aspect, the present invention provides a test head manipulator system comprising a coupling unit configured to support a test head for rotation about a given axis. A rotation unit is configured to controllably provide a rotational output. A drive belt extends between the rotation unit and the coupling unit and is configured to transmit the rotational output to the coupling unit. At least one idler is biased into engagement with the drive belt and moveable over a given path such that when an external force is applied to the coupling unit, the idler maintains a desired tension on the drive belt.

In yet another aspect, the present invention provides, a test head manipulator system comprising a base structure with a linear actuator assembly. The linear actuator assembly comprises a fluid cylinder connected at one end to the carriage, a brake shoe connected to a piston rod extending from an opposite end of the fluid cylinder and at least one ramp block defining a ramped slot, the at least one ramp block connected to the base plate for linear motion therealong. A pin member extends from the brake shoe and is received in the ramped slot such that movement of the cylinder causes the pin member to move along the ramped slot and thereby move the brake shoe into and out of engagement with the base plate.

BRIEF DESCRIPTION OF THE DRAWINGS

FIG. 22A is an expanded view as indicated by the rectangle 22A in FIG. 22.

FIG. 23A is an expanded view as indicated by the circle 23A in FIG. 23.

FIG. 25 is a cross-sectional view along the line 25-25 in FIG. 24.

FIG. 25A is an expanded view as indicated by the rectangle 25A in FIG. 25.

FIG. 26A is an expanded view as indicated by the circle 26A in FIG. 26.

FIG. 28A is an expanded view as indicated by the rectangle 28A in FIG. 28.

FIG. 29A is an expanded view as indicated by the circle 29A in FIG. 29.

FIG. 31A is an expanded view as indicated by the rectangle 31A in FIG. 31.

FIG. 32A is an expanded view as indicated by the circle 32A in FIG. 32.

FIGS. 35A and 35B are right-front perspective views of the column assembly showing the main arm assembly in its lowest and uppermost positions, respectively.

FIG. 45 is a partial internal view of the pneumatics control unit similar to FIG. 44 illustrating the blocking member in a non-blocking position.

FIGS. 46 and 47 are partial internal views similar to FIGS. 43 and 44 with the unit in an up mode; FIG. 46A showing a portion of the unit with the manual mode assembly removed for clarity.

FIGS. 48 and 49 are partial internal views similar to FIGS. 43 and 44 with the unit in an down mode; FIG. 48A showing a portion of the unit with the manual mode assembly removed for clarity.

FIGS. 50 and 51 are partial internal views similar to FIGS. 43 and 44 with the unit in a manual up mode; FIG. 50A showing a portion of the unit with the manual mode assembly removed for clarity.

FIGS. 52 and 53 are partial internal views similar to FIGS. 43 and 44 with the unit in a manual down mode; FIG. 52A showing a portion of the unit with the manual mode assembly removed for clarity.

FIGS. 54 and 55 are front and back isometric views, respectively, of an exemplary remote control unit.

FIG. 56 is a view similar to FIG. 54 with a portion of the housing removed.

DETAILED DESCRIPTION OF THE INVENTION

Preferred features of selected embodiments of this invention will now be described with reference to the Figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Figure 1A:
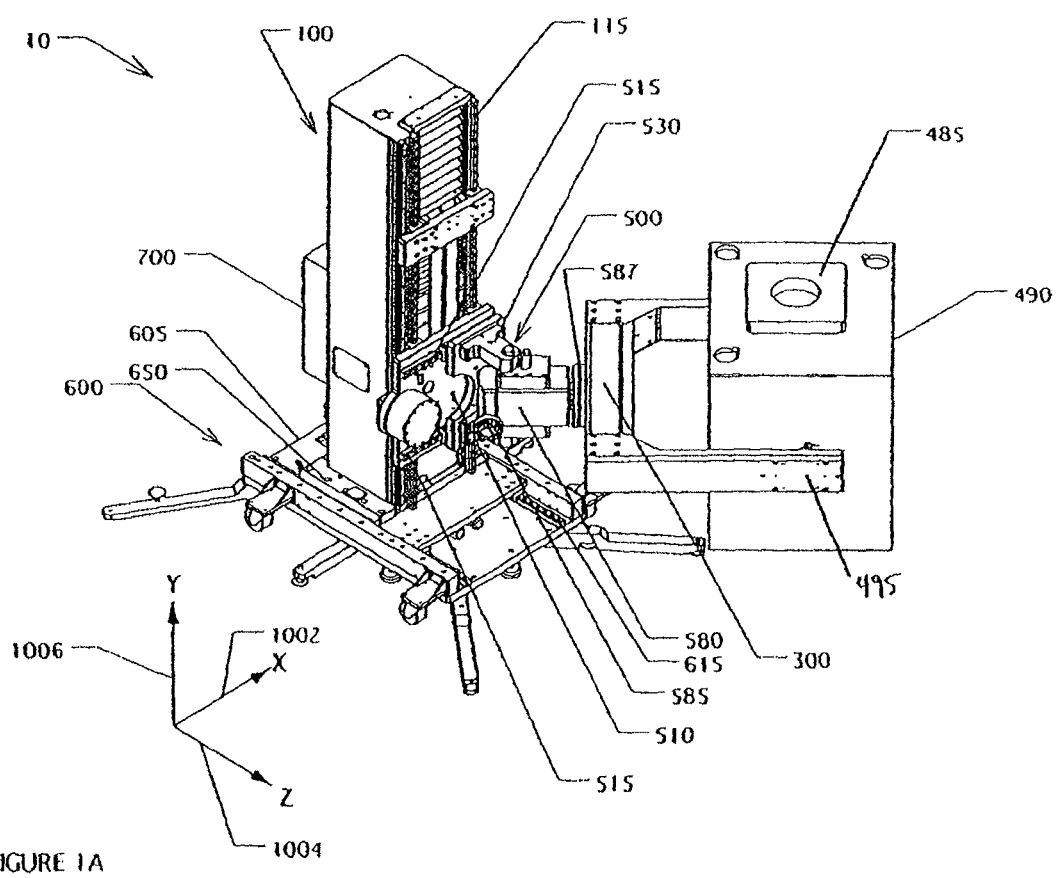
FIG. 1A is isometric view of an exemplary manipulator system in accordance with a first embodiment of the present invention.
Figure 1B:
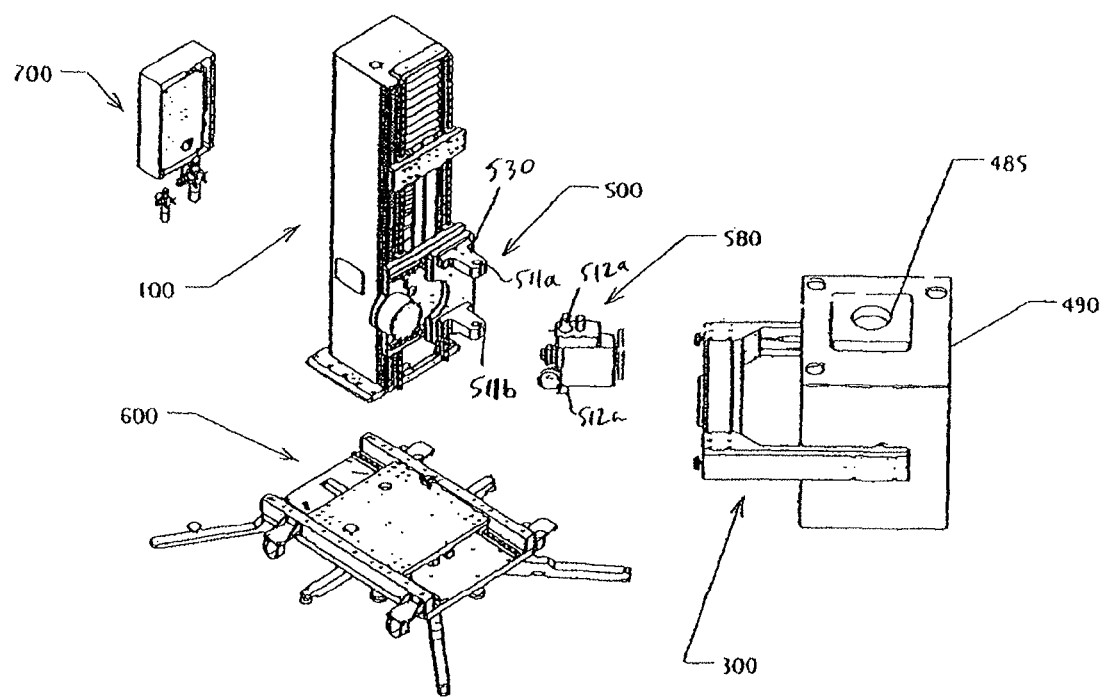
FIG. 1B is a partially exploded view of the manipulator system of FIG. 1A.

Test head manipulator system 10 which is a first embodiment of the present invention will be described with reference to FIGS. 1A-42C. Referring to FIGS. 1A and 1B, manipulator system 10 generally includes column unit 100, cradle 300, test head 490, main arm assembly 500, roll gear box 580, base unit 600, and controller 700. Not shown is the mainframe cabinet of the automatic testing equipment (ATE) and the cable, which connects test head 490 to the mainframe cabinet. The cable may contain various equipment, for example, electrical wiring that connects signals, power supplies, and grounds between the test head and mainframe cabinet, fiber optic signal connections, and flexible ducting for air or other gaseous coolants and/or flexible hoses and/or tubing for liquid coolants for cooling internal components, for example, densely packed very high-speed, precision circuitry.

Cradle 300 holds test head 490 at two points 495 (only one being visible), which define an axis that passes approximately through its center of gravity. Test head 490 may pivot about this axis. Other cradles and test head holding mechanisms, providing further capabilities and more degrees of motion freedom are known in the art and may be substituted as appropriate for specific applications. Test head 490 includes device under test ("dut") test site 485. Test head 490 is shown in what is known as the "dut up" orientation with the dut test site 485 facing up.

As shown in FIGS. 1A and 1B, cradle 300 is held by roll gear box 580, which includes hand wheel 585. Rotating hand wheel 585 drives a worm gear mechanism, which is internal to gear box 580. This worm gear mechanism turns coupling 587 to which cradle 300 is attached. Thus, rotating hand wheel 585 causes rotation of cradle 300 and test head 490 about its roll axis. In an exemplary embodiment, roll gear box 580 provides plus/minus approximately 95 degrees of roll motion, which enables test head 490 to be moved to, and placed in, any dut up, dut down, dut vertical, or intermediate angular position. Roll compliance for docking may be provided by a number of techniques.

Main arm assembly 500 generally includes main arm plate 510 with pivot-coupling unit 530 attached thereto by means of two horizontal linear rails 515, which are situated in a vertical plane, and bearings or the like. Roll gear box 580 is pivotally coupled to pivot coupling unit 530 via a pair of journals 512a, 512b engaging low friction bearings 511a 511b, or the like, so that roll gear box 580 is free to rotate about a vertical axis defined by such pivotal coupling. In an exemplary embodiment, more than 90 degrees of rotation is provided by the pivotal coupling. Horizontal side-to-side motion is provided by moving main arm plate 510 along horizontal rails 515 and the associated bearings.

Roll gear box 580' of another exemplary embodiment of the present invention will be described with reference to FIGS. 3-13. As will be described, roll gear box 580' includes compliance unit 1600 configured to facilitate roll compliance. While gear box 580' will be described with reference to pivot coupling unit 530 and cradle 300 of test head manipulator system 10, it may be utilized with other test head manipulator systems.

Referring to FIGS. 3-6, roll gear box 580' includes journal block 1582 from which journals 512a, 512b extend for pivotal connection with bearings 511a, 511b of pivot coupling unit 530. Swing lock mechanism 1581 may be provided to lock journal block 1582 relative to pivot coupling unit 530. Pivot block 1584 is supported by journal block 1582 and is configured to support coupling 587', for example, via a slewing ring bearing 591 or the like, for low-friction rotation about a central axis thereof. Support coupling 587' and bearing 591 make up a coupling unit of the present embodiment. As in the previous embodiment, cradle 300 is connected to coupling 587' such that rotation of coupling 587' causes rotation of cradle 300 and test head 490 about its roll axis.

Figure 6:
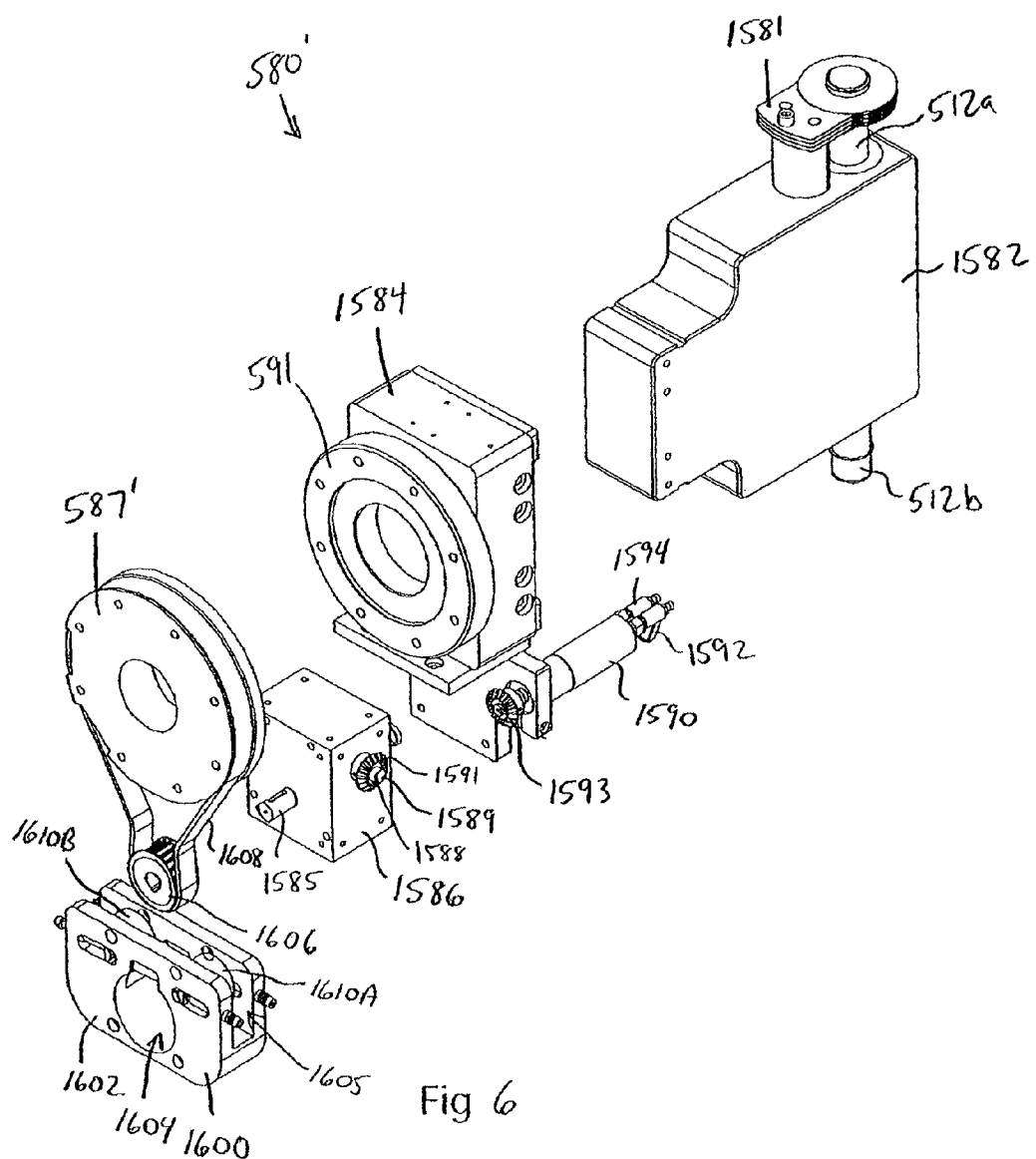
FIG. 6 is an exploded isometric view of the roll gear box of FIG. 3.

Worm gear unit 1586 is supported by pivot block 1584 and is configured to provide a controlled rotational output via output shaft 1585. Worm gear shaft 1588 extends across worm gear unit 1586 and includes an internal worm gear (not shown) that engages and drives output shaft 1585. Referring to FIG. 6, end 1589 of worm gear shaft 1588 includes a bevel gear 1591 configured to engage output bevel gear 1593 of drive motor 1590. In the present embodiment, drive motor 1590 is a pneumatic motor and includes inlets 1592 and 1594 for driving drive motor 1590 either in a clockwise or counterclockwise direction. While a pneumatic motor is illustrated, an electric motor or any other rotational drive unit may be utilized. In the present embodiment, the opposite end 1587 of worm gear shaft 1588 is configured to receive a hand wheel or the like, which may be used in addition to or in place of drive motor 1590, to drive output bevel gear 1593.

The rotational output of output shaft 1585 is transmitted to coupling 587' via roll drive pulley 1606 and drive belt 1608. Roll drive pulley 1606 mounts on output shaft 1585 and rotates therewith. Drive belt 1608 extends between roll drive pulley 1606 and coupling 587' and transmits the rotational output from roll drive pulley 1606 to coupling 587'. Roll drive pulley 1606 and coupling 587' are sized to effect a desired gear ratio therebetween. In the present embodiment, the relative sizes of pulley 1606 and coupling 587' are selected to give a reasonable rate of cradle roll rotation in comparison to the speed and torque of drive motor 1590.

Figure 7:
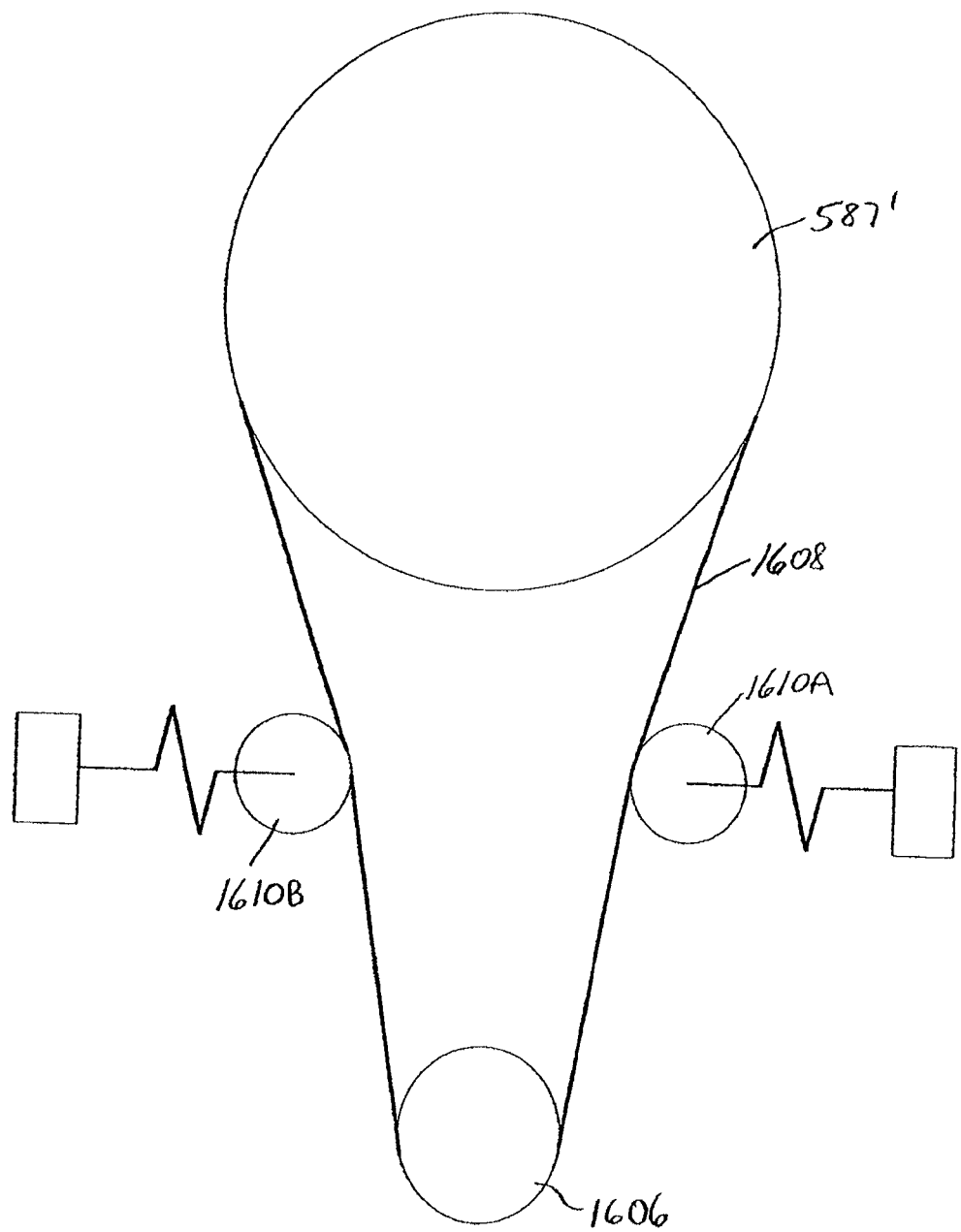
FIG. 7 is a schematic drawing illustrating the roll compliance assembly of the roll gear box of FIG. 3.
Figure 8:
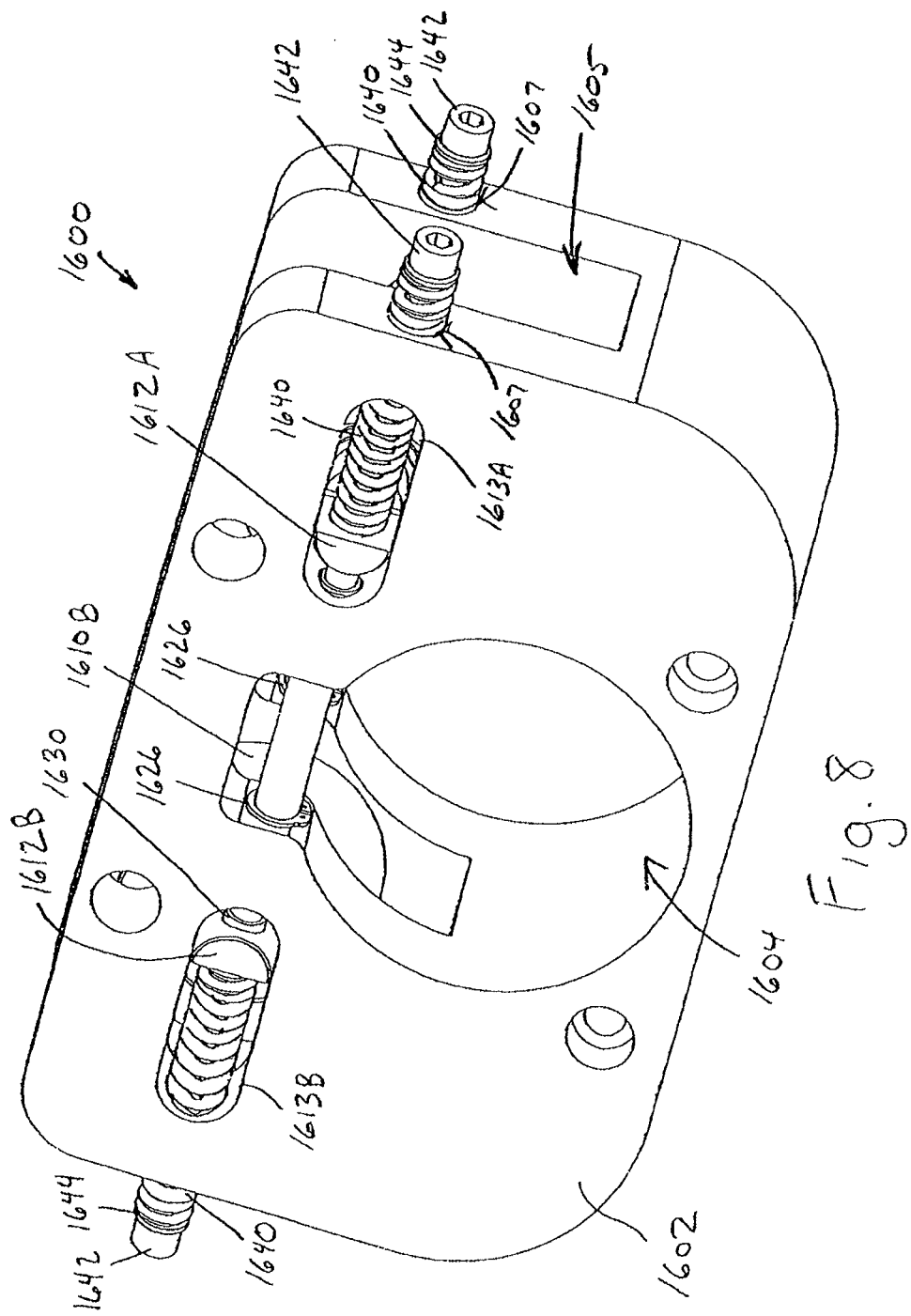
FIG. 8 is an isometric view of an exemplary compliance unit of the roll gear box of FIG. 3.
Figure 9:
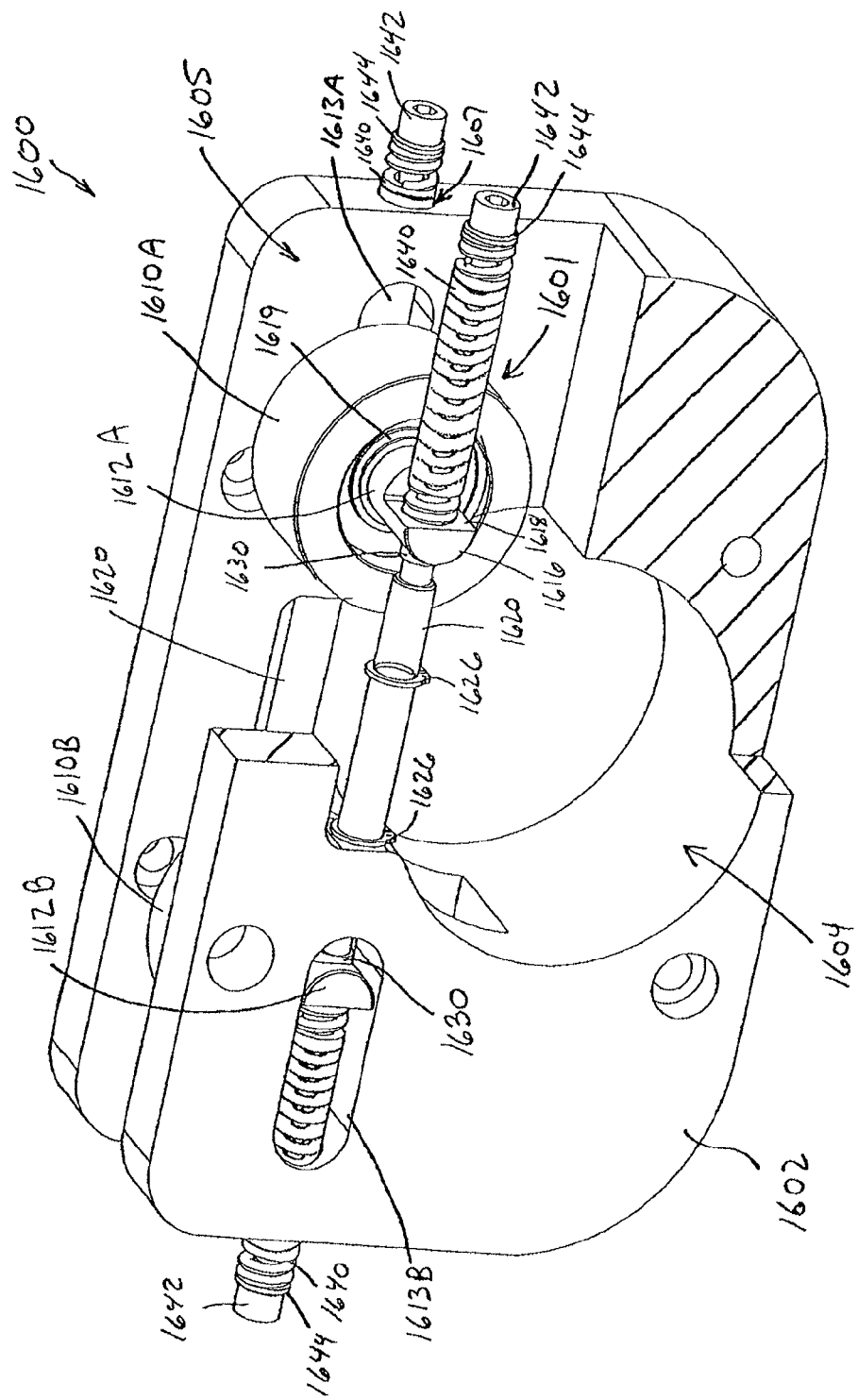
FIG. 9 is an isometric view similar to FIG. 8 shown in partial section.

Referring to FIGS. 6 and 7, compliance unit 1600 of the present embodiment includes a pair of biased idlers 1610A, B. Idlers 1610A, B are mounted with a spring bias or the like and are free to move horizontally or, more generally, along a linear axis that is perpendicular to a line through the centers of coupling 587' and drive pulley 1606. Other ranges of motion may also be utilized. The spring mounts urge idlers 1610A, B inwards to provide tension on drive belt 1608. With roll drive pulley 1606 in a fixed position, for example with drive motor 1590 turned off (the back driving forces through the coupling worm gear may be configured sufficiently high so that drive pulley 1606 is essentially locked), an external rotational force or torque applied to coupling 587' will cause coupling 587' to rotate. In so doing, one of the idlers 1610A, B will move inwards while the other moves outwards. For example, with respect to the configuration illustrated in FIG. 7, if coupling 587' is urged externally to rotate clockwise, right hand idler 1610A moves inwards and left hand idler 1610B moves outwards. If coupling 587' is urged externally to rotate counterclockwise, left hand idler 1610B moves inwards and right hand idler 1610A moves outwards. If the external force or torque is removed, idlers 1610A, 1610B tend to be urged back towards their central position, restoring the load to its initial (neutral) position.

While the idlers 1610A, B are illustrated herein with a spring bias, other biasing means may be utilized. For example, the idlers 1610A, B may be fluidly biased. Furthermore, such fluid bias may be adjustable. For example, the fluid bias may be adjusted based on an operation condition of the test head manipulator system, e.g., the fluid bias is increased when the test head manipulator system is driving the position of the test head and the fluid bias is lower the when the test head is not being driven. Other biasing means and configurations may also be utilized.

Figure 10:
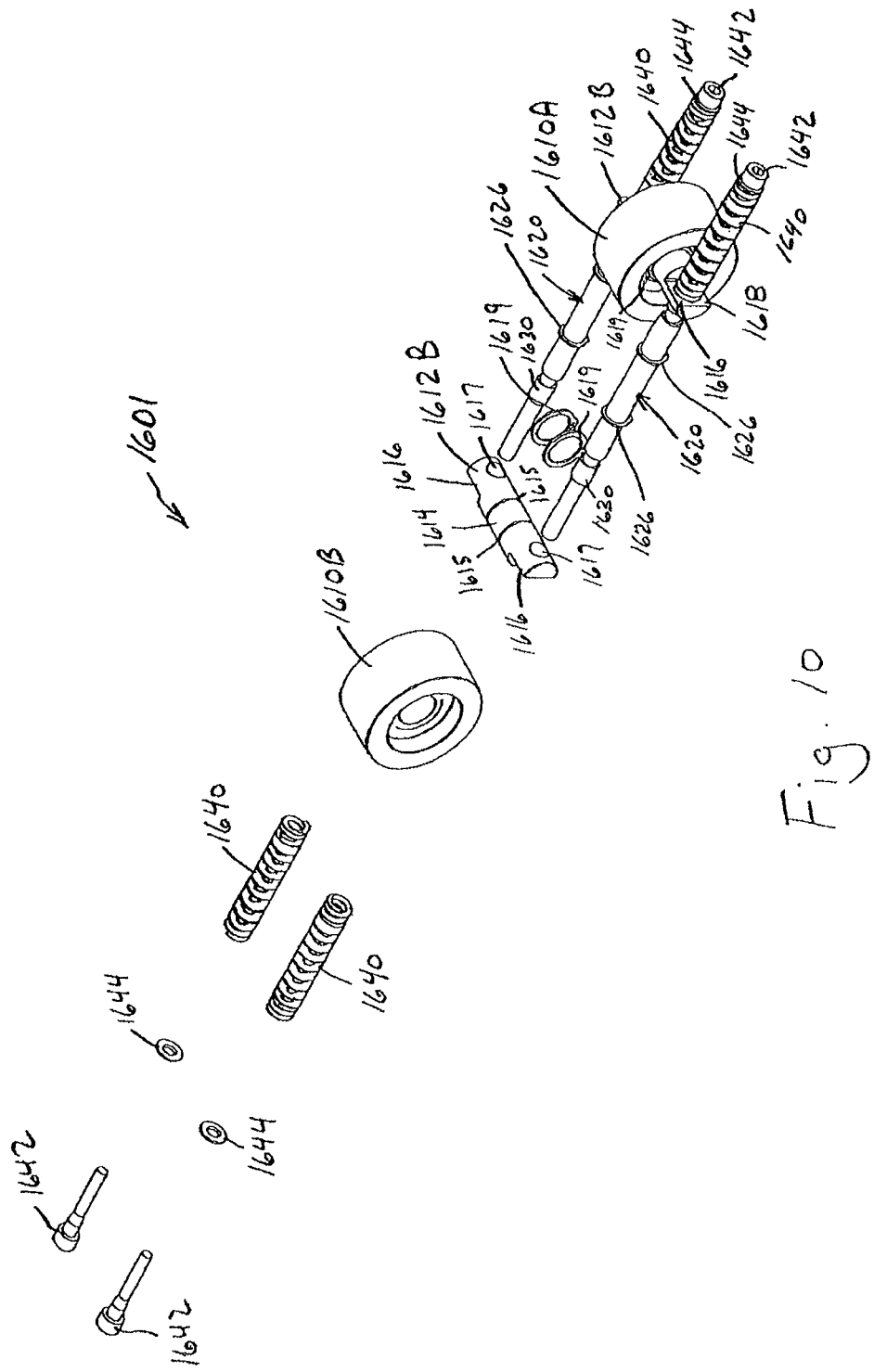
FIG. 10 is a partially exploded isometric view of the idler assembly of the compliance unit of FIG. 8.
Figure 11:
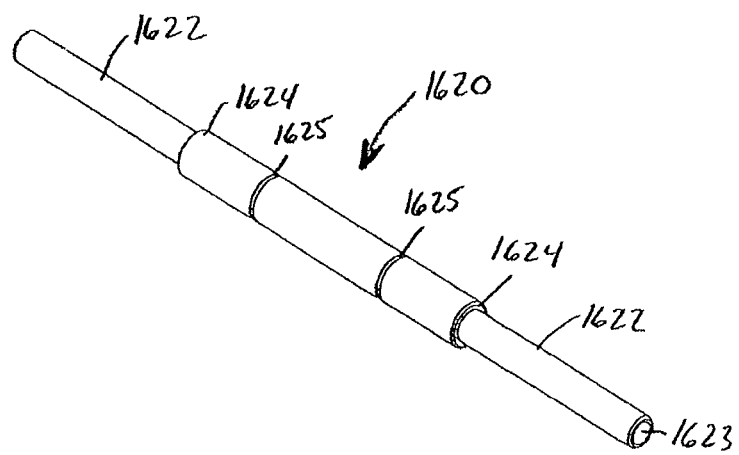
FIG. 11 is an isometric view of a shaft of the compliance unit of FIG. 8.

Having described the general operation of compliance unit 1600, a detailed description of an exemplary configuration of compliance unit 1600 will be provided with reference to FIGS. 6-13. Compliance unit 1600 includes housing 1602 configured to be mounted to worm gear unit 1586. Housing 1602 includes through bore 1604 configured to receive drive pulley 1606. Cross slot 1605 extends into the top of housing 1602 and intersects with through bore 1604 such that drive belt 1608 passing around drive pulley 1606 may extend out of housing 1602 and engage coupling 587'. Cross slot 1605 is also configured to receive idlers 1610A, B with such aligned with drive belt 1608 passing through cross slot 1605. In the present embodiment, each idler 1610A, B is supported on a respective axel 1612A, B. Housing 1602 includes opposed axel slots 1613A configured to support ends of axel 1612A for linear motion therein and opposed axel slots 1613B configured to support ends of axel 1612B for linear motion therein. If desired, axel slots 1613A, B may have different configurations than illustrated. A pair of shaft bores 1607 extend through housing 1602 parallel to cross slot 1605 with one on each side of cross slot 1605. Each shaft bore 1607 passes through a respective axel slot 1613A and axel slot 1613B. Cross slot 1605, shaft bores 1607 and axel slots 1613A, B are configured to support idler assembly 1601 as described hereinafter. An exemplary idler assembly 1601 is illustrated in FIGS. 10-13. Idler assembly 1601 includes a pair of shafts 1620 configured to support axels 1612A, B for linear motion therealong. Referring to FIG. 11, each shaft 1620 includes travel surfaces 1622 adjacent each end. Travel surfaces 1622 are configured to support axel bushings 1630 for low friction travel therealong. A central portion of shaft 1620 may be stepped to define travel limit stops 1624 at each travel surface 1622. The central portion of shaft 1620 includes grooves 1625 for receiving retaining clips 1626 that are engaged after shaft 1620 is positioned in a respective shaft bore 1607 and secure shaft 1620 relative to housing 1602 (see FIG. 9). Each end of shaft 1620 includes a threaded bore 1623 configured to receive a respective spring screw 1642, as described hereinafter. Alternatively, each end of shaft 1620 may be threaded and configured to receive a nut or the like.

Figure 12:
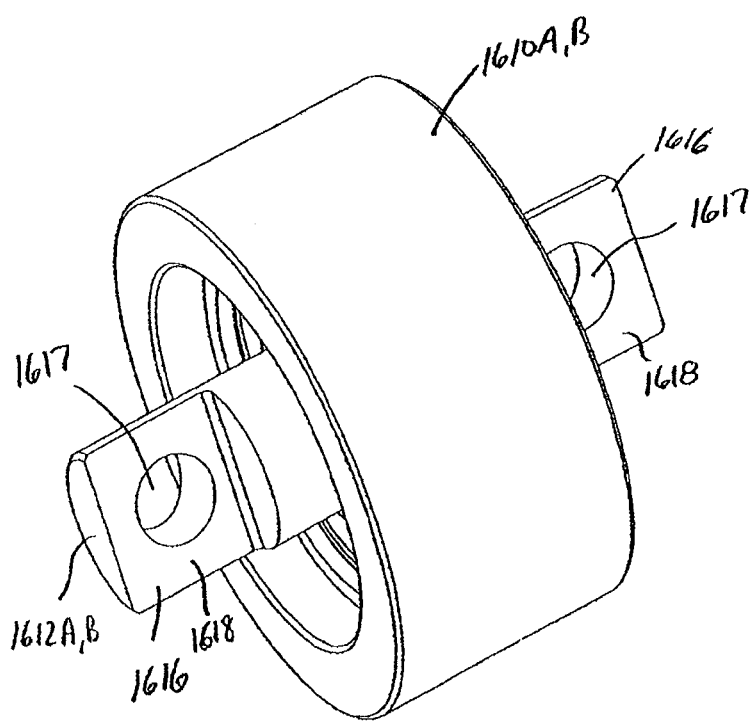
FIG. 12 is an isometric view of the idler of the compliance unit of FIG. 8.

Referring to FIGS. 10 and 12, each idler axel 1612A,B includes central portion 1614 configured to rotatably support a respective idler 1610A, B. Idler 1610A, B may include bearings or the like (not shown) to reduce friction. Idler grooves 1615 extend about central portion 1614 and are configured to receive retaining clips 1619 which axially secure idler 1610A, B on axel 1612A, B. In the present embodiment, each end 1616 of axel 1612A, B is flattened to define spring contact surfaces 1618, however, contact surfaces 1618 can be configured with any configuration, including a curved configuration. Bushing bore 1617 extends through each axel end 1616 and is configured to receive a respective bushing 1630, desirably with an interference fit such that axel 1612A, B moves with bushings 1630 as bushings 1630 slide along the respective shaft travel surfaces 1622.

Figure 13:
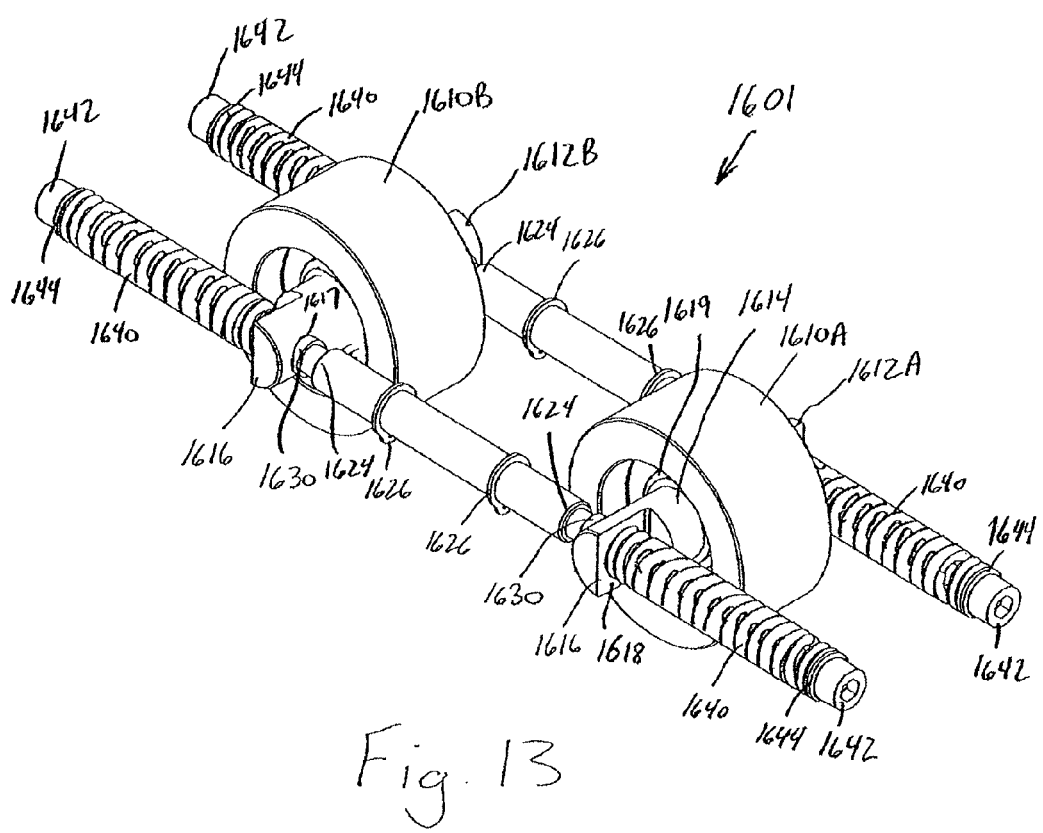
FIG. 13 is an isometric view of the idler assembly of the compliance unit of FIG. 8.

Referring to FIGS. 10 and 13, once idler axels 1612A, B and respective bushings 1630 are positioned on travel surfaces 1622 of shafts 1620, a respective compression spring 1640 is positioned about each travel surface 1622. A respective spring screw 1642 is extended through each compression spring 1640 and engaged in the respective threaded bore 1623 at the end of shaft 1620. Washers 1644 may be positioned between spring screws 1642 and compression springs 1640. As spring screw 1642 is tightened, compression screw 1640 is compressed against the respective spring contact surfaces 1618 of axel 1612A, B. In the present embodiment, compression springs 1640 provide the spring bias described above with respect to FIG. 7. Spring screws 1640 may be tightened as desired to set the tension on drive belt 1608 and establish the initial, neutral position of idlers 1610A, B. Idlers 1610A, B can also be utilized to counteract an out-of-balance torque on coupling 587' by adjusting the individual spring screws 1640. For example, if the load is 600 pounds and the center of gravity is offset ½ inch from the axis of rotation, there is a torque of 300 in-lbs that will tend to rotate the load in an undesirable way. By adjusting the appropriate spring screws 1640, the spring forces acting on idlers 1610A, B may be adjusted to counteract this out-of-balance torque.

Figure 14A:
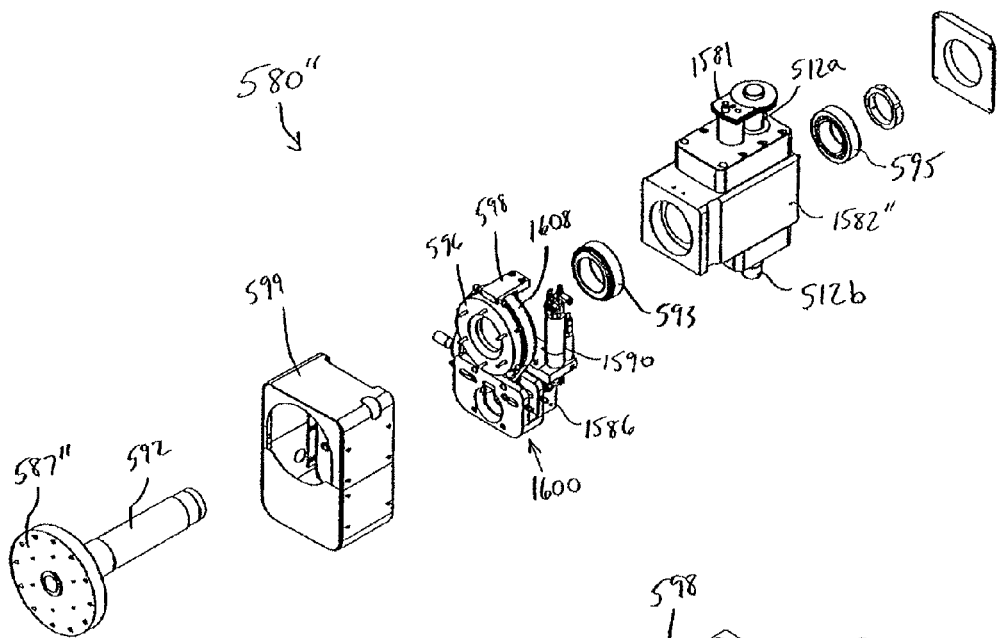
FIG. 14A is an exploded isometric view of a roll gear box of alternative exemplary embodiment of the invention.
Figure 14B:
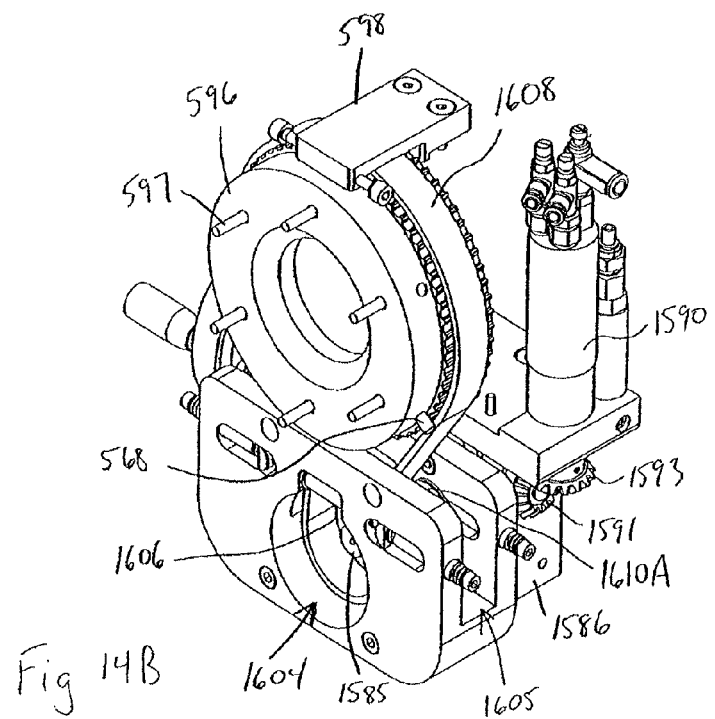
FIG. 14B is an expanded view of the compliance unit of FIG. 14A.
Figure 15:
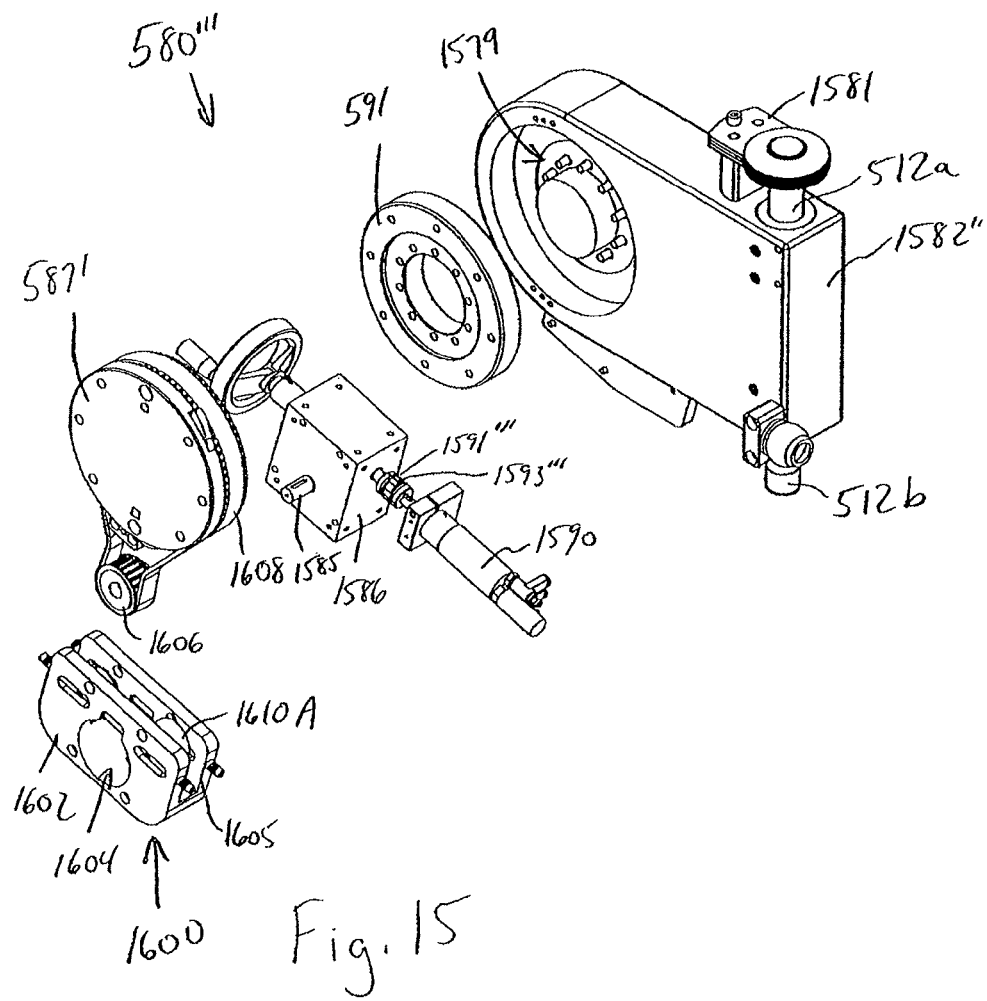
FIG. 15 is an exploded isometric view of a roll gear box of another alternative exemplary embodiment of the invention.

Referring to FIGS. 14A, 14B and 15, compliance unit 1600 is illustrated in use with roll gear boxes 580", 580'" having various configurations. Referring specifically to FIGS. 14A and 14B, roll gear box 580" includes journal block 1582" from which journals 512a, 512b extend for pivotal connection with bearings 511a, 511b of pivot coupling unit 530. Swing lock mechanism 1581 may be provided to lock journal block 1582" relative to pivot coupling unit 530. In the present embodiment, the pivot block is formed integrally with journal block 1582". Journal block 1582" is provided with a pair of bearings 593 and 595 which are configured to support shaft 592 extending from support coupling 587" for low-friction rotation about a central axis thereof. Shaft 592 extends through drive member 596 positioned between support coupling 587" and journal block 1582". Pins 597 or the like extend between support coupling 587" and drive member 592 such that they are rotationally interconnected. A stop bracket 598 may extend from journal block 1582" adjacent to drive member 592. Stops 568 (only one shown) extend radially from each side of drive member 592 and are configured to contact stop bracket 598 to limit the range of rotation. Cover assembly 599 is provided to protect compliance unit 1600, gear unit 1586, motor 1590, and associated apparatus. Support coupling 587" and drive member 592 make up a coupling unit of the present embodiment. As in the previous embodiments, cradle 300 is connected to coupling 587" such that rotation of coupling 587" causes rotation of cradle 300 and test head 490 about its roll axis.

In the present embodiment, compliance unit 1600 is supported by journal block 1582". Again, the rotational output of output shaft 1585 of gear unit 1586 is transmitted to coupling 587" via roll drive pulley 1606 and drive belt 1608. Roll drive pulley 1606 mounts on output shaft 1585 and rotates therewith. In the present embodiment, drive belt 1608 extends between roll drive pulley 1606 and drive member 592. Since drive member 592 is rotationally interconnected with coupling 587", drive belt 1608 transmits the rotational output from roll drive pulley 1606 to coupling 587" through drive member 592. Roll drive pulley 1606 and coupling 587" are again sized to effect a desired gear ratio therebetween. In all other aspects, compliance unit 1600 operates in the same manner as described above.

Referring to FIG. 15, roll gear box 580" includes journal block 1582" from which journals 512a, 512b extend for pivotal connection with bearings 511a, 511b of pivot coupling unit 530. Swing lock mechanism 1581 may be provided to lock journal block 1582" relative to pivot coupling unit 530. In the present embodiment, journal block 1582'" includes an internal mount 1579 for attachment of slewing ring bearing 591. In this embodiment, bearing 591 extends parallel to the body of journal block 1582'". As in the embodiment of FIGS. 3-13, support coupling 587' is connected with bearing 591 for low-friction rotation about a central axis thereof. Support coupling 587' and bearing 591 make up a coupling unit of the present embodiment. As in the previous embodiments, cradle 300 is connected to coupling 587' such that rotation of coupling 587' causes rotation of cradle 300 and test head 490 about its roll axis.

In the present embodiment (FIG. 15), compliance unit 1600 is supported by journal block 1582'" in a different orientation, however, the rotational output of output shaft 1585 is still transmitted to coupling 587' via roll drive pulley 1606 and drive belt 1608. Roll drive pulley 1606 mounts on output shaft 1585 and rotates therewith. As in the embodiment of FIGS. 3-13, drive belt 1608 extends directly between roll drive pulley 1606 and coupling 587', thereby transmitting the rotational output from roll drive pulley 1606 to coupling 587'. Roll drive pulley 1606 and coupling 587' are again sized to effect a desired gear ratio therebetween. In the present embodiment, the gears 1591'" and 1593'" of the worm gear unit 1586 and the motor 1590 have a straight connection rather than a beveled connection. In all other aspects, compliance unit 1600 operates in the same manner as described above.

Whereas the rotational axis defined by the axis of rotation of coupling unit 587' of the embodiments described in FIGS. 3-6 and FIGS. 14A and 14B essentially intersects the orthogonal axis defined by journals 512a and 512b, the rotational axis defined by coupling unit 587' of the embodiment of FIG. 15 is located to one side of the orthogonal axis defined by pivot journals 512a and 512b as might be required in certain applications. In all embodiments it is desirable that the load be balanced with respect to the axis of rotation. This may be achieved by attaching the load so that the axis of rotation passes substantially through the center of gravity of the load. If it is desired that the axis is to be located away from the load's center of gravity. Then load balancing apparatus such as is disclosed in U.S. Pat. No. 7,084,358 to the same assignee may be incorporated.

Referring again to FIGS. 1A-2C, column unit 100 includes two linear rails 115 which extend vertically from approximately the bottom to the top thereof. Main arm plate 510 is coupled to rails 115 with appropriate linear bearings or the like. Main fluid-operated actuator 150 (see FIG. 37A) within column 100 is associated with main arm plate 510, enabling main arm plate 510 and its attached load (comprising main arm assembly 500, roll gear box 580, cradle 300, test head 490 and cable) to be moved up and down in the vertical direction along rails 115. Such a fluid actuated manipulator 10 is configured to be of the fluid-balanced type described by Smith, first at U.S. Pat. No. 4,589,815 (See, e.g., FIGS. 38 through 12), and subsequently at U.S. Pat. Nos. 4,705,447 and 5,149,029. These three patents are herein incorporated by reference in their entirety. As described in these patents, a substantially weightless condition (thus compliant motion) is provided in the vertical or Y-axis. As will be disclosed in more detail, the mechanism internal to column 100 enables the test head to be moved an enhanced vertical distance, for example, twice the distance moved by the piston within the pneumatic cylinder.

Base unit 600 includes horizontally oriented base plate 605 which is generally stationary when system 10 is in operation. Linear rails 630 are provided on base plate 605. Linear bearings or the like couple horizontal carriage 650 to linear rails 630 such that horizontal carriage 650 is readily linearly moveable in a plane parallel to the floor. This linear motion defines the in-out axis. Column unit 100 is securely attached to horizontal carriage 650 and is thereby provided with in-out linear motion relative to base unit 600. As will be described, a pneumatic cylinder may be included in base unit 600 to provide powered in-out motion.

FIG. 1A shows a Cartesian coordinate system which is used herein. The X-axis 1002 is oriented in a horizontal plane which is parallel with the floor, base plate 605 and horizontal linear rails 515 such that horizontal side-to-side motion is parallel with X-axis 1002. Z-axis 1004 is also in a horizontal plane, which is parallel with the floor and base plate 605, and also parallel with linear rails 630 located on horizontal carriage 650 such that in-out motion is parallel with Z-axis 1004. Y-axis 1006 is vertical and parallel with linear rails 115 such that up-down motion is parallel with Y-axis 1006. X-axis 1002, Y-axis 1006 and Z-axis 1004 are all mutually orthogonal.

An exemplary control unit 700 will be described in greater detail hereinafter. Control unit 700 generally includes push buttons, switches or the like to enable an operator to affect control over the up-down and in-out motions.

Figure 2A:
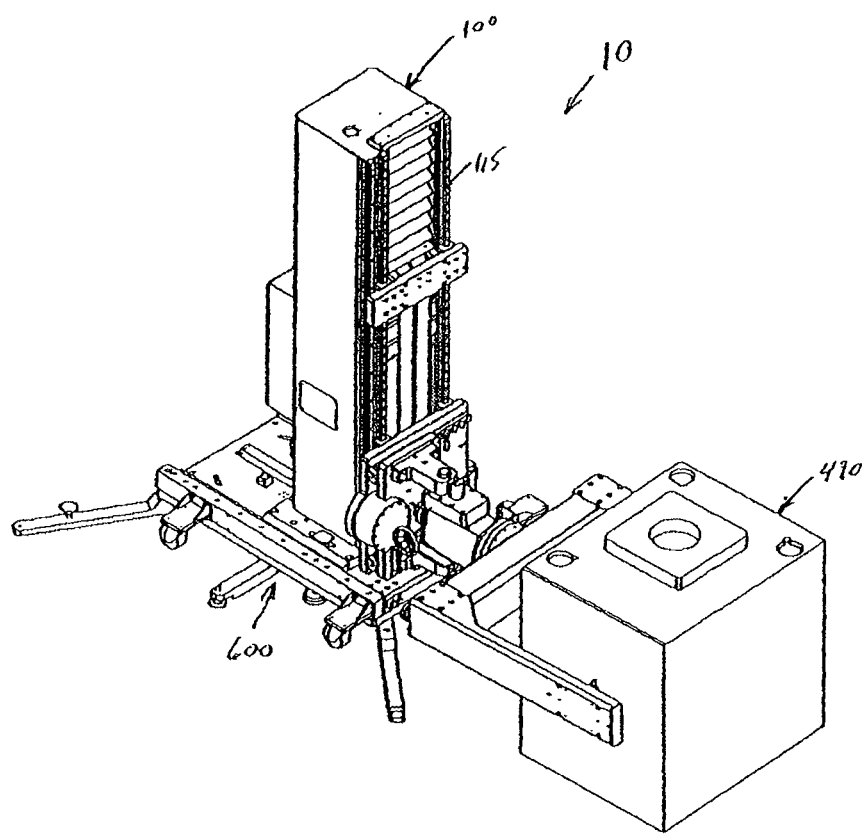
FIGS. 2A, 2B and 2C are isometric views of the manipulator system of FIG. 1A with the test head manipulated to different positions to illustrate an exemplary range of motion.
Figure 2B:
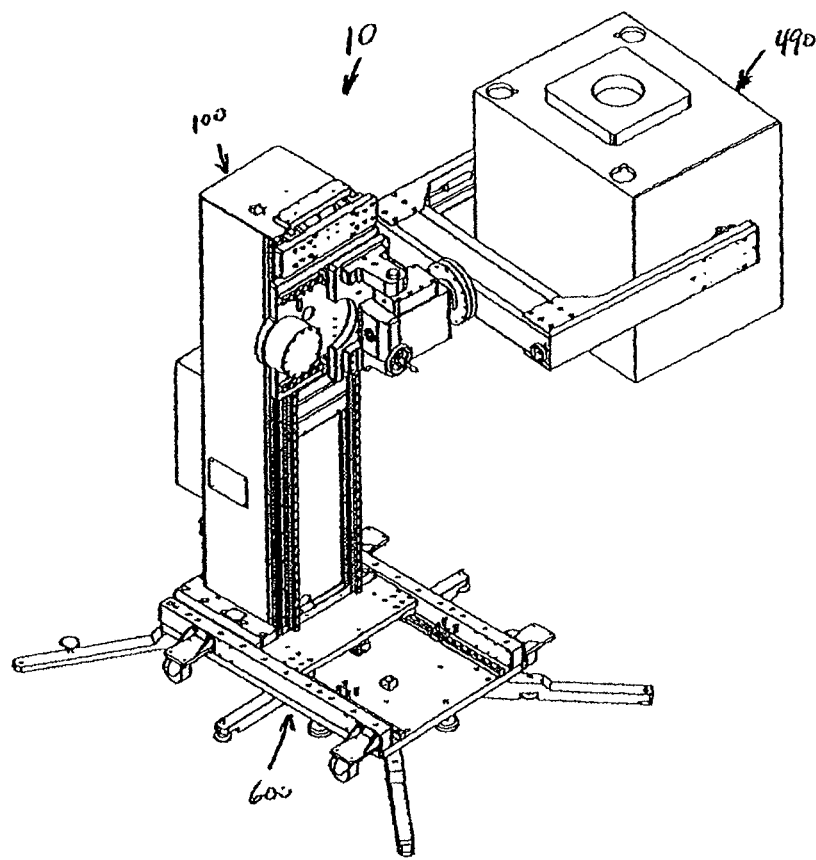
Figure 2C:
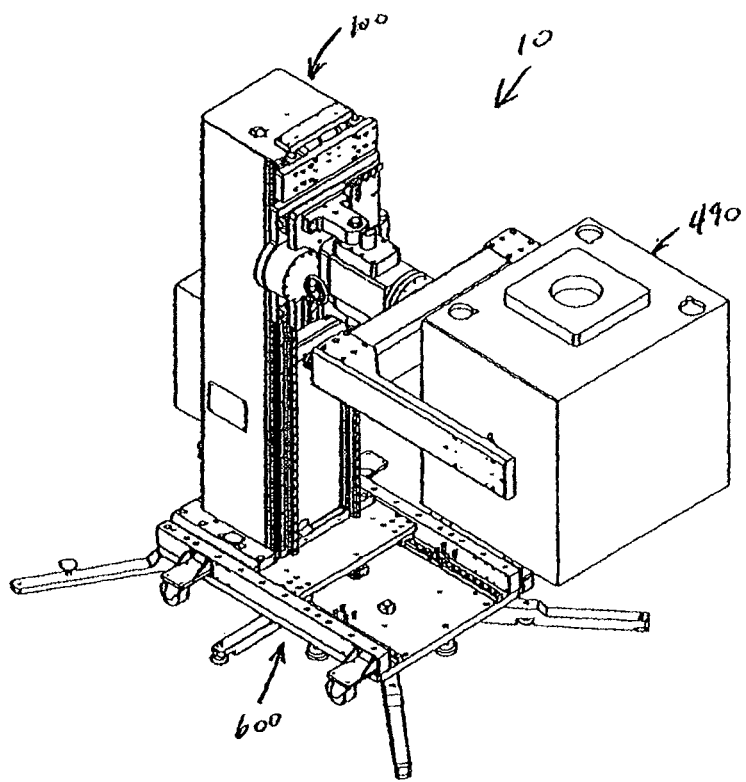
Figure 3:
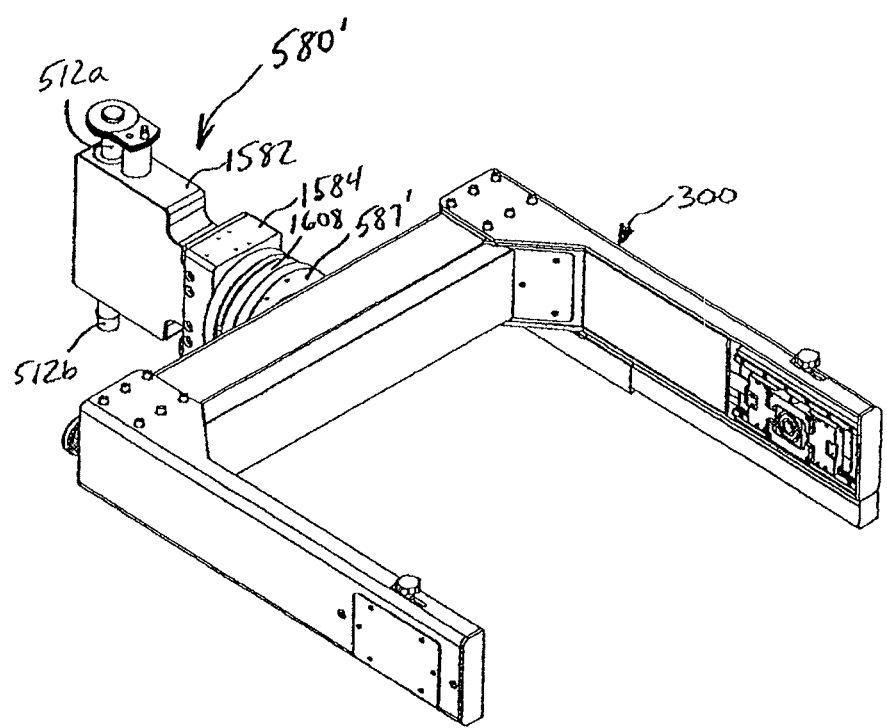
FIG. 3 is an isometric view illustrating an exemplary embodiment of the roll gear box with an exemplary cradle attached thereto.
Figure 4:
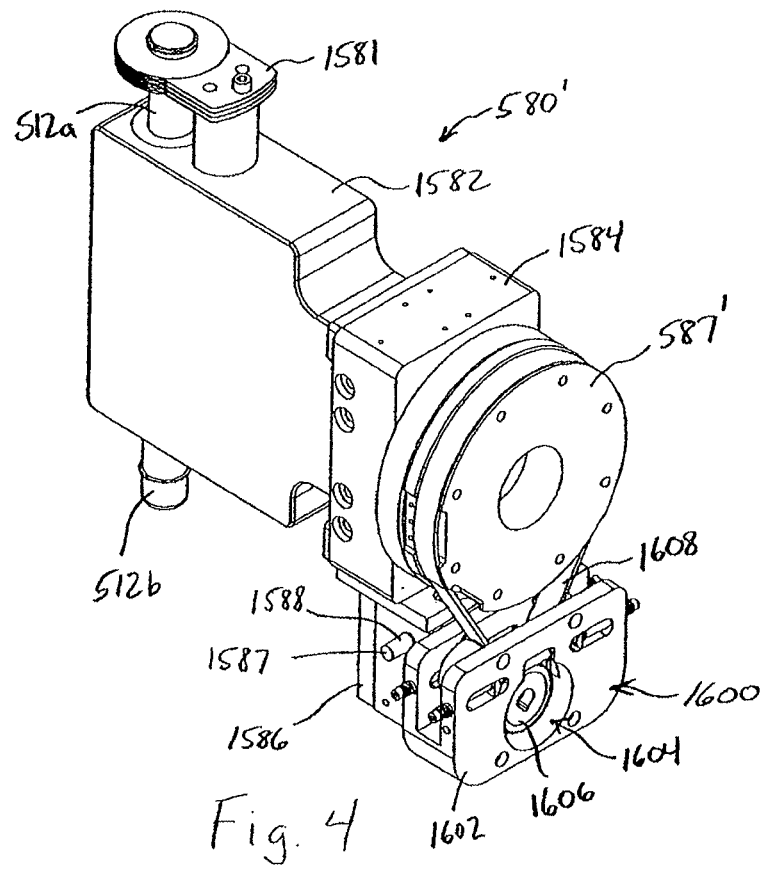
FIGS. 4 and 5 are front and rear isometric views, respectively, of the roll gear box of FIG. 3.
Figure 5:
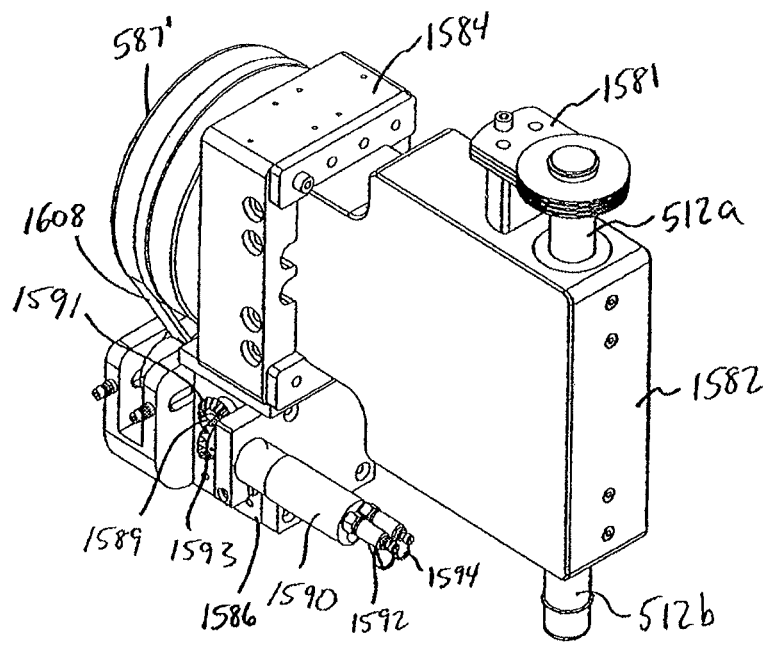

Referring to FIGS. 1A and 2A-2C, various positions of manipulator system 10 are shown, illustrating an exemplary range of motion of manipulator system 10. In FIG. 1A, the vertical position of test head 490 is part-way up vertical column 100 at a location known as the "service position." Also in FIG. 1A, test head 490 is swung 45 degrees right from Z-axis 1040, and the horizontal position is full right. In FIG. 2A, test head 490 is at its lowest point, at a swing angle of zero degrees, and fully to the left. In FIG. 2B, test head 490 is at its highest position, at a swing angle of 90 degrees, and fully to the right. In FIG. 2C, test head 490 is at its highest position, at a swing angle of zero degrees, and fully to the left.

Figure 16A:
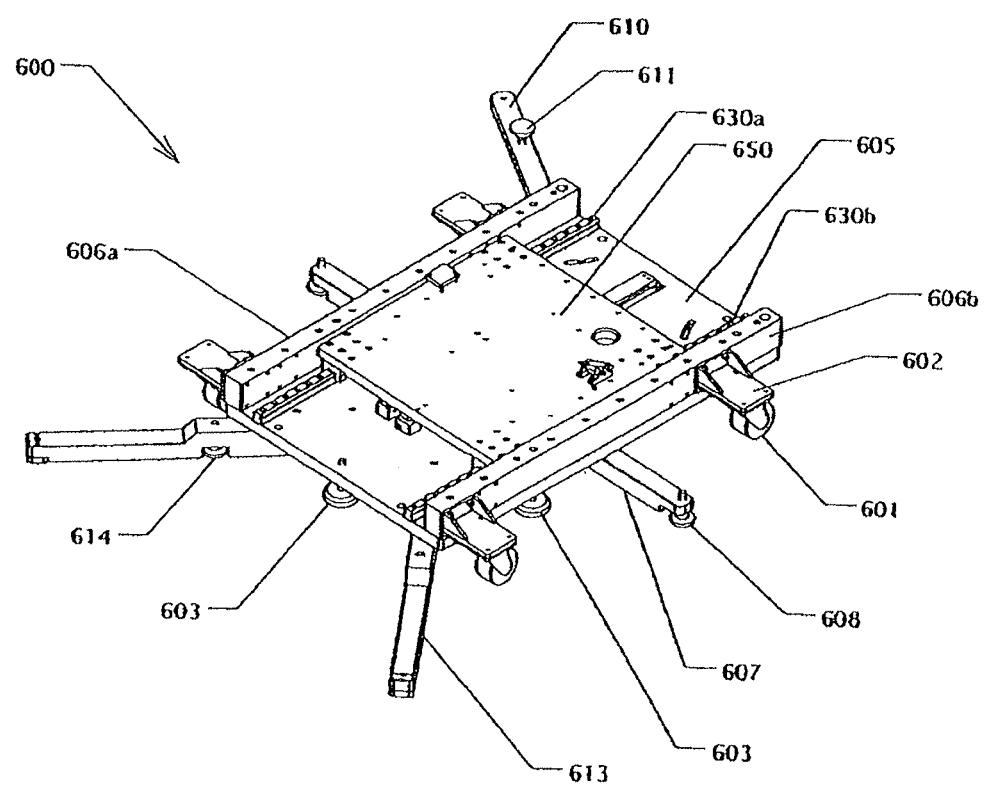
FIG. 16A is a perspective view of the base unit of the manipulator system of FIG. 1A.
Figure 16B:
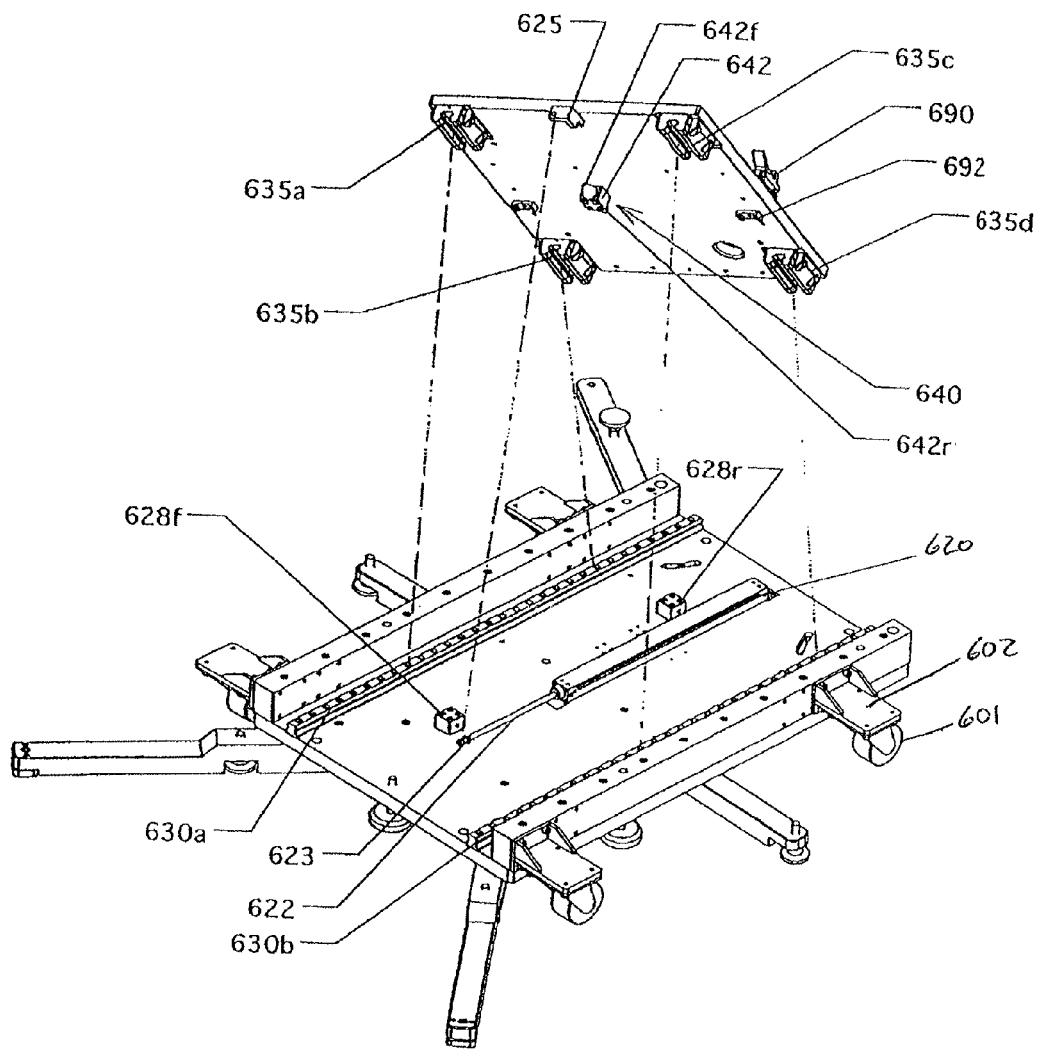
FIG. 16B is a partially exploded view of the base unit FIG. 16A.
Figure 17:
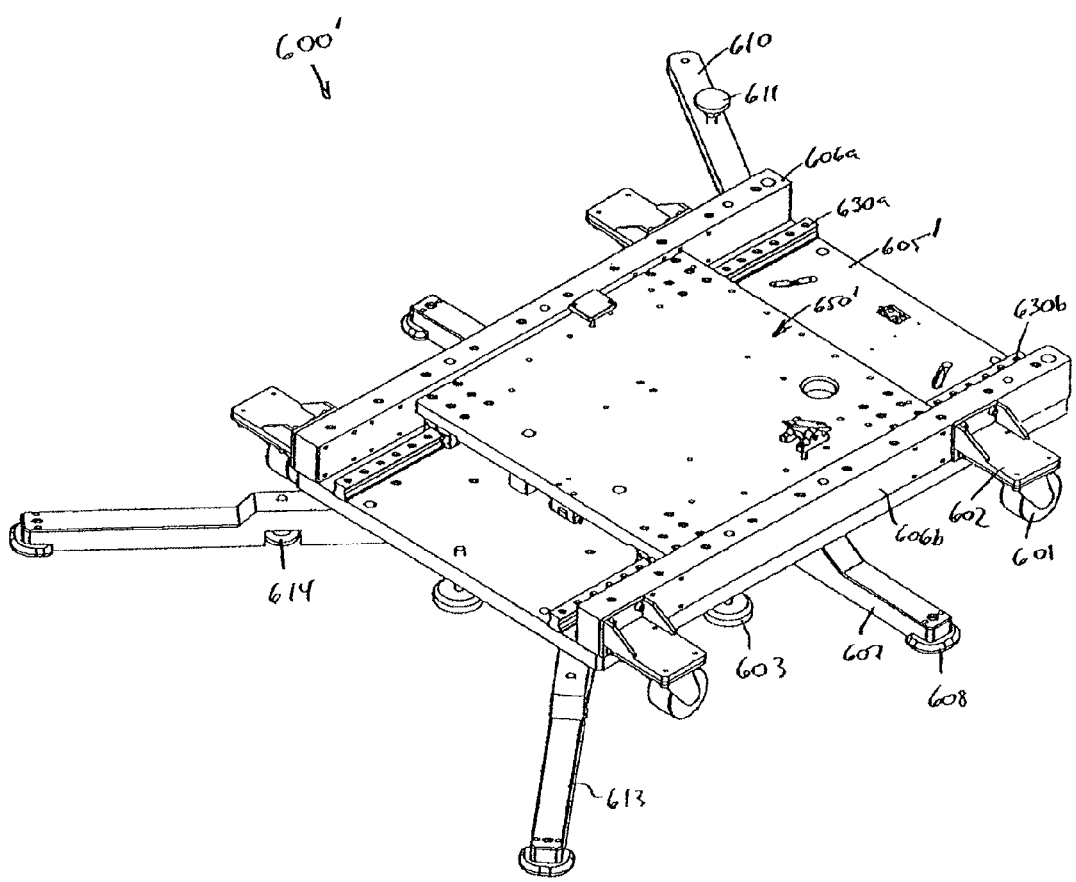
FIG. 17 is a perspective view of an alternate exemplary base unit of the present invention.
Figure 18:
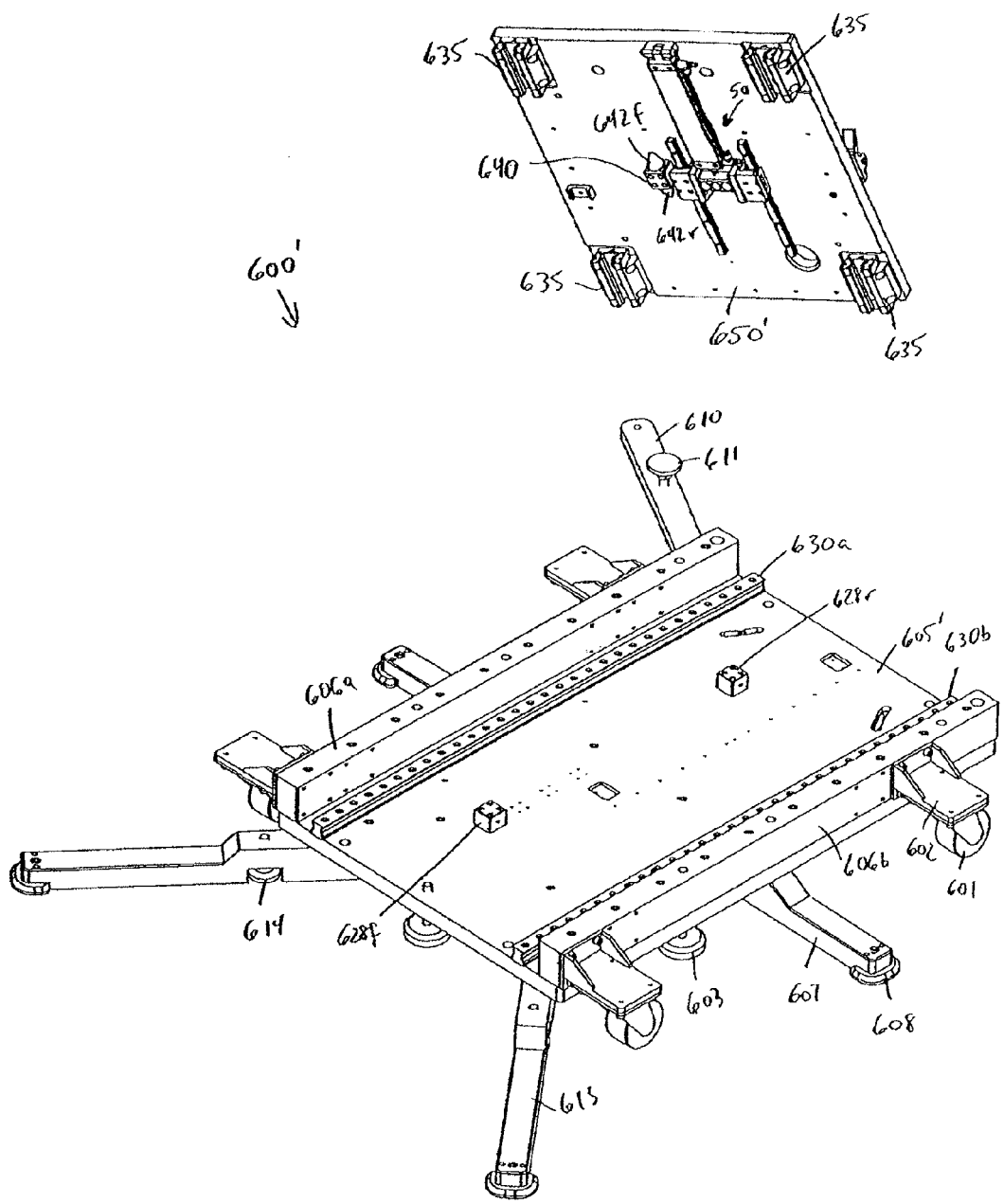
FIG. 18 is a partially exploded view of the base unit of FIG. 17.

Referring to FIGS. 16A and 16B, base unit 600 will be described in more detail. Base unit 600 supports and provides in-out motion for column 100 and thereby test head 490. Column 100 (not shown in FIGS. 16A and 16B) is mounted on carriage 650. Carriage 650 attaches with linear bearings 635a,b,c,d to linear rails 630a,b, which are mounted parallel to one another on bottom plate 605. Thus, carriage 650 may move horizontally along an axis defined by linear rails 630a and 630b. In the present embodiment, dual-action pneumatic cylinder 620 is provided as a motion actuator to affect horizontal in-out motion of carriage 650, column 100, and, consequently test head 490. Motion-limiting stop blocks 628f,r fixed to bottom plate 605 in cooperation with stop unit 640 attached to the underside of carriage 650 are provided to stop and constrain forward and rearward motion respectively of carriage 650 as described in more detail below.

Bottom plate 605 is preferably manufactured from steel for strength and minimal flexing as the load is moved from one position to another. Other materials, including metallic and non-metallic materials, may also be utilized. In the present embodiment, parallel linear rails 630a,b and solid side rails 606a,b are attached to base 605 with socket-head cap screws. Other attachment means may alternatively be utilized. Solid side rails 606a,b preferably provide additional resistance to flexing. Four caster brackets 602 are attached to base plate 605; one in proximity to each of its corners. A different number and arrangement of caster brackets 602 may alternatively be utilized. Attached to each bracket 602 is a caster wheel 601. Caster wheels 601 may be of the fixed or swiveling type according to application requirements. Other types of wheels may also be utilized. Also attached to base plate 605 are a number of extension legs to provide stability as the test head is moved throughout its motion envelope. The illustrated extension legs include front corner extension legs 613 and side extension legs 607. Rear corner extension leg 610 may be extended under the mainframe cabinet of an ATE system to provide further stability.

Base unit 600 desirably includes leveling supports 603 coupled to base plate 605, leveling supports 614 coupled to extension legs 613, and leveling supports 608 coupled to extension legs 607. These are of the conventional type, having a round flat surface, which faces downwards, and a threaded portion, which extends upwards and engages an appropriately threaded hole in the member to which it is attached. Rear corner extension leg 610 includes leveling support 611 that is mounted in an upside-down orientation. Support 611 is used to engage rear corner extension leg 610 with the ATE mainframe cabinet (not shown).

Prior to use of manipulator system 10, leveling supports 603, 608, and 614 are desirably rotated so that their flat surfaces are in contact with the floor and caster wheels 601 are positioned slightly above the floor. Supports 603, 608, and 614 may be adjusted in order to level base 600 and to place column 100 in a desirably vertical position. Also support 611 is rotated so that it is in engagement with the ATE cabinet (not shown). Manipulator system 10 may be moved from one location to another across a reasonably level floor by screwing all leveling supports inwards so that leveling supports 603, 608, and 614 are clear of the floor and support 611 is disengaged from the cabinet. With coaster wheels 601 in contact with the floor, manipulator system 10 may be readily rolled to a new location.

Horizontal carriage 650 is provided to support column 10 and to provide in-out (forward-reverse) motion for test head 490. Like base plate 605, rectangular carriage 650 is preferably made of steel for strength and resistance to flexing. A linear bearing 635 is attached at each corner of carriage 650 with six socket head cap screws. Linear bearings 635 are desirably attached so as to be in precise engagement with linear rails 630a,b such that carriage 650 may be readily moved along a linear in-out axis with very low friction. A lock mechanism may also be provided to hold carriage 650 in a desired position within its range of motion. In the present embodiment, the lock mechanism includes shoe 692, located on the underside of carriage 650, and toggle control 690, located on the upper, operator-accessible side of carriage 650. As shown, shoe 692 is aligned with rail 630b. With toggle control in a first, unlocked position, shoe 692 is located slightly above or in loose contact with rail 630b, and the carriage may be readily moved along rails 630a,b. When the carriage has been placed in its desired position, toggle 690 may be moved to a second, locked position. When toggle 690 is in the locked position, shoe 692 bears strongly against rail 630b, inhibiting further motion of carriage 650 along rails 630a,b.

Stop blocks 628f and 628r are secured to base plate 605 with appropriate screws or the like. Stop blocks 628f and 628r are preferably centered on a line which is parallel to rails 630a,b. Stop block 628f is located towards the front of base plate 605 and stop block 628r is located towards the rear. Both stop blocks 628f, r are oriented so that each has a planar face directed towards the center of base plate 605 and which is perpendicular to rails 630*a,b*. Carriage stop unit 640 is attached to the underside of horizontal carriage 650 using appropriate screws or the like. Stop unit 640 includes stop cones 642*f* and 642*r*, which are preferably made of hard rubber or other suitable material. Carriage stop unit 640 is located on carriage 650 such that, when carriage 650 is coupled to rails 630*a,b* by means of linear bearings 635, it is positioned both: (1) between stop blocks 628*f* and 628*r* and (2) with the axes of stop cones 642*f,r* aligned with a line extending between the centers of stop blocks 628*f* and 628*r*. Horizontal carriage 650 may be moved towards the front until stop cone 642*f* engages stop block 628*f*, and it may be moved rearwards until stop cone 642*r* engages stop block 628*r*. The net horizontal linear motion is limited to a distance being the distance between the inwards facing faces of stop blocks 628*f* and 628*r* minus the distance between the tips of stop cones 642*f* and 642*r*.

Due to the low friction couplings between rails 630*a,b* and linear bearings 635, the horizontal motion for relatively small manipulators and test heads may be provided manually. However, for larger systems, many users prefer to have powered motion in this axis. In such an arrangement, a compliant mode, where the load may be readily moved by a relatively small external force (including manual) for docking of the test head with a peripheral or possibly other reasons, is preferably provided. In the present embodiment, dual-action pneumatic cylinder 620 is configured to provide such compliant mode. Dual action pneumatic cylinder 620 and the associated piston rod 622 are attached with appropriate fastening means to base plate 605. Pneumatic cylinder 620 and piston rod 622 are preferably located so that the common axis of cylinder 620 and piston rod 622 is parallel to linear rails 630*a,b*. In the present embodiment, distal end 623 of piston rod 622 is threaded. Distal end 623 passes through a circular hole in bracket 625 which is mounted near the edge of carriage 650. A nut (not shown) is threaded onto distal end 623 of rod 622 such that piston rod 622 is attached to carriage 650. Other attachment arrangements may also be utilized.

Cylinder 620 is equipped with two ports, one on either side of the internal piston (not shown). Fluid is injected under pressure into one of the ports to urge the piston and piston rod 622 in a first direction and into the other port to urge the piston and piston rod 622 in the opposite direction. Motion in one direction or the other may be enhanced if the port that is not receiving fluid injection is left open so as to allow fluid retained from a previous motion to be vented. Thus, by controlling the flow of pressurized fluid into and out of the two ports, as described hereinafter, motion of the horizontal carriage 650 may be controlled. Preferably, stop blocks 628*f* and 628*r* are arranged with respect to carriage stop unit 640 so that the range of motion of carriage 650 is less than the total available stroke of the piston within cylinder 620 and so that the carriage is forced to stop before the piston reaches the end of its stroke (that is, before bottoming out) in either direction. This insures that there is always a sufficient volume within the cylinder to initiate motion away from a stop. With the use of pneumatics, the locking mechanism including shoe 692 may utilize a pneumatic toggle 690' in place of the toggle 690 described above. Pneumatic toggle 690' includes fluid actuator 691 (see FIG. 57) which has a default unlocked retracted position such that shoe 692 is spaced from rail 630*b*, similar to the unlocked condition as described above. To lock the in/out motion via shoe 692, control valve 693 is actuated, for example, via a toggle switch, whereby fluid actuator 691 extends shoe 692, thereby locking the system against in or out movement.

In the present embodiment, the working fluid is air, which is compressible. Thus, if the carriage is in a stationary situation in which air is not being added or released at either port, the carriage may be moved by applying an external force. Accordingly, compliance is provided. Alternatively, as illustrated in the current embodiment, if fluid pressure is released and the ports opened to the atmosphere, the carriage and its supported load may be moved manually through the range from one stop to the other. As will be described hereinafter, control of the horizontal motion via cylinder 620 is preferably provided in combination with the control of other manipulator axes by means of control unit 700.

Referring to FIGS. 17-32, an alternative exemplary base unit 600' will be described in more detail. Base unit 600' supports and provides in-out motion for column 100 and thereby test head 490. Column 100 (not shown in FIGS. 17-20) is mounted on carriage 650'. Carriage 650' attaches with linear bearings 635*a,b,c,d* to linear rails 630*a,b*, which are mounted parallel to one another on bottom plate 605'. Thus, carriage 650' may move horizontally along an axis defined by linear rails 630*a* and 630*b*. As described in more detail hereinafter, linear actuator assembly 50 is provided as a motion actuator to affect horizontal in-out motion of carriage 650', column 100, and, consequently test head 490. Motion-limiting stop blocks 628*f,r* fixed to bottom plate 605' in cooperation with stop unit 640 attached to the underside of carriage 650' are provided to stop and constrain forward and rearward motion respectively of carriage 650' as described in more detail below.

Bottom plate 605' is preferably manufactured from steel for strength and minimal flexing as the load is moved from one position to another. Other materials, including metallic and non-metallic materials, may also be utilized. In the present embodiment, parallel linear rails 630*a,b* and solid side rails 606*a,b* are attached to base 605' with socket-head cap screws. Other attachment means may alternatively be utilized. Solid side rails 606*a,b* preferably provide additional resistance to flexing. Four caster brackets 602 are attached to base plate 605'; one in proximity to each of its corners. A different number and arrangement of caster brackets 602 may alternatively be utilized. Attached to each bracket 602 is a caster wheel 601. Caster wheels 601 may be of the fixed or swiveling type according to application requirements. Other types of wheels may also be utilized. Also attached to base plate 605' are a number of extension legs to provide stability as the test head is moved throughout its motion envelope. The illustrated extension legs include front corner extension legs 613 and side extension legs 607. Rear corner extension leg 610 may be extended under the mainframe cabinet of an ATE system to provide further stability.

Base unit 600' desirably includes leveling supports 603 coupled to base plate 605', leveling supports 614 coupled to extension legs 613, and leveling supports 608 coupled to extension legs 607. These are of the conventional type, having a round flat surface, which faces downwards, and a threaded portion, which extends upwards and engages an appropriately threaded hole in the member to which it is attached. Rear corner extension leg 610 includes leveling support 611 that is mounted in an upside-down orientation. Support 611 is used to engage rear corner extension leg 610 with the ATE mainframe cabinet (not shown).

Prior to use of manipulator system 10, leveling supports 603, 608, and 614 are desirably rotated so that their flat surfaces are in contact with the floor and caster wheels 601 are positioned slightly above the floor. Supports 603, 608, and 614 may be adjusted in order to level base 600' and to place column 100 in a desirably vertical position. Also support 611 is rotated so that it is in engagement with the ATE cabinet (not shown). Manipulator system 10 may be moved from one location to another across a reasonably level floor by screwing all leveling supports inwards so that leveling supports 603, 608, and 614 are clear of the floor and support 611 is disengaged from the cabinet. With caster wheels 601 in contact with the floor, manipulator system 10 may be readily rolled to a new location.

Horizontal carriage 650' is provided to support column 10 and to provide in-out (forward-reverse) motion for test head 490. Like base plate 605', rectangular carriage 650' is preferably made of steel for strength and resistance to flexing. A linear bearing 635 is attached at each corner of carriage 650' with six socket head cap screws. Linear bearings 635 are desirably attached so as to be in precise engagement with linear rails 630a,b such that carriage 650' may be readily moved along a linear in-out axis with very low friction.

Stop blocks 628f and 628r are secured to base plate 605' with appropriate screws or the like. Stop blocks 628f and 628r are preferably centered on a line which is parallel to rails 630a,b. Stop block 628f is located towards the front of base plate 605' and stop block 628r is located towards the rear. Both stop blocks 628f,r are oriented so that each has a planar face directed towards the center of base plate 605' and which is perpendicular to rails 630a,b. Carriage stop unit 640 is attached to the underside of horizontal carriage 650' using appropriate screws or the like. Stop unit 640 includes stop cones 642f and 642r, which are preferably made of hard rubber or other suitable material. Carriage stop unit 640 is located on carriage 650' such that, when carriage 650' is coupled to rails 630a,b by means of linear bearings 635, it is positioned both: (1) between stop blocks 628f and 628r and (2) with the axes of stop cones 642f,r aligned with a line extending between the centers of stop blocks 628f and 628r. Horizontal carriage 650' may be moved towards the front until stop cone 642f engages stop block 628f, and it may be moved rearwards until stop cone 642r engages stop block 628r. The net horizontal linear motion is limited to a distance being the distance between the inwards facing faces of stop blocks 628f and 628r minus the distance between the tips of stop cones 642f and 642r.

Figure 19:
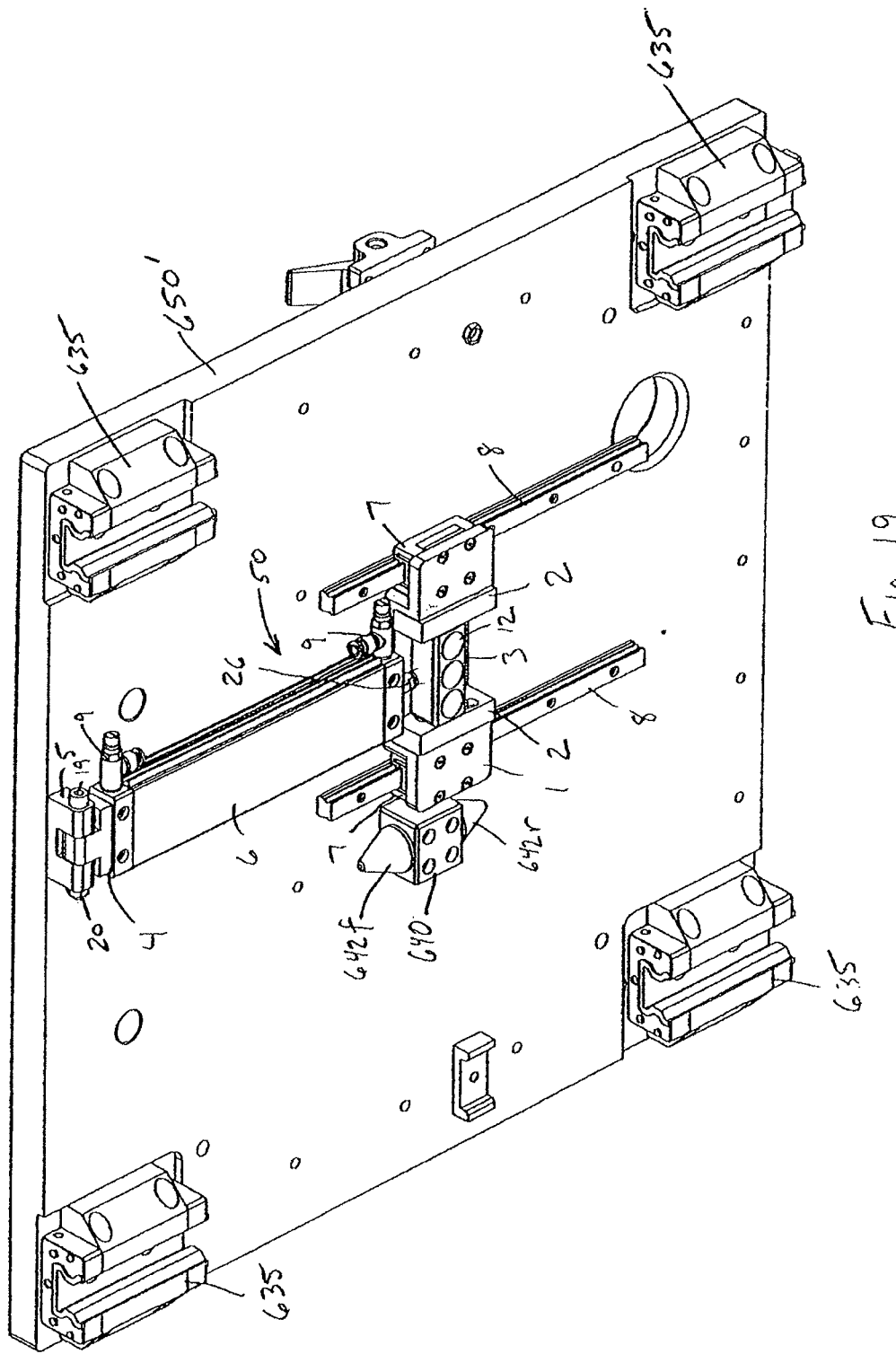
FIG. 19 is a bottom perspective view of an exemplary carriage of the present embodiment.
Figure 20:
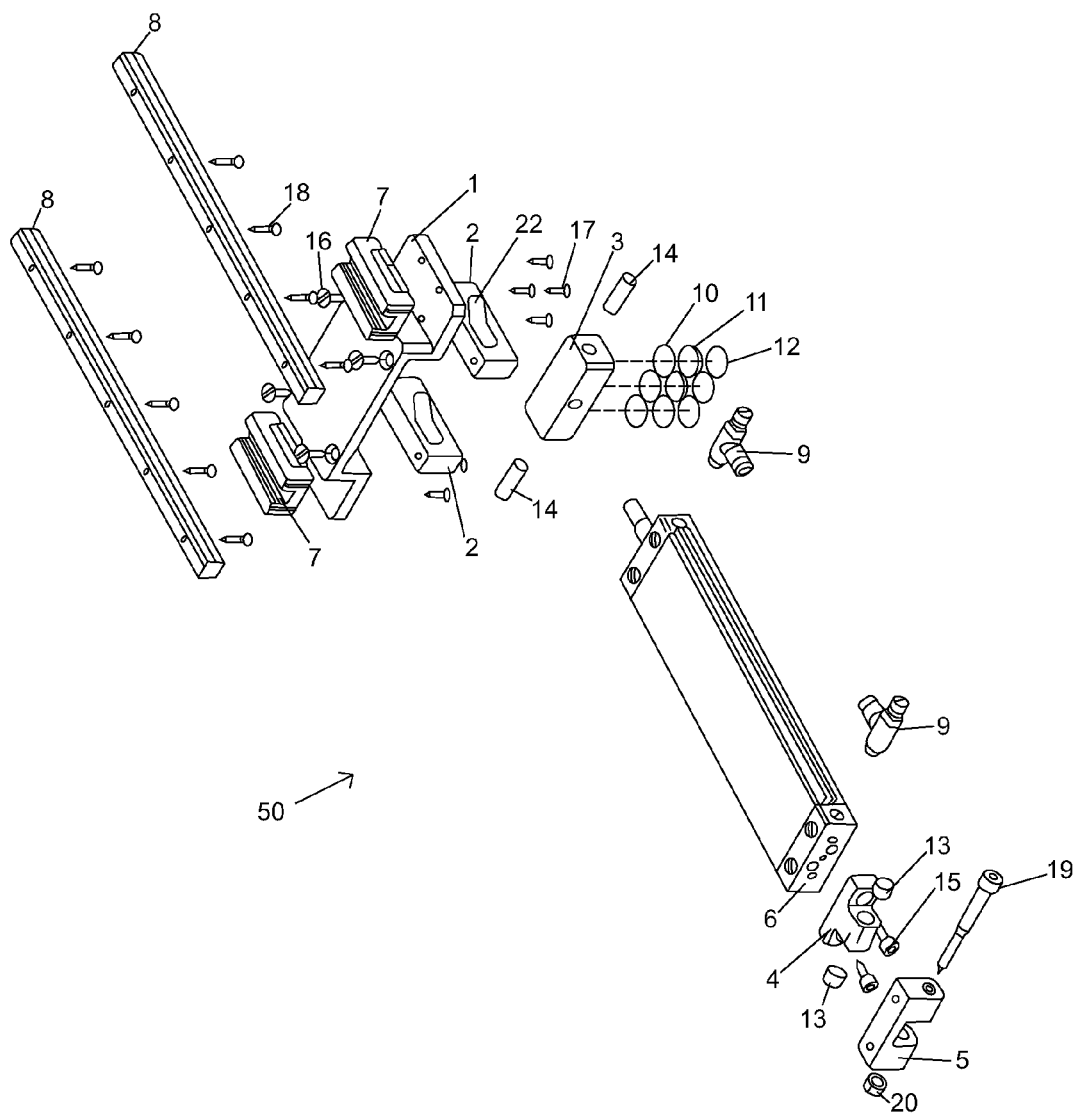
FIG. 20 is an exploded isometric view of an exemplary linear actuator assembly of the present embodiment.

Referring to FIG. 20, the actuator 50 generally comprises a carriage plate 1, a pair of ramp blocks 2, a brake shoe 3, a flange 4, a bearing block 5, a fluid actuated cylinder 6, a pair of bearings 7, a pair of rails 8, a pair of non-return valves 9, self sticking foam pads 10, magnets 11, anti-slide rubber pads 12, a pair of sleeve bearings 13, dowel pins 14, cylinder head bolts 15, a plurality of countersunk socket screws 16, 17, a plurality of cylinder head bolts 18, 19, and a hex nut 20. Referring to FIG. 19, the cylinder 6 is pivotally attached to the carriage 605' at one end via the flange 4 and bearing block 5. At the opposite end, piston rod 26 is connected to brake shoe 3. Brake shoe 3 includes a pair of opposed dowel pins 14. Each dowel pin 14 extends into a ramped slot 22 in a respective ramp block 2. Ramp blocks 2 are each connected to carriage plate 1, which is attached via bearings 7 to rails 8 to provide linear motion therealong. As explained in greater detail hereinafter, movement of piston rod 26 causes movement of the pins 14 along the ramped slots 22 and thereby controls application of the brake shoe 3.

The present embodiment provides a compliant mode, where the load may be readily moved by a relatively small external force (including manual) for docking of the test head with a peripheral or possibly other reasons. In the present embodiment, actuator 50 is configured to provide such compliant mode. Cylinder 6 is equipped with two ports 9, one on either side of the internal piston (not shown). In the present embodiment, to achieve compliance, either fluid pressure is released and the ports 9 opened to the atmosphere or fluid is supplied to the retract port 9 such that the brake shoe 3 is not applied, as described hereinafter. With the brake shoe 3 in a non-applied position, the carriage 650' and its supported load may be moved manually through the range from one stop to the other.

Automatic movement of carriage 650' in a first, docking direction is also provided in the present embodiment. The system may also be configured to provide automated movement in both directions. Fluid is injected under pressure into one of the ports 9 to urge the piston and piston rod 26 in an opposite direction, thereby applying the brake shoe 3 and moving the carriage 650' in the first, docking direction. Fluid is injected into the other port to urge the piston and piston rod 26 in the opposite direction to release the brake shoe 3, wherein the carriage 650' may be moved manually. Alternatively, a separate bias member, for example, a spring, may be provided such that the piston is automatically retracted when fluid pressure is released. Thus, by controlling the flow of pressurized fluid into and out of the two ports 9, motion of the horizontal carriage 650' may be controlled.

Figure 21:
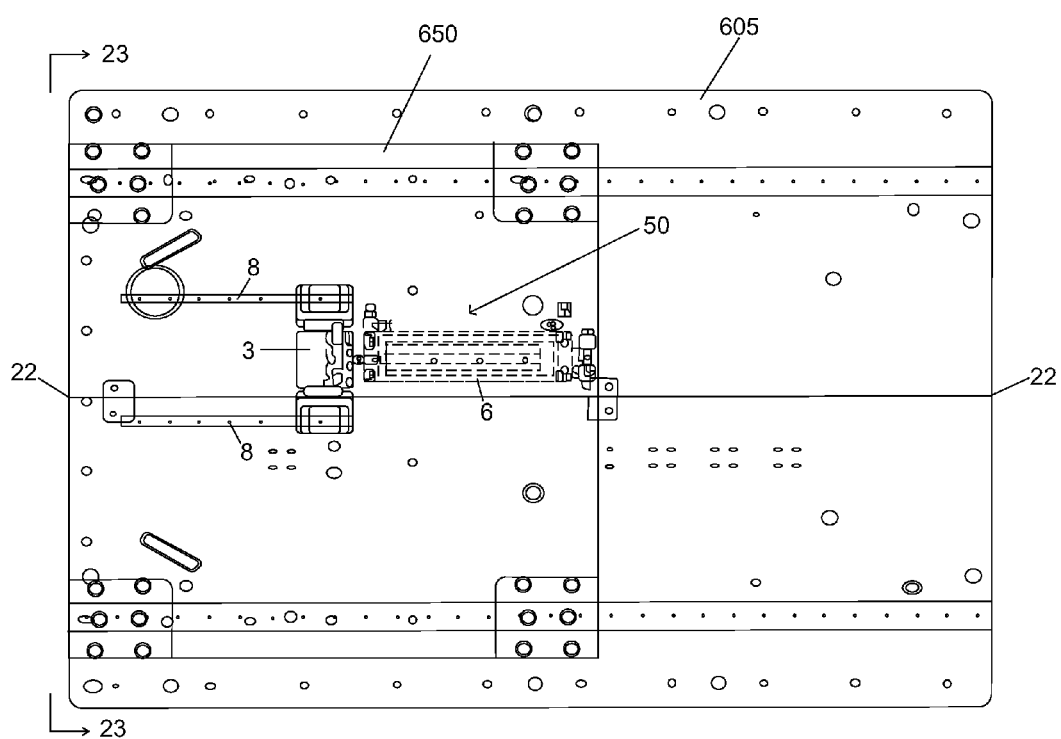
FIG. 21 is a top plan view of the base unit of FIG. 17, with supports and the like removed for clarity, with the carriage and linear actuator in an initial position.
Figure 22:
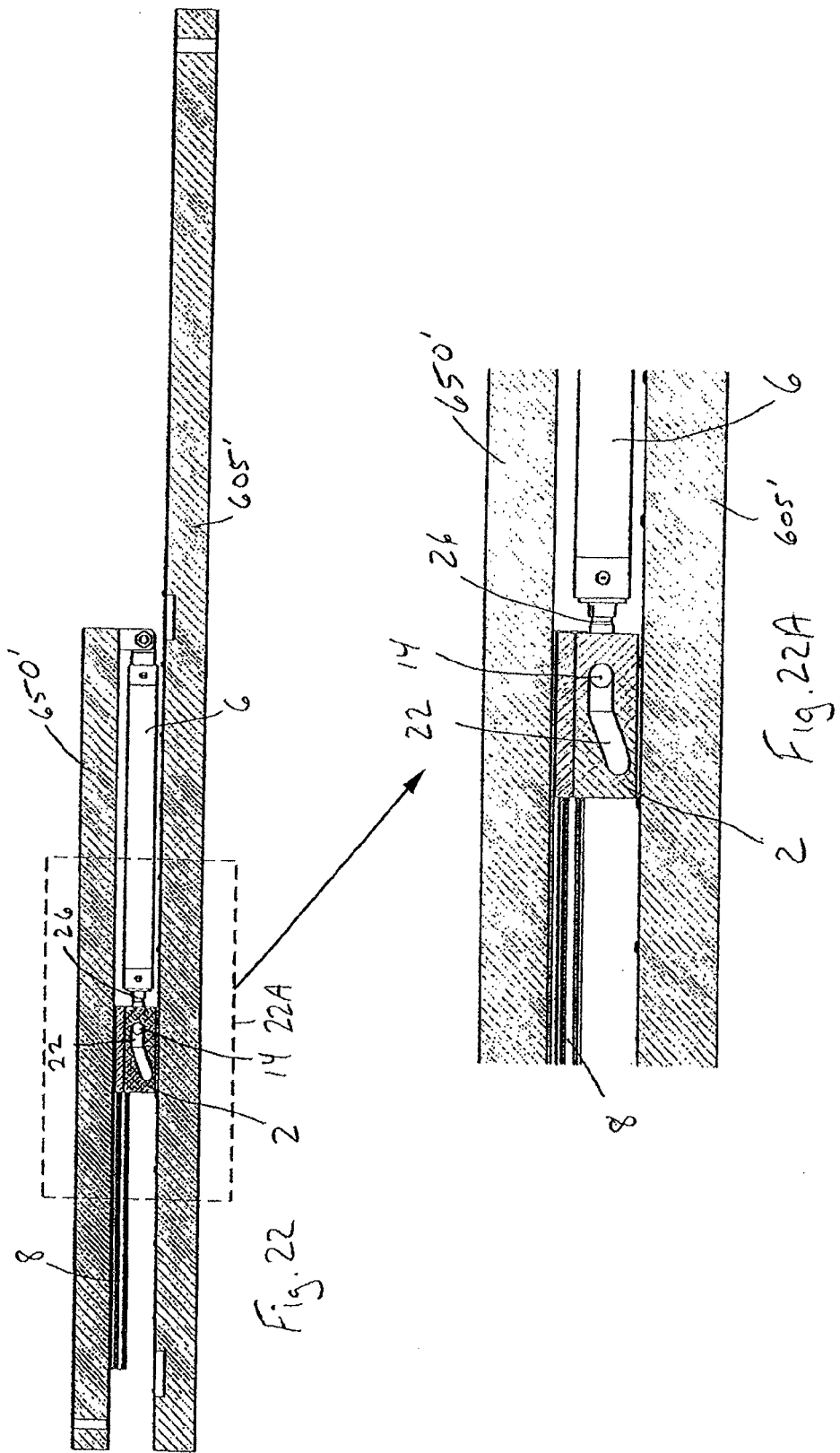
FIG. 22 is a cross-sectional view along the line 22-22 in FIG. 21.
Figure 23:
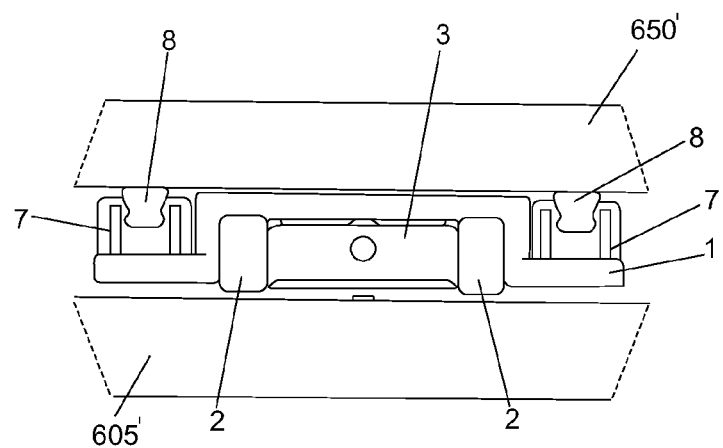
FIG. 23 is an end view along the line 23-23 in FIG. 21.
Figure 23:
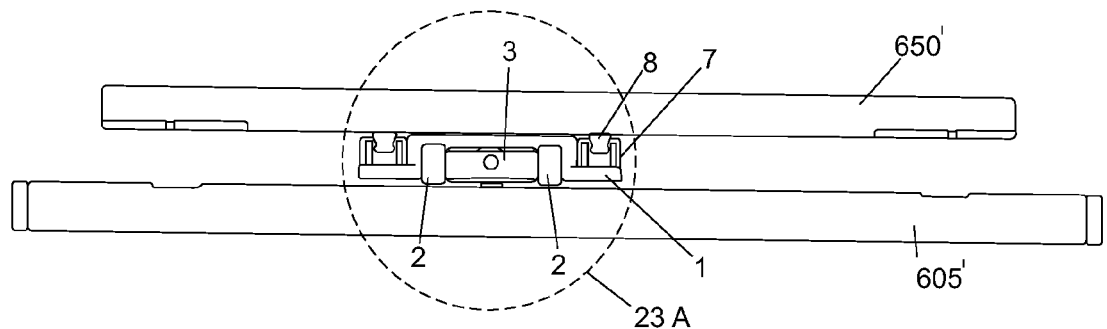

As indicated above, extension and retraction of piston rod 26 also controls application of brake shoe 3, as will be described with reference to FIGS. 21-32. Referring to FIGS. 21-23, this is an initial position and the piston 26 is retracted in its cylinder 6. Thus, the dowel pins 14 are at the upper ends of their ramps 22 (see FIG. 22A), and the brake shoe 3 is raised so that it is not touching the base plate 605' (see FIG. 23A) or the "traction screw heads" extending up therefrom. The piston 26 may be held in this position by applying fluid pressure to the retract port 9. Alternatively, a spring or other structure may be used to hold the piston 26. In this condition, the carriage 650' and the load sitting on it may be freely moved along the rails 630a,b with bearings 635.

Figure 24:
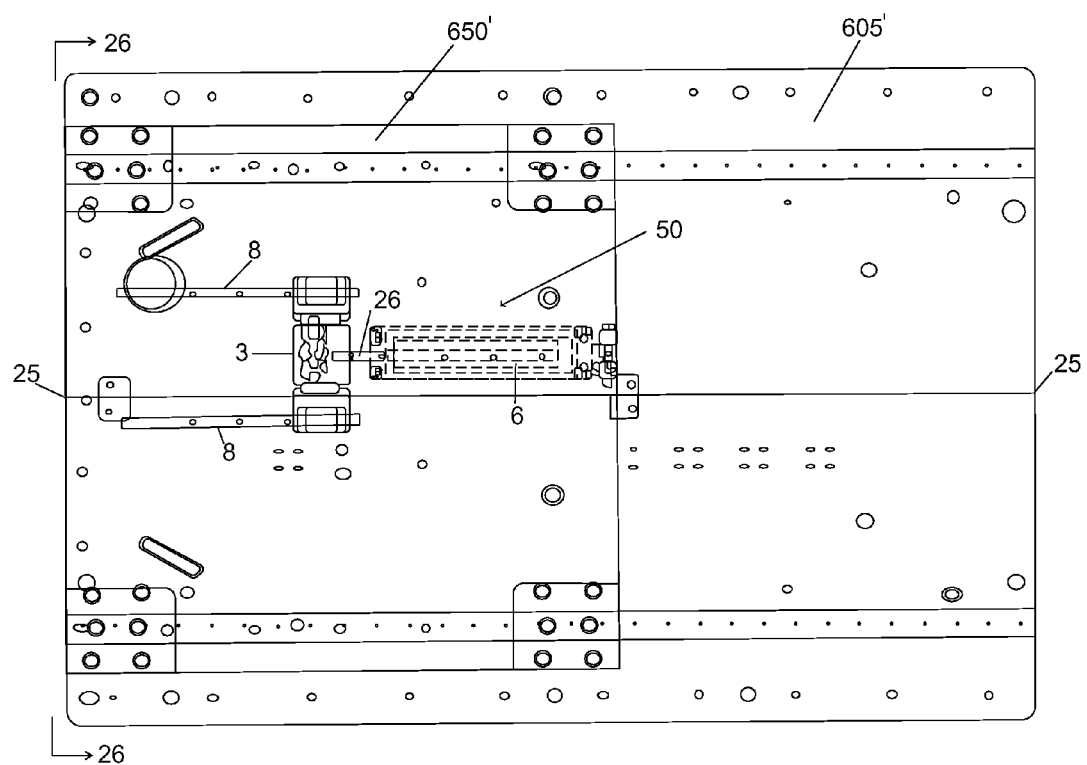
FIG. 24 is a top plan view similar to FIG. 21, with the carriage and linear actuator in an initiate extension position.
Figure 26:
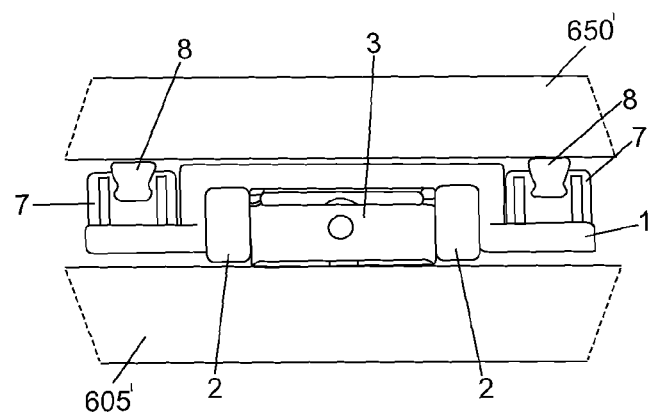
FIG. 26 is an end view along the line 26-26 in FIG. 24.
Figure 26:
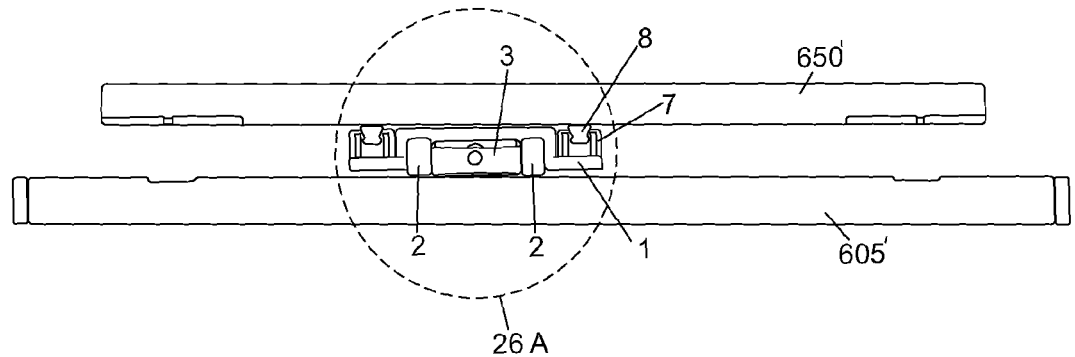

Referring to FIGS. 24-26, the fluid control has been switched to the "Drive" or "Extend" position. Fluid pressure is released from the port 9 which was holding the piston 26 in its retracted position (i.e., the retract port). Fluid pressure is applied to the port 9 which causes the cylinder 6 to extend, i.e., the extend port. The cylinder 6 has extended a small distance moving dowel pins 14 along in their ramps 22 as is more clearly seen in FIG. 25A. The brake shoe 3 is now closer to the base plate 605', but is still not touching the base plate 605' or the "traction screw heads" extending up therefrom, as shown in FIG. 26A. The carriage 650' has not moved yet.

Figure 27:
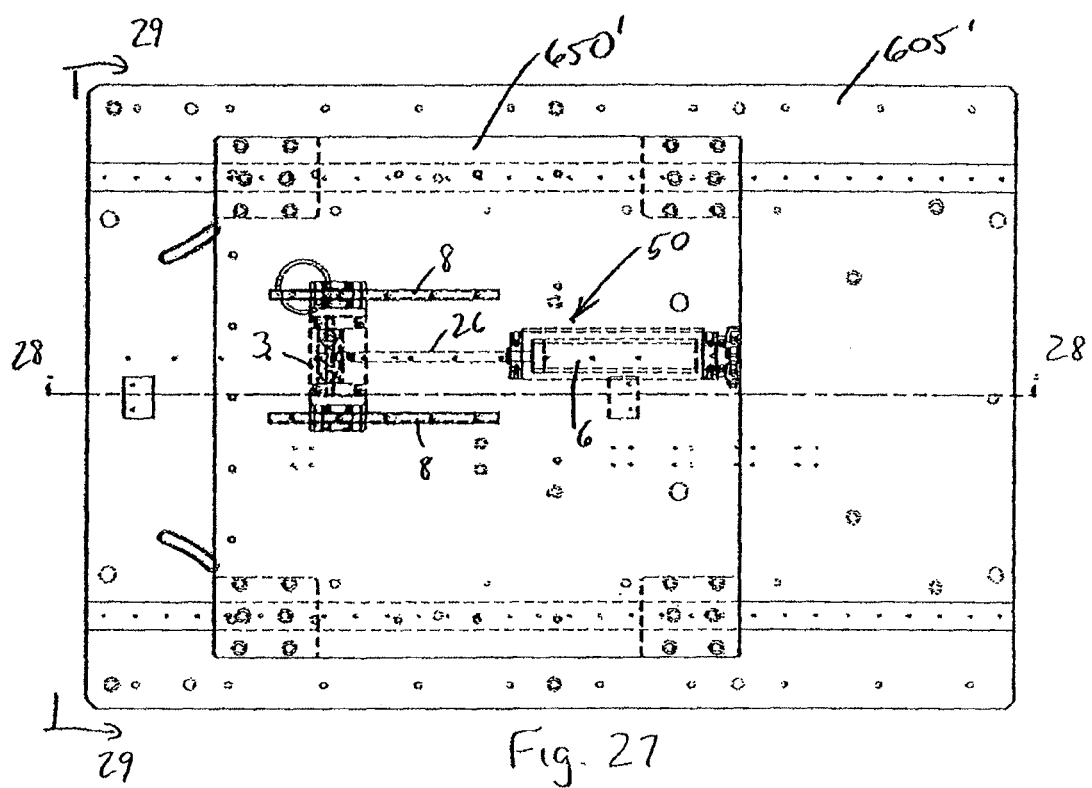
FIG. 27 is a top plan view similar to FIG. 21, with the carriage and linear actuator in an extension position.
Figure 28:
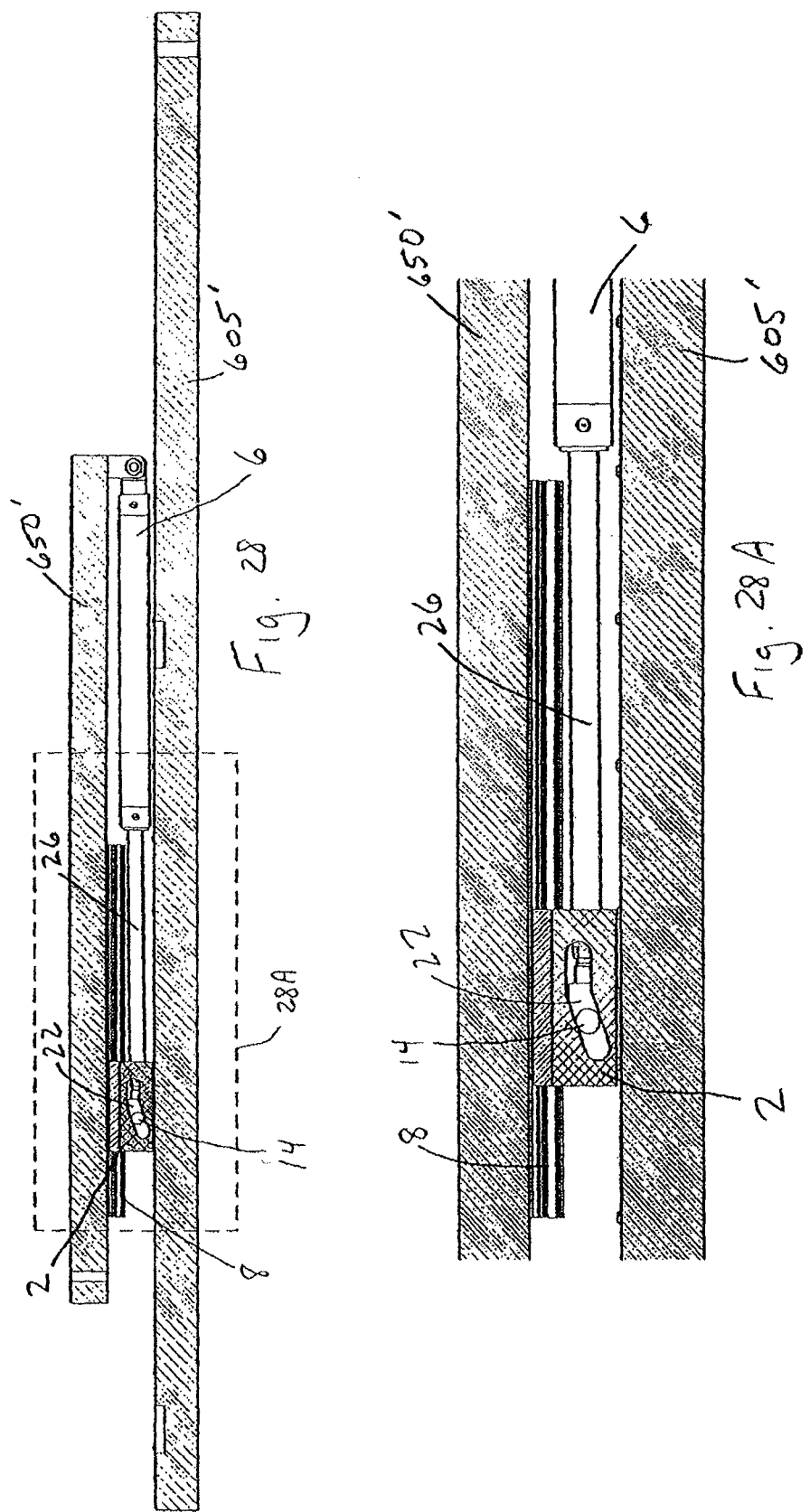
FIG. 28 is a cross-sectional view along the line 28-28 in FIG. 27.
Figure 29:
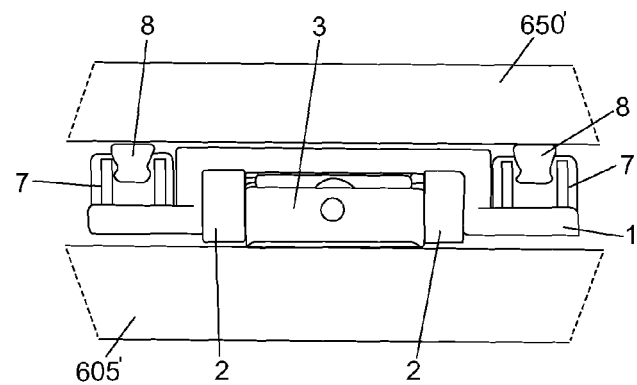
FIG. 29 is an end view along the line 29-29 in FIG. 27.
Figure 29:
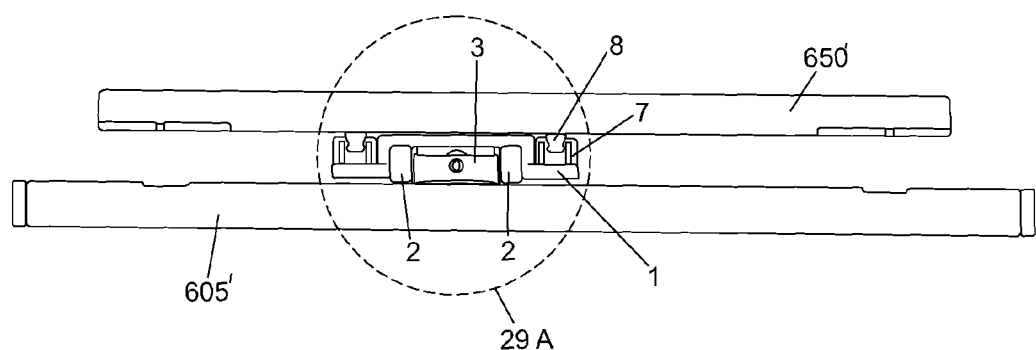

Referring now to FIGS. 27-29, fluid pressure has continued to be applied to the extend port 9 by holding the switch in the drive or extend position. Consequently, the cylinder 6 is now fully extended, and the dowel pins 14 have moved downwards along their ramps 22, as shown in FIG. 28A. As is seen more clearly in FIG. 29A, the brake shoe 3 has contacted the base plate 605' and the tops of the "traction screw heads". As such, the shoe 3 is "pushing" against the base plate 605', and, as the cylinder 6 has extended, this has caused the carriage 650' to move to the right. Notice that the dowel pins 14 are not all the way at the lowest ends of their ramps 22. This has been designed in this manner to allow and compensate for wear of the brake shoe 3 and brake pads 12. As these items wear, the dowel pins 14 will travel further down the ramps 22.

Figure 30:
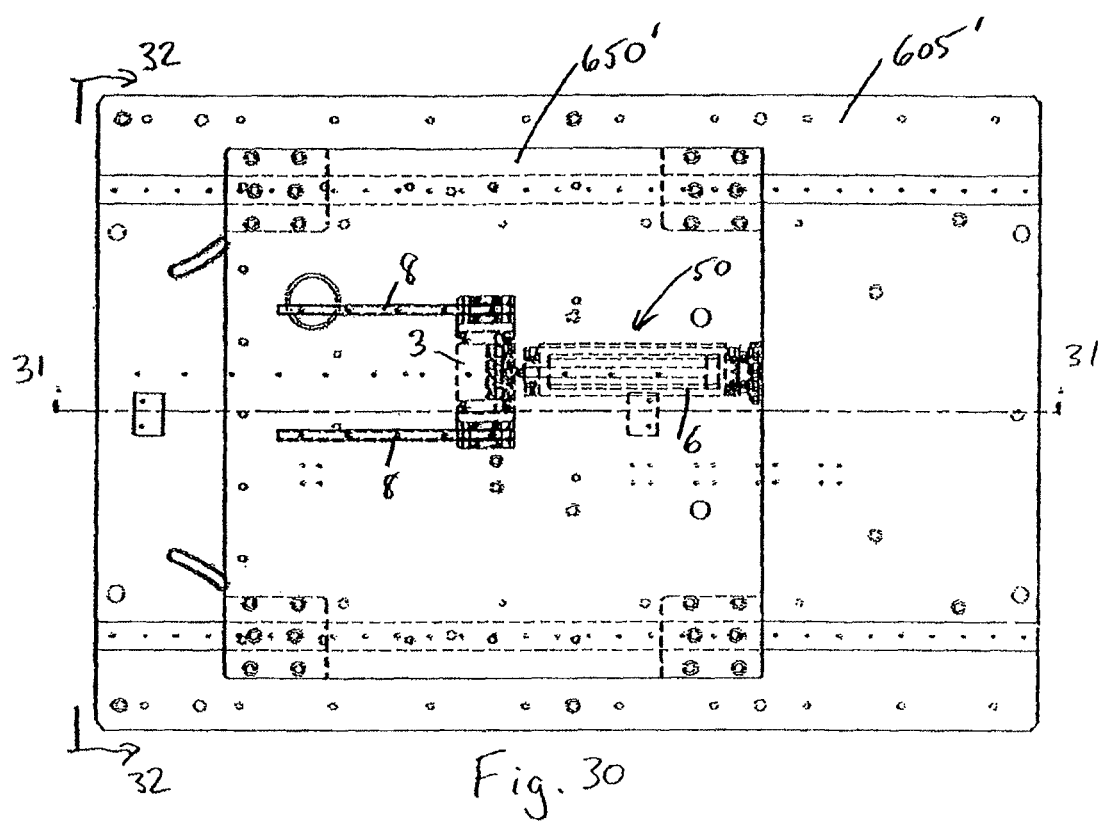
FIG. 30 is a top plan view similar to FIG. 21, with the carriage and linear actuator in an completed extension position.
Figure 31:
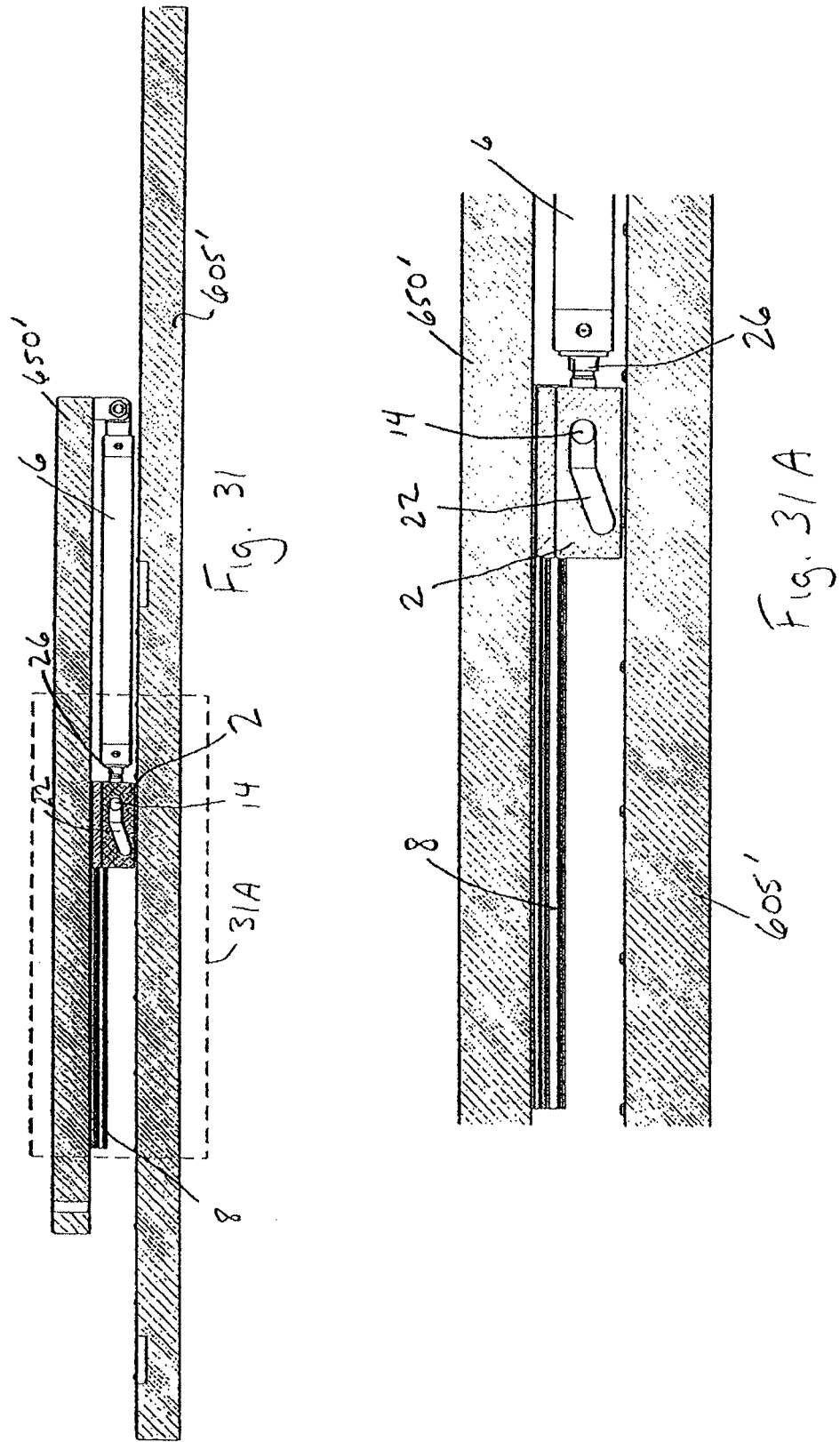
FIG. 31 is a cross-sectional view along the line 31-31 in FIG. 30.
Figure 32:
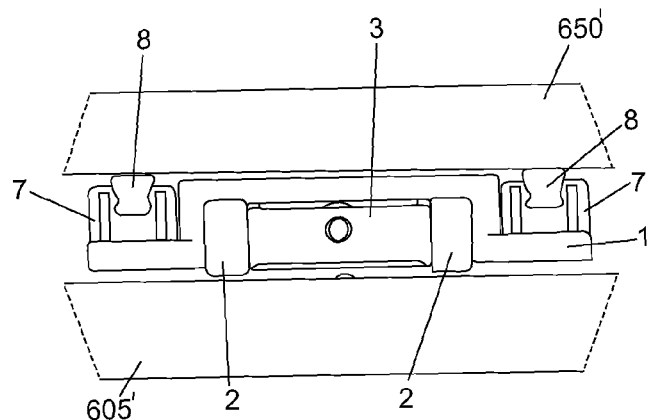
FIG. 32 is an end view along the line 32-32 in FIG. 30.
Figure 32:
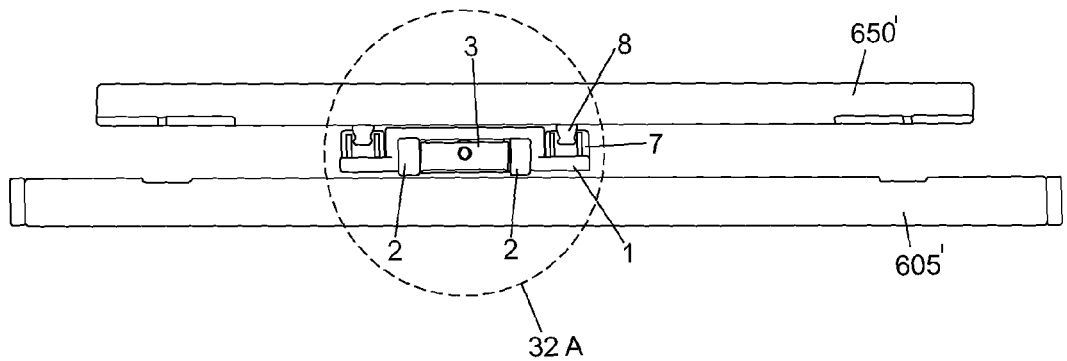

Referring to FIGS. 30-32, the control has now been switched to the "retract" position. Fluid pressure has been removed from the extend port 9, which is allowed to vent. Fluid pressure has been applied to the retract port 9, and the piston 26 has retracted. The system 50 is now ready for another motion cycle. That is, if the control is switched again to the extend position, pressure will again be applied to the extend port 9 while the retract port 9 is vented. This will cause the cylinder 6 to extend once more, causing the carriage 650' to be pushed further to the right. To return the carriage 650' to its starting position (to the left), we leave the switch in the retract position, and this allows the carriage 650' to be manually pushed along its motion rails.

Column unit 100 will be described in more detail with reference to FIGS. 33A-42C. In these figures, column unit 100 is generally illustrated with main arm assembly 500, but, for simplicity, roll gear box 580, cradle 300, test head 490, base unit 600, and control unit 700 are omitted therefrom.

Figures 34A, 34B, 34C:
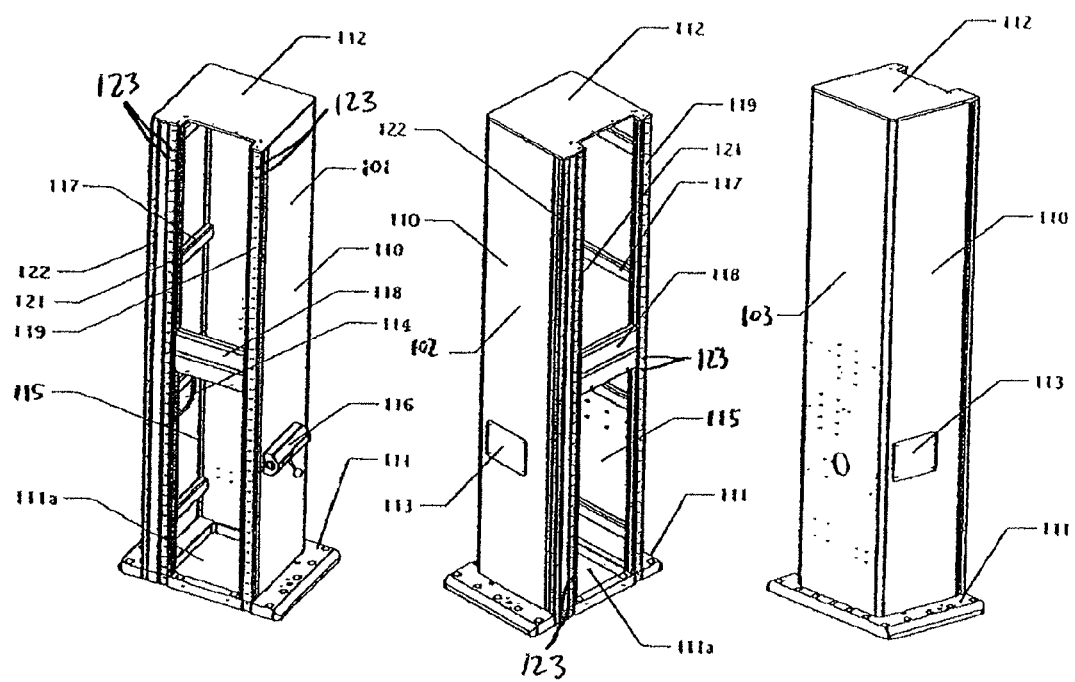
FIGS. 34A, 34B and 34C are right-front, left-front and right-back perspective views, respectively, of the column body of the column assembly of FIGS. 33A and 33B.

Referring to FIGS. 34A-34C, column unit 100 includes column body 110, which provides a vertical support structure as well as an enclosure unit and mounting structure for various apparatus. In the present embodiment, column body 110 is U-shaped in cross section and fabricated of a suitable material, such as steel, in appropriate dimensions to support the desired load. The U-shaped cross section provides a structure with three contiguous closed sides (right side 101, left side 102 and rear side 103) and an open (front) side 115. Attached to the bottom of column body 110 is footplate 111, which includes footplate opening 111a. Footplate 111 is used to secure column assembly 100 to base plate 605 of base unit 600. Because footplate 111 transfers the load from column unit 100 to base unit 600, footplate 111 it is preferably welded to column body 110.

Top piece 112 is fitted to the top of column body 110 and attached thereto with screws or other means. Attached to left side 101 of column body 110 is bolt lock assembly 116, which includes slidable bolt 116a and bolt operating handle 116b. Inside column body 110 are structural members 117. Additional structural members 118 are secured across front opening 115 and located at the approximate center of opening 115.

Vertically oriented rail-mounting surface 119 is provided on the left of open side 115. Two vertically oriented rail-mounting surfaces 121 and 122 are provided on the right of open side 115. Preferably, mounting surfaces 119, 121, and 122 include appropriately located threaded holes 123 for receiving screws or the like, which attach rails to the respective surfaces. Other mounting arrangements may also be utilized.

Figure 33A:
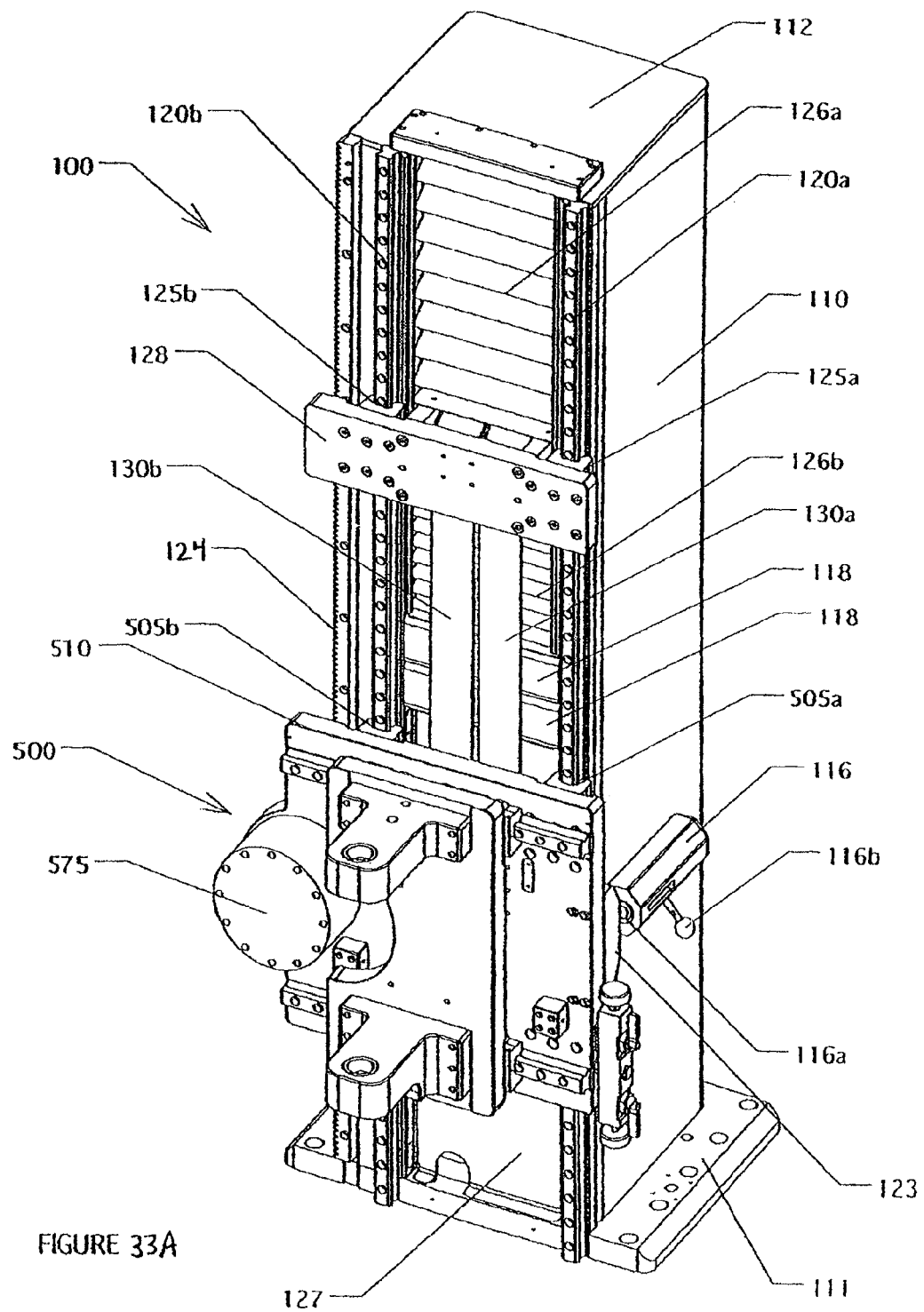
FIGS. 33A and 33B are right and left front perspective views, respectively, of the column assembly of the manipulator system of FIG. 1A with the main arm assembly in a service position.
Figure 33B:
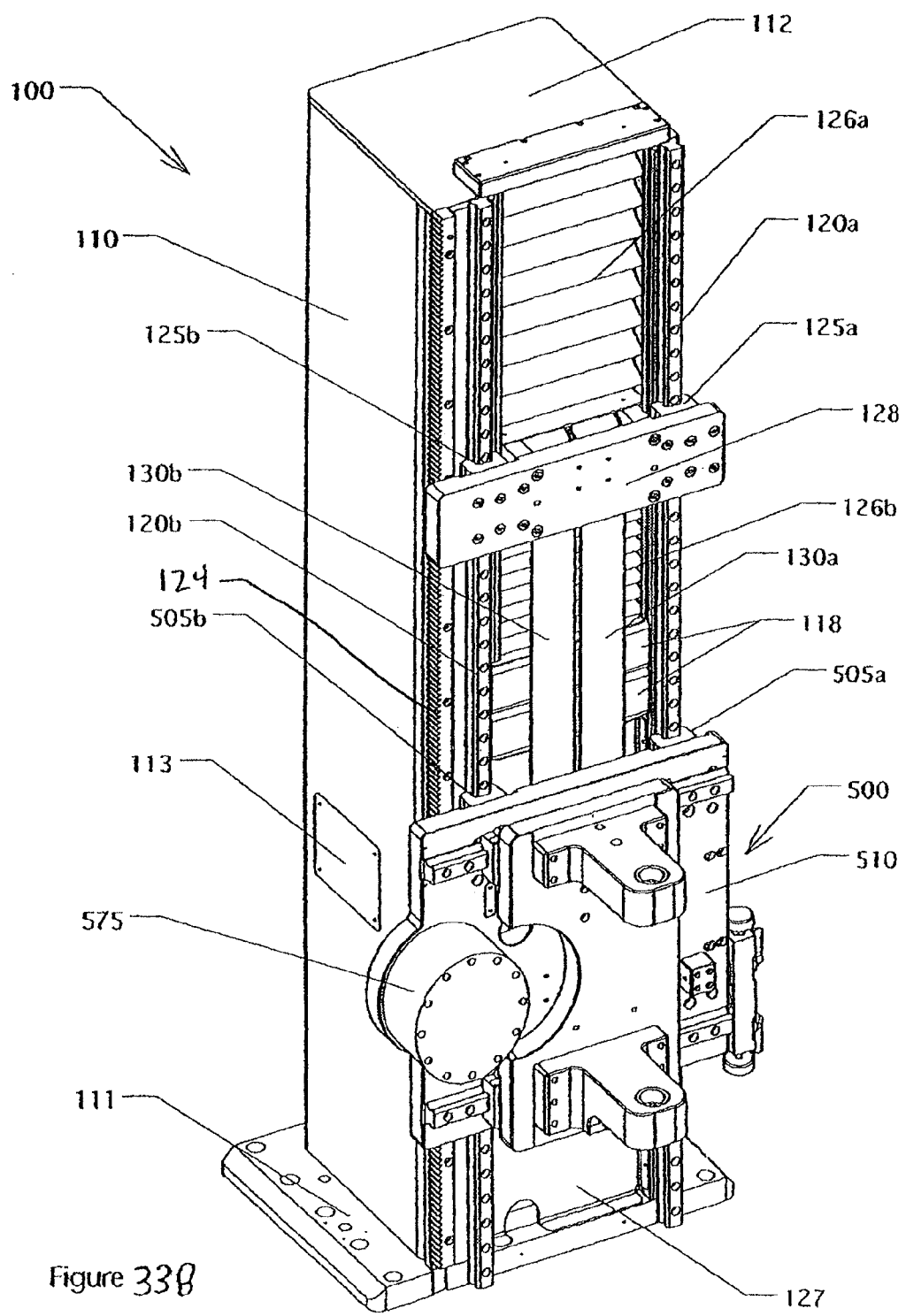

Returning to FIGS. 33A and 33B, linear guide rails 120a and 120b are fastened to rail-mounting surfaces 119 and 121 respectively, and toothed brake-rail 124 is attached to rail-mounting surface 122. Main arm plate 510 of main arm unit 500 includes linear bearings 505a,b,c and d (linear bearings 505 c and d are not visible in FIGS. 33A and 33B.) Linear bearings 505b and d are arranged so as to engage linear rail 120a, and linear bearings 505a and c are arranged so as to engage linear rail 120b such that main arm unit 500 may translate vertically with very little friction along a vertical axis defined by linear rails 120a and b. Lift arm 128 includes linear bearings 125a and b, which are arranged to engage linear rails 120a and b respectively such that lift arm 128 may also translate vertically with low friction along the same vertical axis. In the present embodiment, the vertical motion of lift arm 128 is constrained to be between a location approximately just above the upper of structural members 118 to approximately just below top piece 112. Fan folded shields 126a and 126b or the like are provided to close opening 115 between lift arm 128 and structural members 118 and between lift arm 128 and top piece 112 respectively. Solid shield 127 (see FIG. 35B) fills opening 115 below structural members 118.

Main arm unit 500 includes pneumatic lock module 575. Lock module 575 includes a pinion gear (not shown) that engages toothed brake rail 124. When air pressure is applied to lock module 575, the pinion gear is free to rotate; when air pressure is removed, the pinion gear is locked in place and cannot rotate. Thus, in the absence of air pressure, lock module 575 prevents vertical motion of main arm unit 500.

Figure 33C:
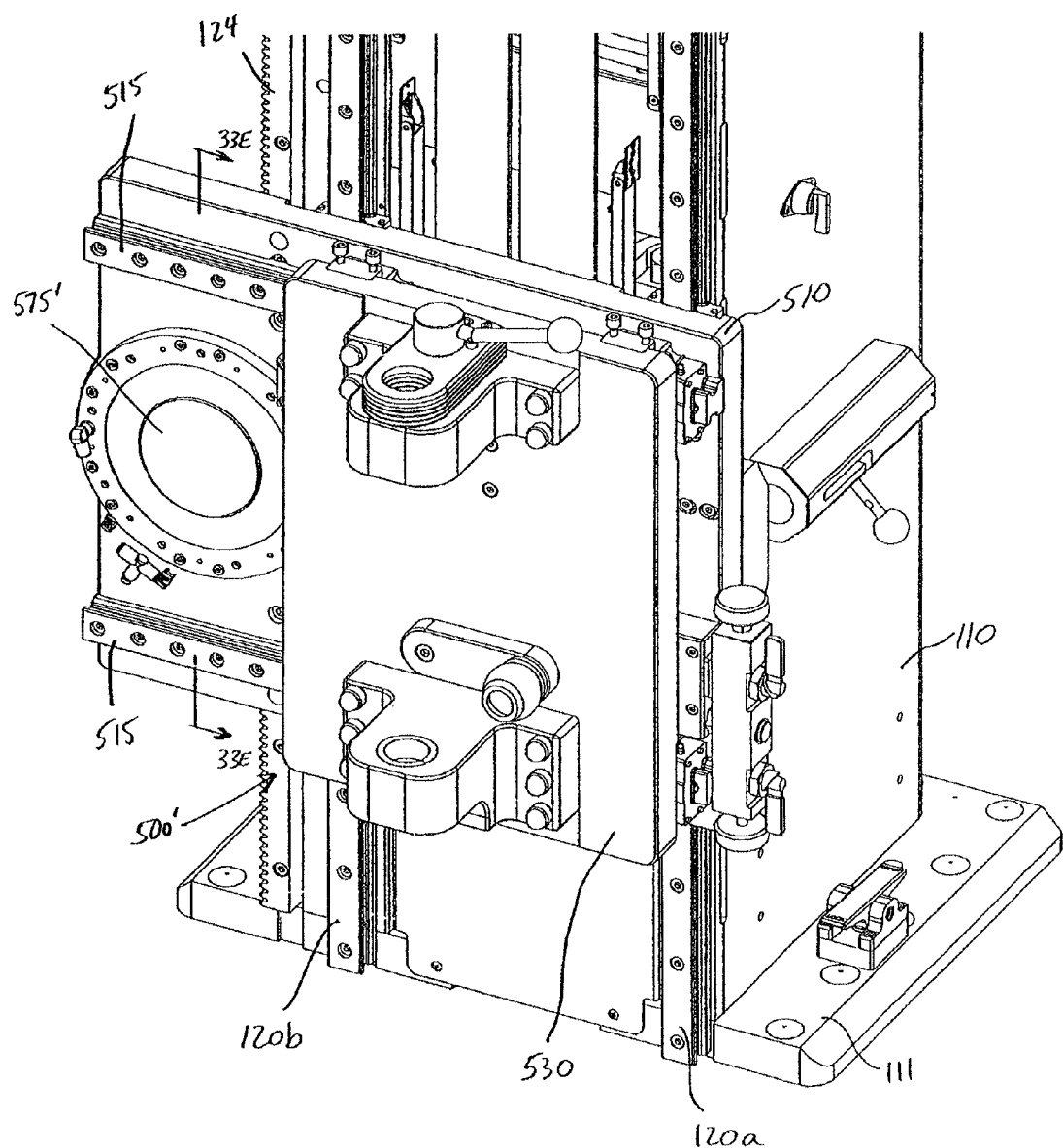
FIG. 33C is a right front perspective view of an alternative main arm assembly.
Figure 33D:
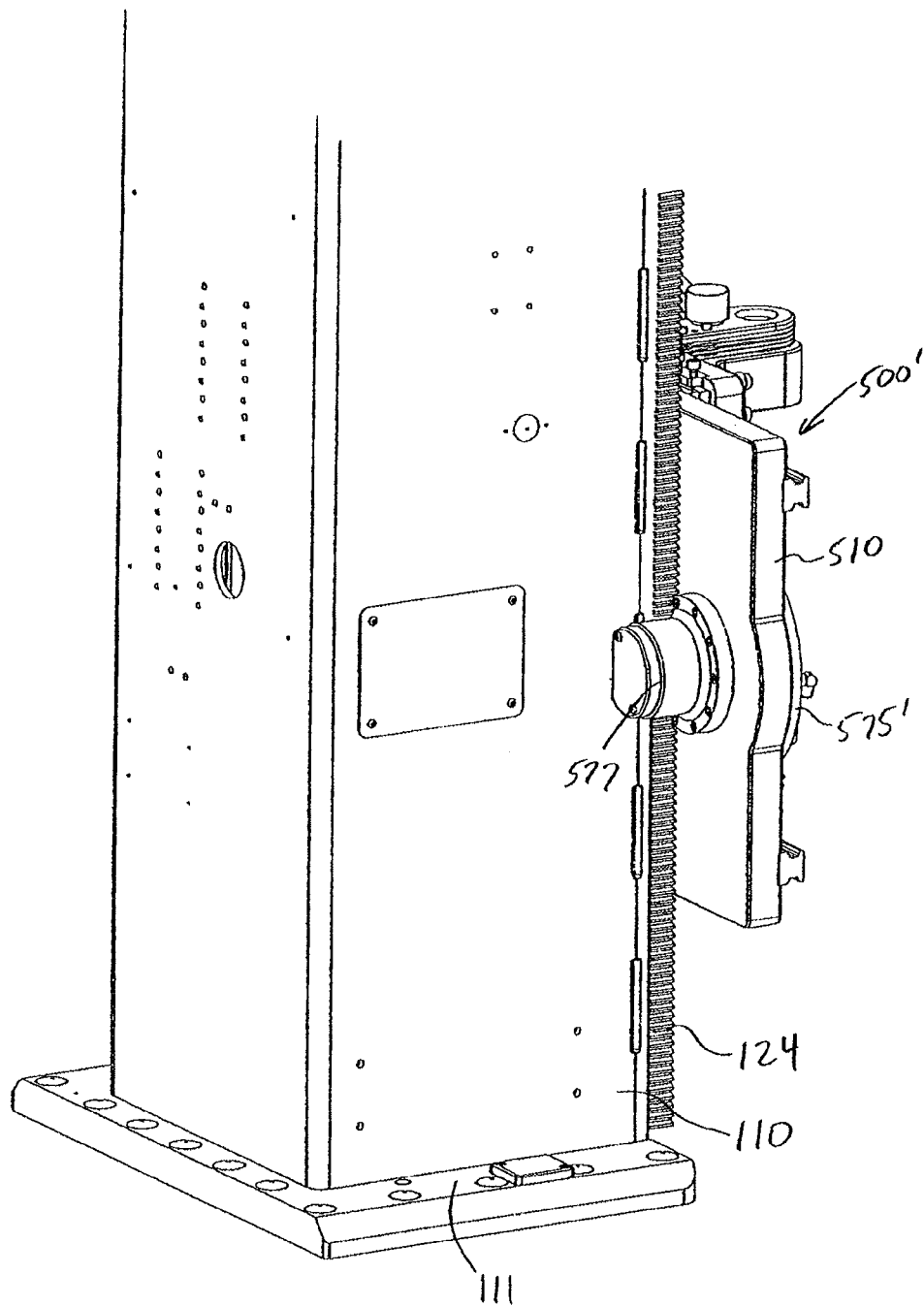
FIG. 33D is a left rear perspective view of the main arm assembly of FIG. 33C.
Figure 33:
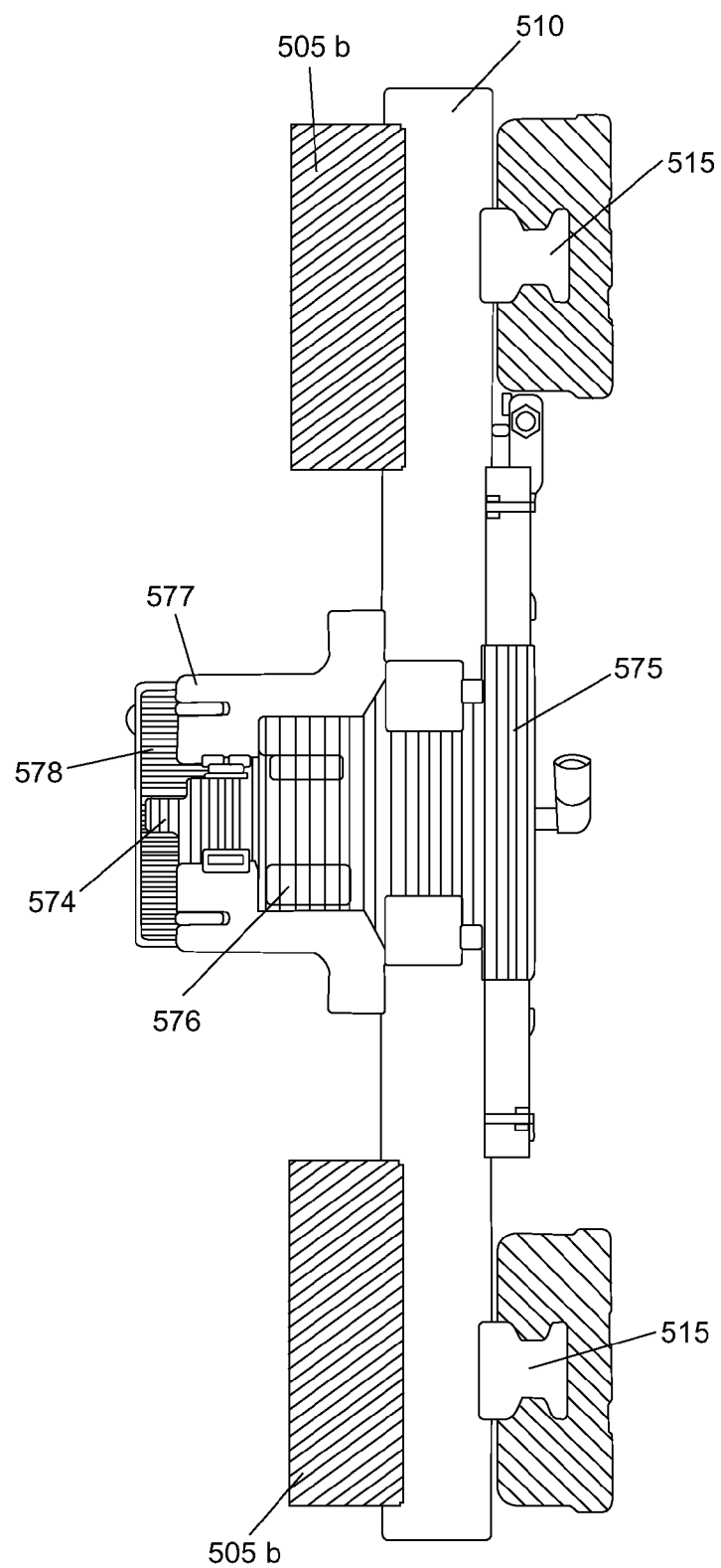
FIG. 33E is a cross-sectional view along the line 33E-33E in FIG. 33C.

An alternative main arm unit 500' with a lower profile lock module 575' is illustrated in FIGS. 33C-33E. The lock module 575' includes shaft 574 extending through main arm plate 510 with pinion gear 576 extending therefrom (see FIG. 33E). Pinion gear 576 is configured to engage toothed brake rail 124. As in the previous embodiment, lock module 575' is configured such that when air pressure is applied to lock module 575', pinion gear 576 is free to rotate, and when air pressure is removed, pinion gear 576 is locked in place and cannot rotate. Thus, in the absence of air pressure, lock module 575' prevents vertical motion of main arm unit 500.

Lock module 575' also includes a rotary damper 578 which engages a rear end of shaft 574. Damper 578 includes a sealed chamber with one or more vanes (not shown) positioned therein and configured to rotate with shaft 574. The vanes move within fluid filled pressure chambers and provide a dampening effect which may be beneficial if there is "sticking" or the like during actuation of the system. Damper 574 resists changes in momentum. Thus, while arm plate 510 is in motion, pinion gear 576 rotates due to its interaction with toothed rail 124. This causes shaft 574 to rotate causing the vanes within damper 578 to rotate. Any effect, such as overcoming breakaway stiction, that would cause the speed of plate 510 to change abruptly is resisted and dampened by the viscous resistance of the vanes interacting with the fluid. An exemplary damper 578 is the FDT series available from ACE Controls Inc. located in Farmington Hills, Mich. The rotary damper 578 may be utilized with any of the embodiments described herein.

Figure 37A:
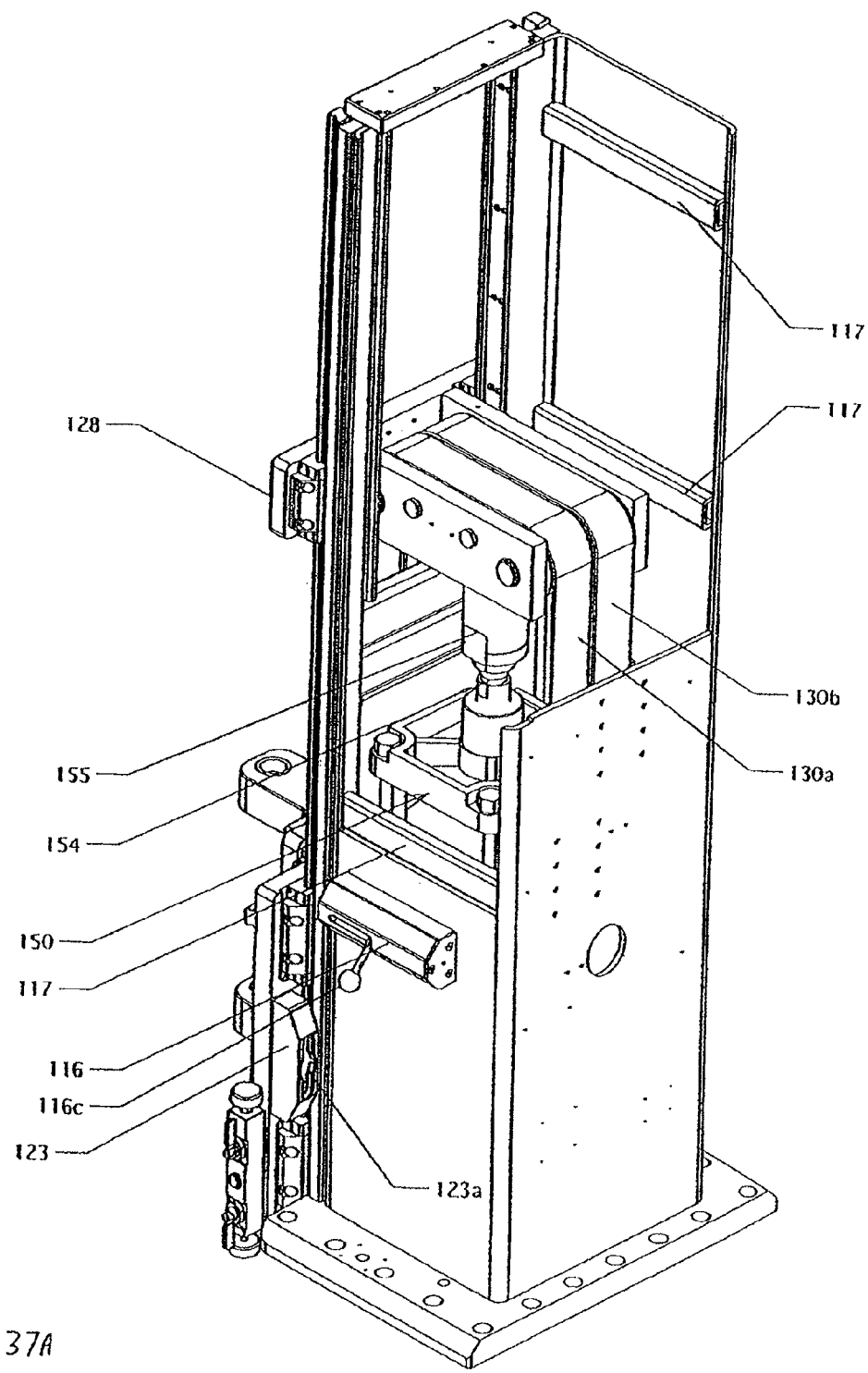
FIGS. 37A, 37B, and 37C are cut-away perspective views of the column assembly from the rear left with the main arm in its lowermost, service and uppermost positions, respectively.
Figure 37B:
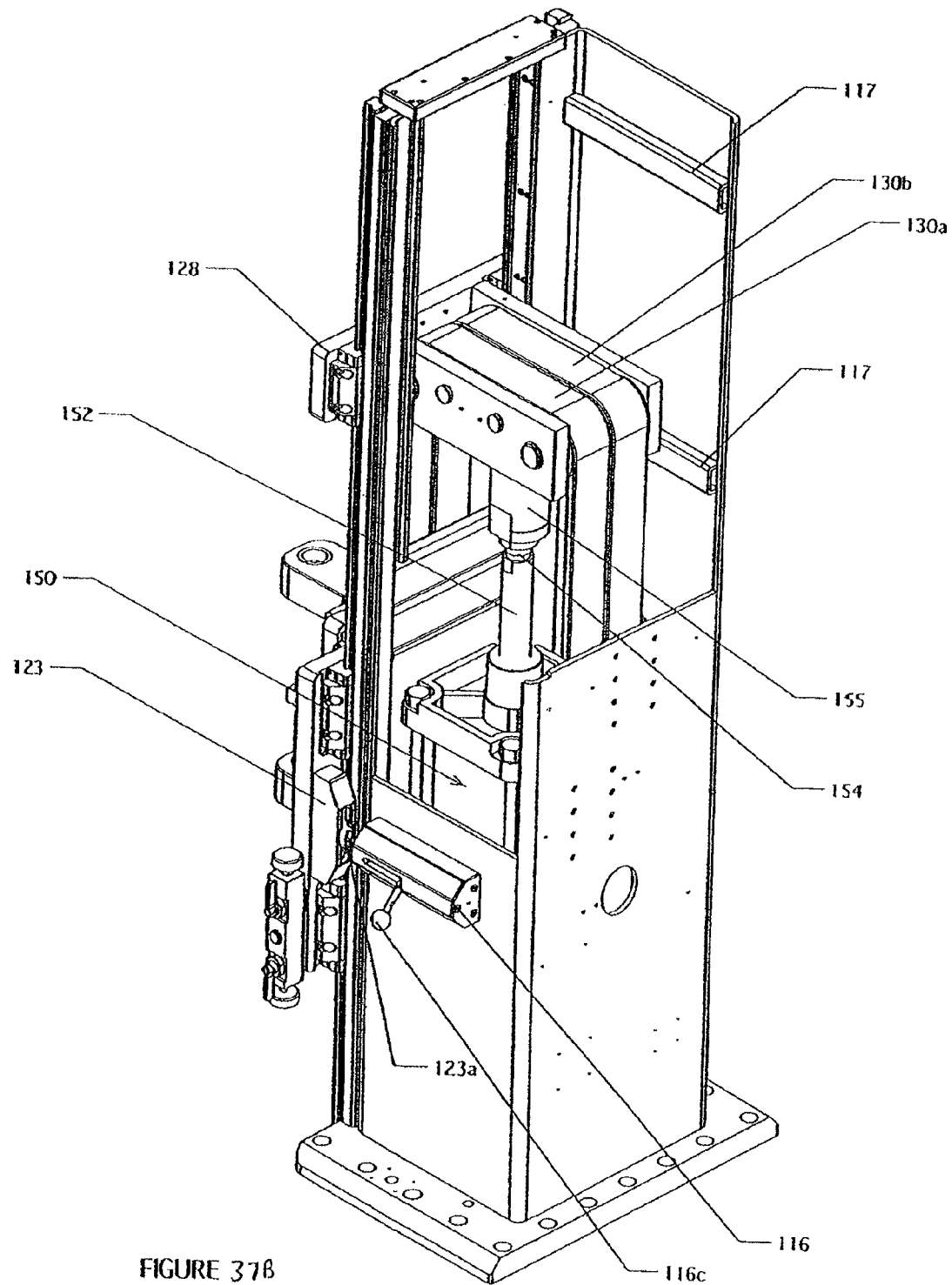

Main arm unit 500 also includes bolt receiver 123 which includes bolt receiving hole 123a (see FIG. 37A). Main arm unit 500 may be vertically positioned so that receiving hole 123a is aligned with bolt 116a of bolt lock assembly 116. Bolt operating handle 116b may then be operated to slide bolt 116a into receiving hole 123a, thus locking main arm unit 500 securely in position. This position is referred to as the "service position." When in the service position, the system may be safely disassembled/assembled or otherwise worked upon. In particular, support straps 130a and 130b, described below, may be safely removed, installed, or replaced.

Figure 35A:
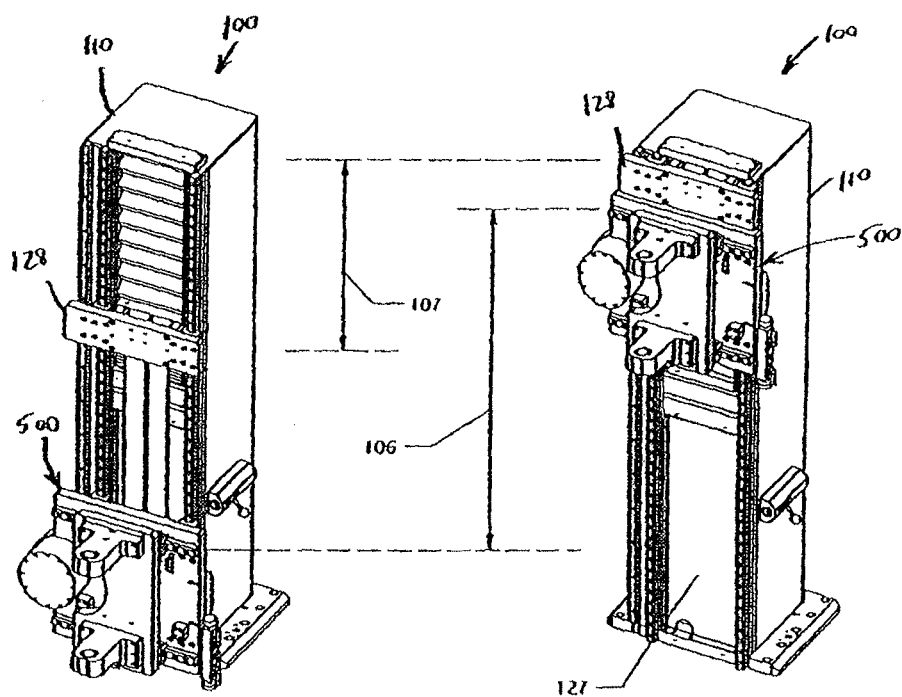

FIGS. 35A and 35B illustrate main arm unit 500 and lift arm 128 in their lowest and uppermost positions respectively. As will be explained in more detail hereinafter, it is observable that main arm unit 500 moves a distance 106 that is greater than, preferably at least twice as great, the distance 107 that lift arm 128 moves.

Figure 36A:
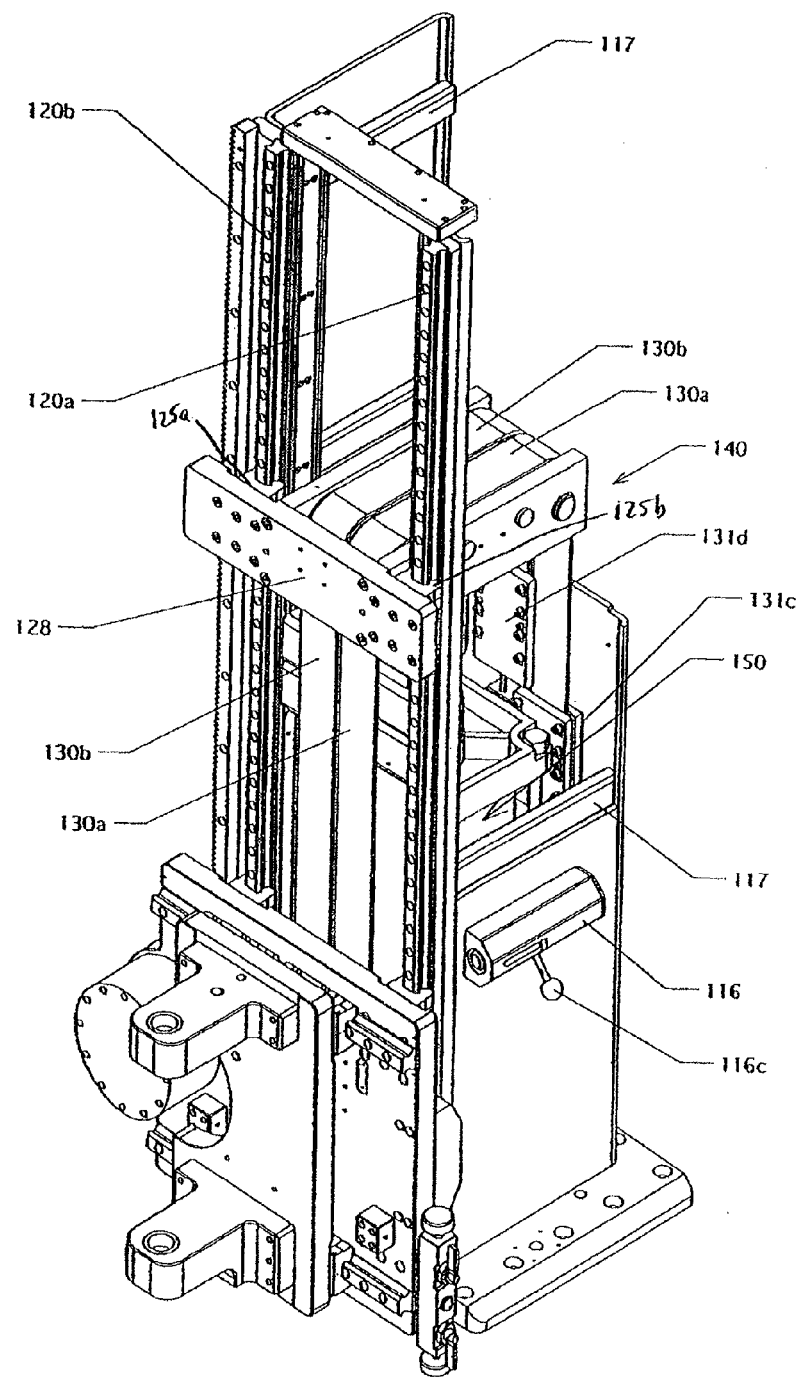
FIGS. 36A, 36B, and 36C are cut-away perspective views of the column assembly from the front right with the main arm in its lowermost, service and uppermost positions, respectively.
Figure 36B:
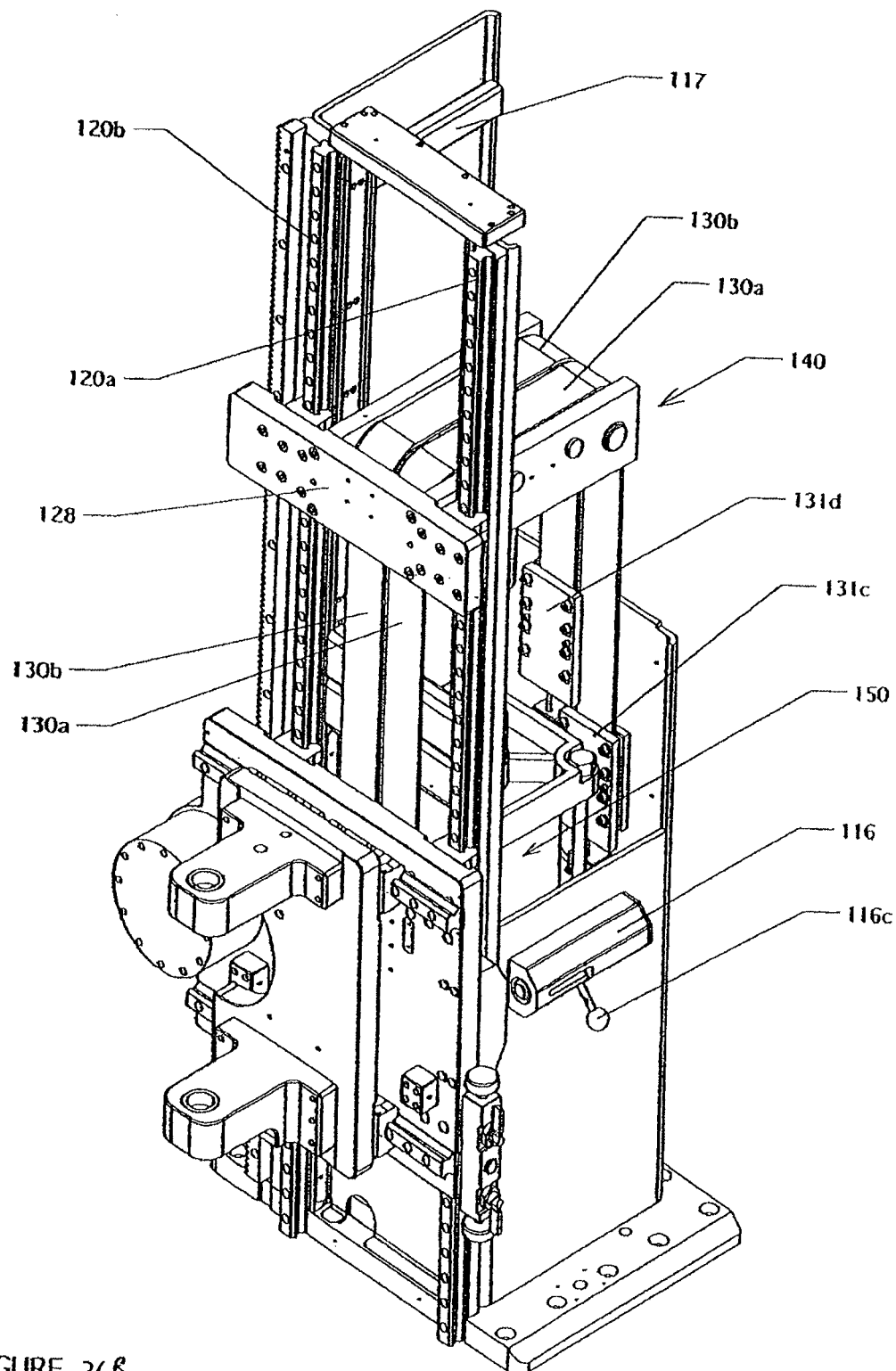
Figure 36C:
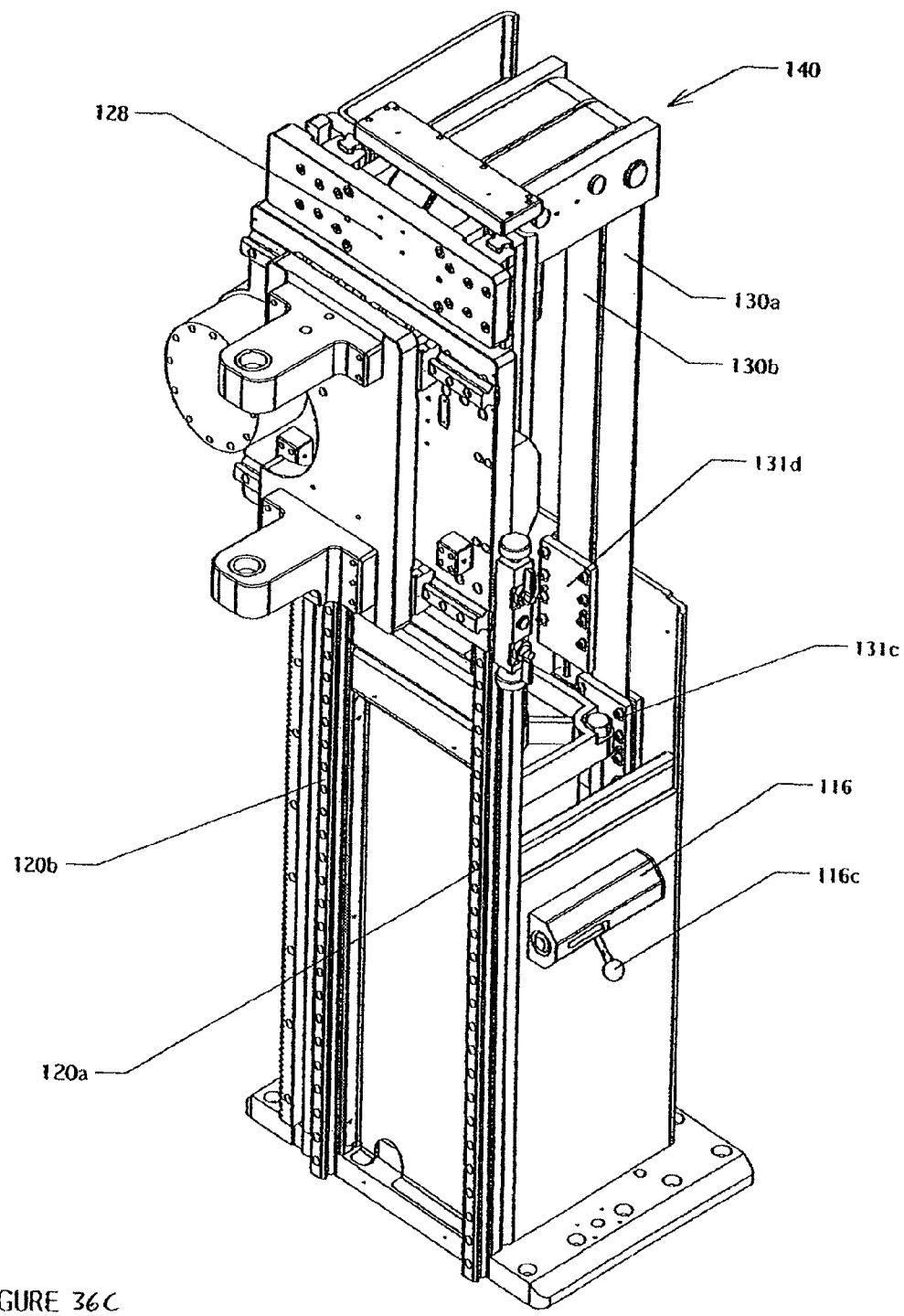
Figure 37C:
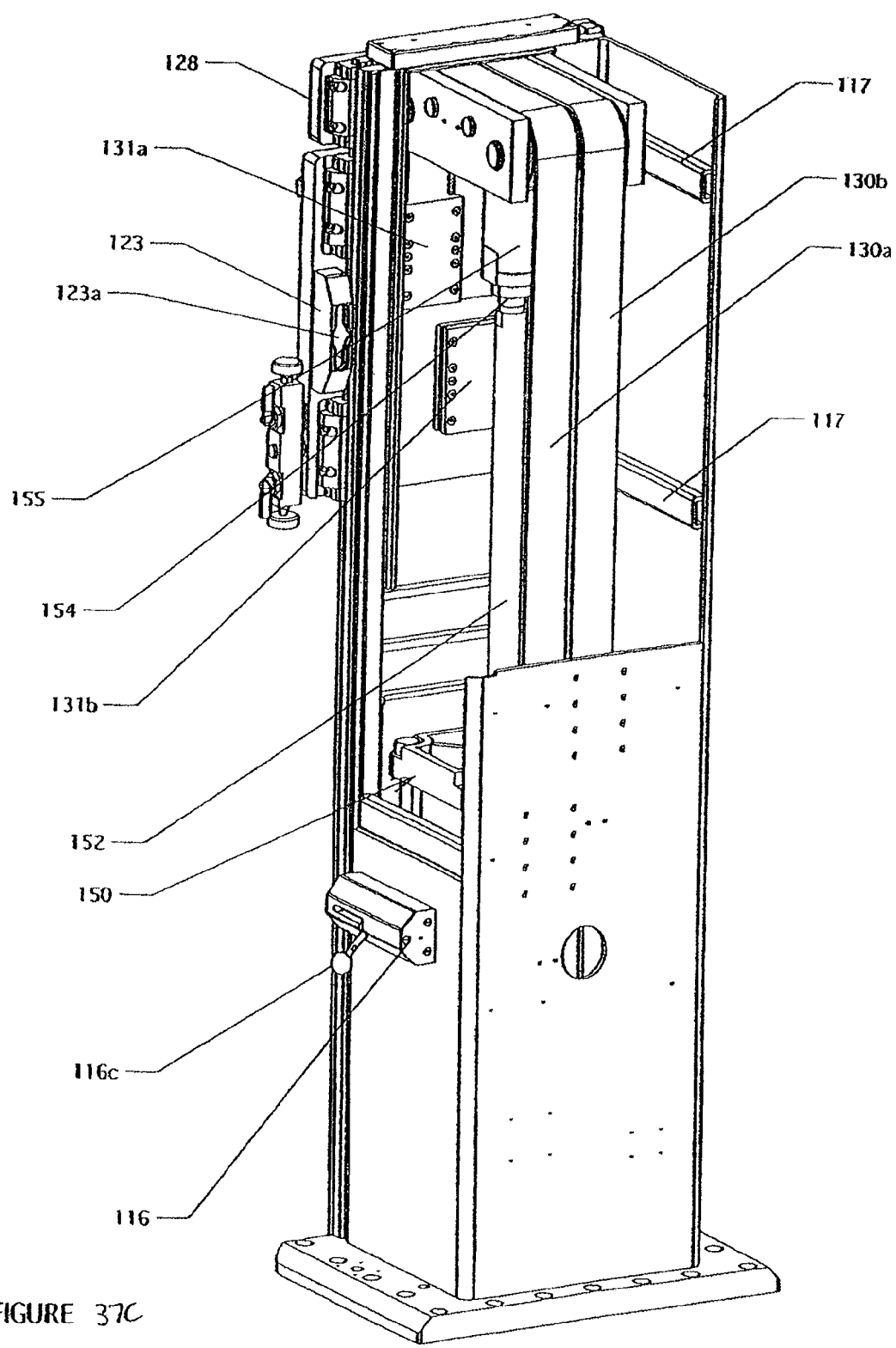

Referring to FIGS. 36A-36C and 37A-37C, main arm unit 500 is supported by two straps 130a and 130b which are secured to the back of main arm plate 510 and which are routed behind lift arm 128 and back into the interior of column body 110 where they interact with a counterbalance/actuation mechanism as described below. In FIG. 37C the attachment of load carrying straps 130a,b to the rear of main arm plate 510 is visible. In particular the ends of load carrying straps 130a,b terminate in metallic attachment blocks 131a,b respectively, which are in turn secured to the rear of main arm plate 510 with appropriate fasteners or the like, such as machine screws. Further, as best seen in FIG. 36B, the opposite ends of load carrying straps 130a,b also terminate in metallic attachment blocks 131c,d, which are in turn secured to the inside rear portion of column body 110.

Thus, the weight of main arm unit 500 and the load that it carries (hereinafter the "total load") is transferred via load-carrying straps 130a,b to column body 110. Those having a reasonable familiarity with the art will recognize that one load-carrying strap could be used in place of two. However, using two load-carrying straps provides redundancy and safety in the event of the failure of one strap. Of course it may be feasible to use more than two load-carrying straps. Also, it will be recognized that wire cables, wire ropes, bicycle-style chain, and the like may be substituted for the straps.

Figure 39:
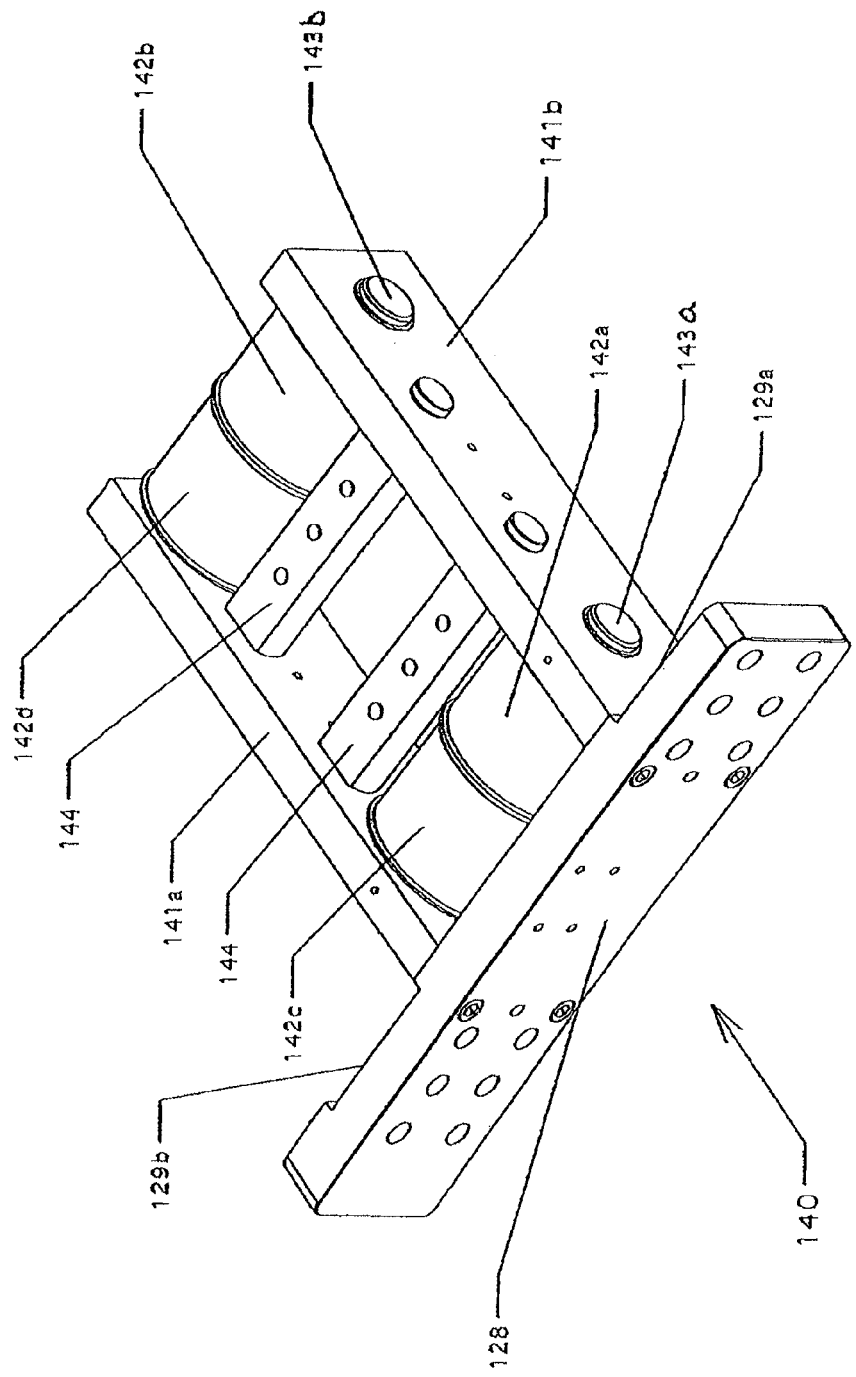
FIG. 39 is a perspective view of the pulley lift carriage of the manipulator system of FIG. 1A.

In the assembled condition, load carrying straps 130a,b extend upwards from main arm unit 500, about pulley lift carriage 140 and finally downwards to the attachment blocks 131c, d. An exemplary pulley lift carriage 140 is shown in FIG. 39. Pulley lift carriage 140 includes side bars 141a and 141b. Spacer bars 144 are fitted and secured with appropriate fasteners between sidebars 141a and 141b to space them apart and parallel with one another. Axels 143a and 143b extend from side bar 141a to side bar 141b. Pulleys 142a,c are mounted, side-by-side, on axel 143a with suitable bearings. Similarly pulleys 142b,d are mounted, side-by-side, on axel 143d with suitable bearings. Pulleys 142a,b,c,d are located between side bars 141a,b such that they rotate about axes which are perpendicular to side bars 141a,b and parallel to spacer bars 144. Load carrying straps 130a,b extend upwards from main arm unit 500, through the space between lift arm 128 and pulleys 142a and 142c, respectively, horizontally across pulleys 142a,b and 142c,d, respectively, and downwards to the attachment blocks 131 c, d.

Lift arm 128 is attached to a forward-facing end of sidebars 141a and 141b with appropriate screws. Lift arm 128 includes recesses 129a,b, which receive linear bearings 125a,b (see FIG. 36A) such that lift carriage 140 may translate vertically, guided by the interaction of linear rails 120a,b with linear bearings 125a,b.

Figure 38:
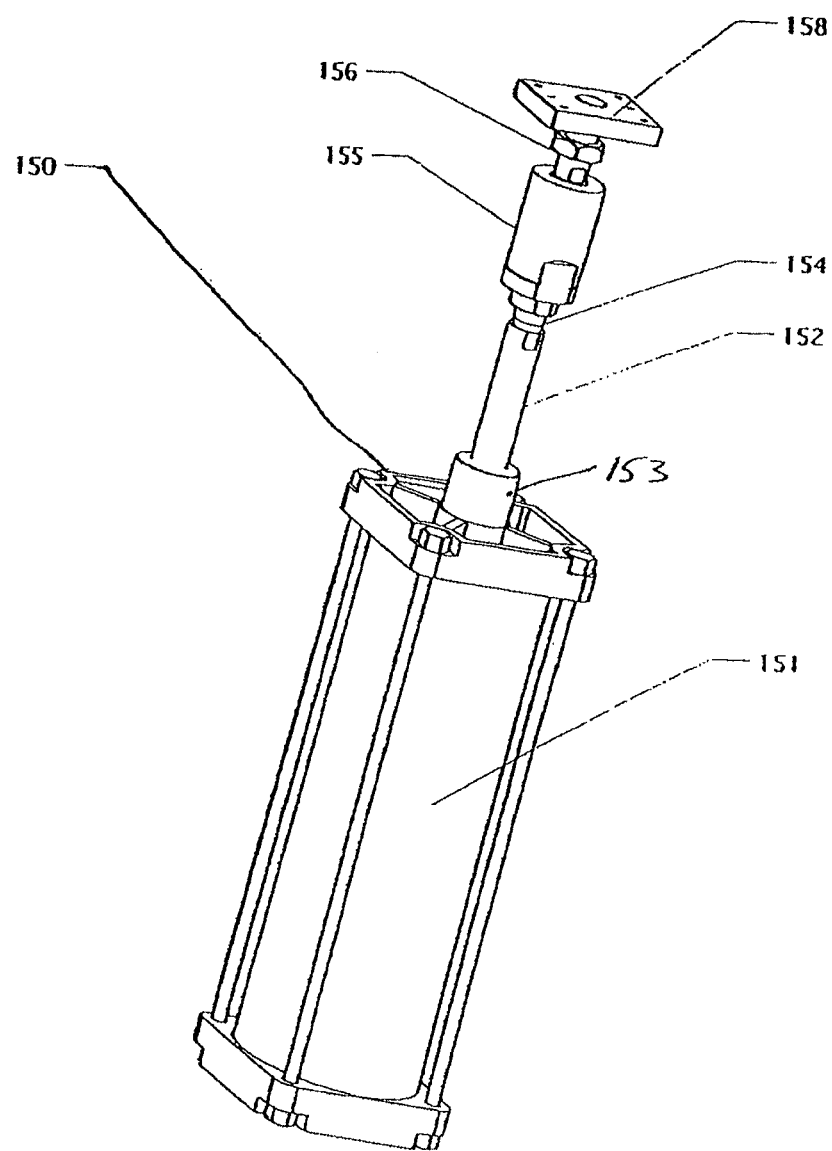
FIG. 38 is a perspective view of the main pneumatic cylinder assembly of the manipulator system of FIG. 1A.

To facilitate up and down movement of main arm unit 500, pulley lift unit 140 is attached to main fluid-operated actuator 150. Referring to FIG. 38, main fluid-operated actuator 150 includes cylinder block 151 which has a cylindrical internal bore and a cylindrical piston which travels along the bore in response to a difference in the forces applied to the two surfaces of the piston which are orthogonal to the axis of the cylinder. In this exemplary embodiment, the working fluid is a gas, in particular air. Piston rod 152 extends from one end of cylinder block 151. Piston rod 152 is connected to the aforementioned piston, which is internal to block 151. A compensation coupling 155 (e.g. an "ausgleichskupplung" from Konstandin GmbH, Industriestrasse 13-15, D-76307 Karlsbad, Germany), which provides several degrees of motion freedom, may be used to couple piston rod 152 to load attachment bracket 158. The motion freedom provided by compensation coupling 155 compensates for any misalignment between attachment bracket 158 and piston rod 152, thus reducing any misalignment-induced side loading that could impede smooth motion. A first end of coupling member 155 is coupled to piston rod 152 by means of first joint 154 and to load attachment bracket 158 with second joint 156. Load attachment bracket 158 is attached to spacer bars 141 of pulley lift carriage 140. Pulley lift carriage 140 is thereby coupled to the piston of main fluid-operated actuator 150 through two flexible joints 154 and 156 and coupling member 155, the combination of which provides a universal joint. As such, a load transferred to load attachment unit 158 will be transferred to piston rod 152 in a location and direction that is coaxial with the axis of piston rod 152 and the cylinder within cylinder block 151.

Figure 40:
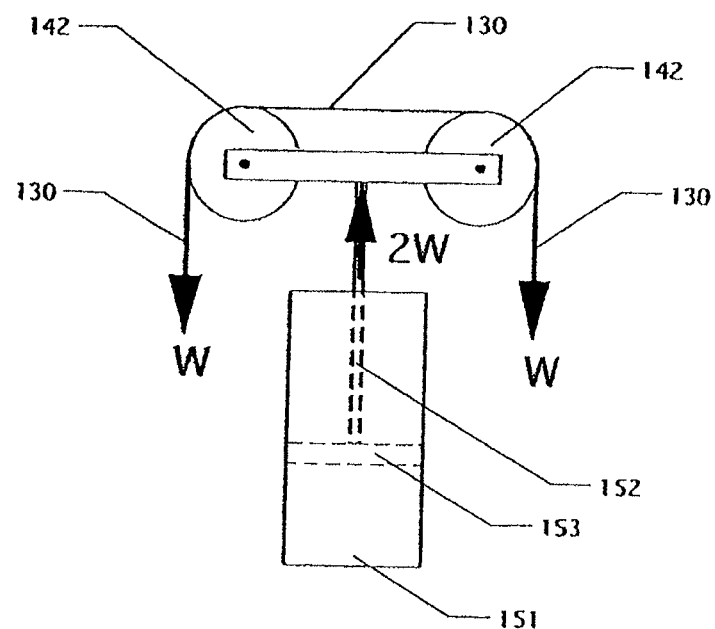
FIG. 40 is a schematic free body diagram illustrating the forces associated with the pulley lift carriage.

Referring to FIG. 40, the tension combined in load-carrying straps 130a,b supports the "total load." Pulley lift carriage 140 includes two pulleys 142, representing actual lift carriage 140 and pulleys 142a,b,c,d. Strap 130 represents the combination of load carrying straps 130a,b. The tension in strap 130 is shown as W acting downwards and tangentially at each pulley 142. (The force W representing the weight of the total load.) Thus, the total force acting downwards on pulley lift carriage 140 is 2W. Pulley lift carriage 140 is supported by piston rod 152, which is in turn supported by piston 130 within cylinder block 151. To hold lift carriage in static equilibrium or to allow it to be moved at a constant speed, piston rod 152 and piston 153 exert an opposing force of 2W in the upwards direction onto lift carriage 140. Thus, the working fluid applied to cylinder block 151 must provide a pressure sufficient to generate a net upwards force on piston 152 of approximately 2W.

Thus, in exemplary manipulator system 10, fluid-operated actuator 150 must support and provide motion to a load that is approximately twice the weight of main arm unit 500 and its attached load. Both static and dynamic friction also will come into play in any practical embodiment. Static friction acts to help to a small degree to support the load when it is stationary. Dynamic friction may act in a direction to oppose motion when the load is moving.

Figure 65:
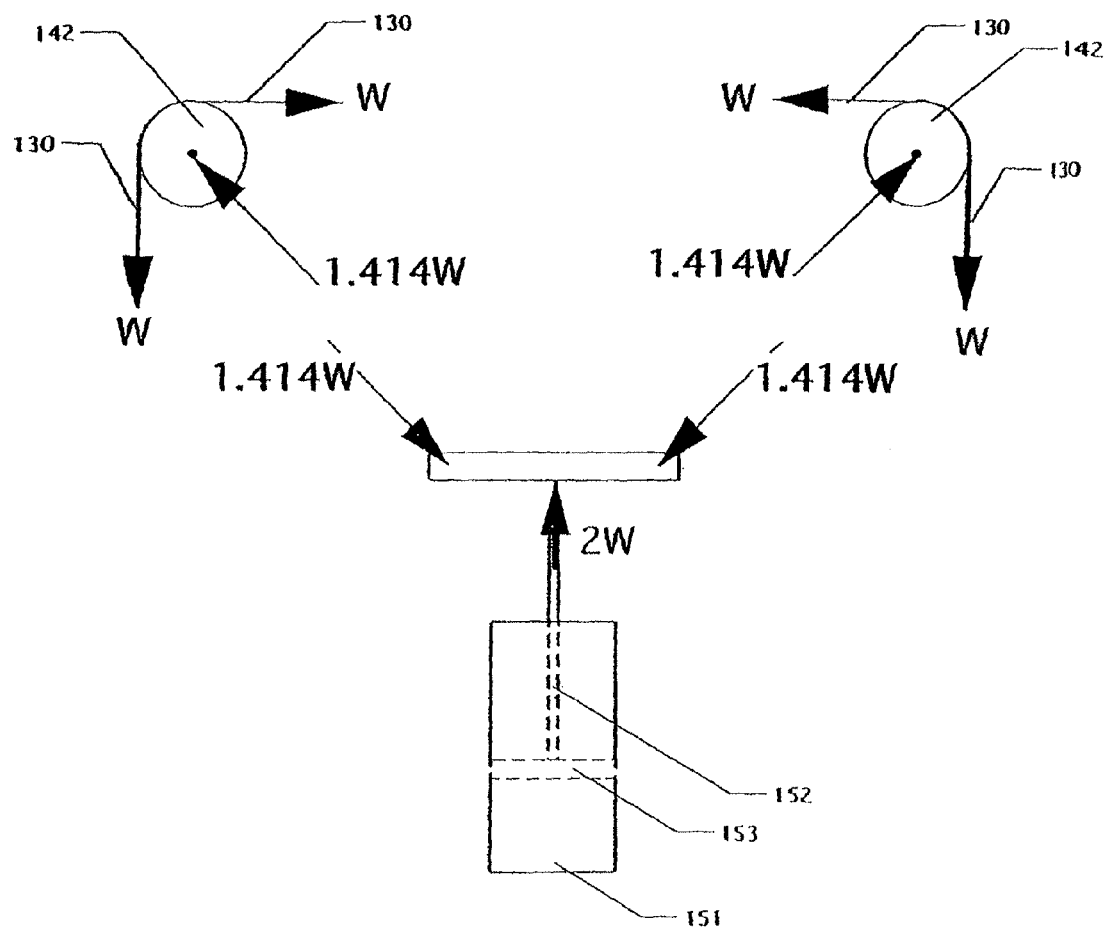
FIG. 65 is a schematic free body diagram illustrating the forces associated with the pulley lift carriage of FIG. 64.
Figure 66:
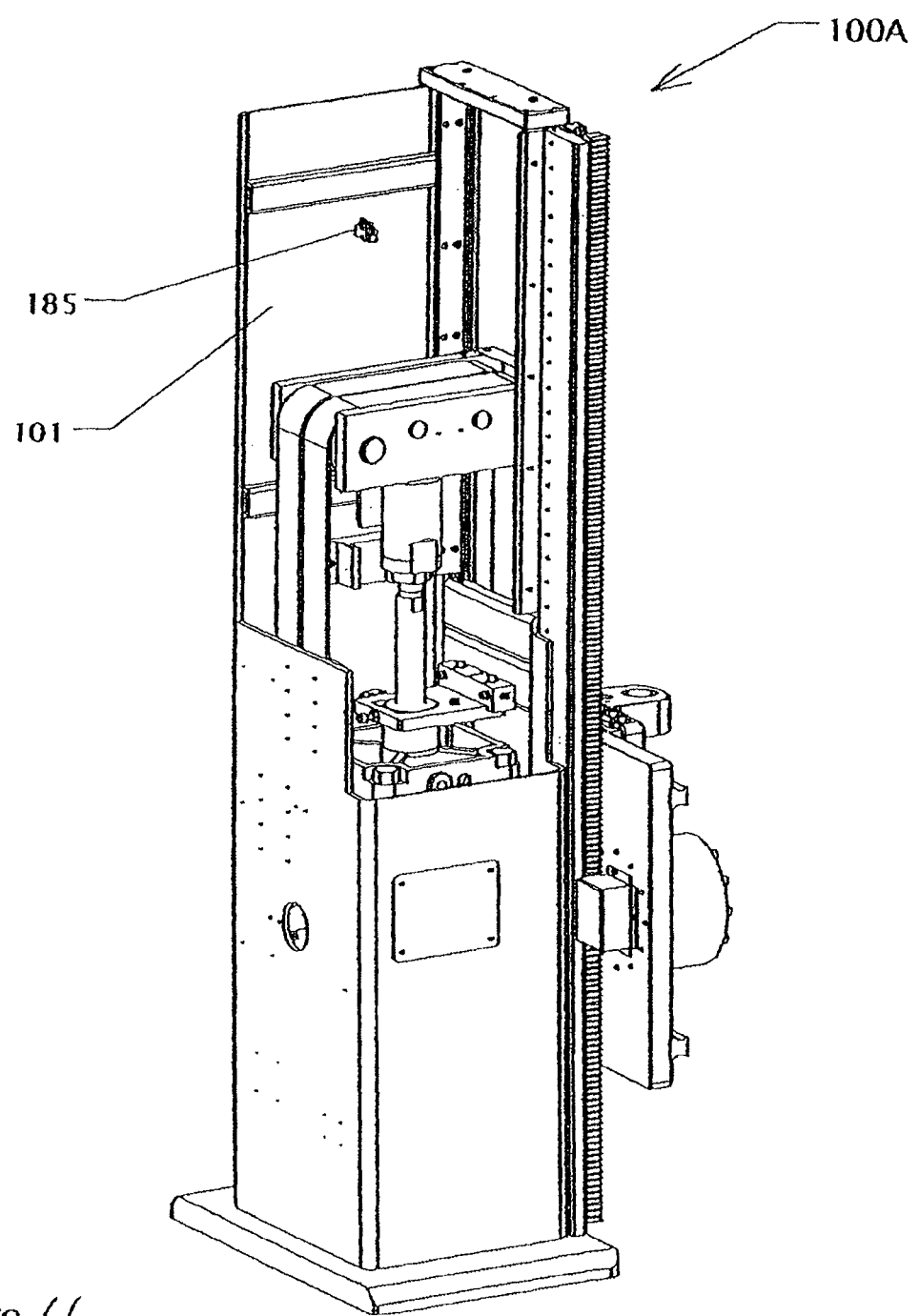
FIG. 66. is a left rear, cut-away perspective view of the column of FIG. 62.

With reference to FIG. 65, when the system is properly leveled and supported and when the load of main arm assembly 500 properly tensions straps 130a and 130b, the loading on fluid-operated actuator 150 by straps 130a and 130b is such that it tends to keep fluid-operated actuator 150 in a vertical orientation. FIG. 65 includes free body diagrams of pulleys 142 and illustrates the forces acting on each pulley 142. In each case, the tension in carrying strap 130 is equal to W and acts in the directions shown. As such, each pulley's axel 143 exerts a force of square root of two multiplied by the supported weight W in a direction that is 45 degrees from the horizontal and directed outwards from lift carriage 140. Thus, the forces or loading imposed upon lift carriage 140 by the carrying straps 130 are of the same magnitude, but in opposing directions; that is acting downwards and towards the center of lift carriage 140. It is seen that these forces will tend to keep fluid-actuated cylinder in a vertical orientation. However, if the tension in straps 130 is removed for any reason, these stabilizing forces would vanish. While opening 111a closely surrounds the bottom 159 of fluid-operated actuator 150 and thereby constrains such from significant movements in the horizontal plane, when the stabilizing forces are removed, for example, during assembly, shipment, setup, or maintenance, a tipping force may result on the fluid-operated actuator 150. In the present embodiment, such tipping is counteracted by means of the connection of lift carriage 140 to rails 120a and 120b via lift arm 128 and linear bearings 125a and 125b.

Again referring to explanatory FIG. 40, the piston may be caused to move by controlling the working fluid. For example, if air is vented from cylinder block 151 below piston 152, the pressure in the cylinder and the upwards force on piston 152 will both begin to decrease, causing piston 152 to move downwards. Conversely, if fluid is added to cylinder block 151 below piston 152, the pressure in the cylinder and the upwards force acting on piston 152 will begin to increase, causing piston 152 to move upwards. By regulating the fluid pressure, for example, via the control unit 700 described herein, piston 152 and the load coupled to may be moved upwards or downwards at a near constant rate necessary to maintain equilibrium.

Figures 41A, 41B:
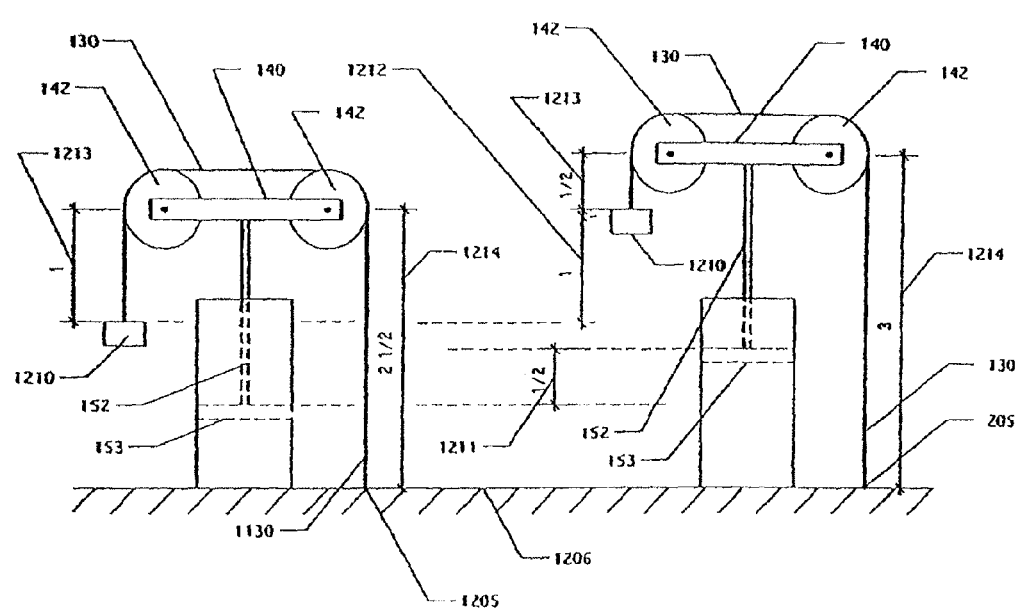
FIGS. 41A and 41B are schematic diagrams illustrating exemplary vertical motion of a load.

FIGS. 41A and 41B are illustrative schematic diagrams which illustrate the vertical motion provided by the column assembly of the present invention. As illustrated, one end of strap 130 is shown coupled to a fixed location 1205 on reference line 1206 and a load 1210 attached to the second end. In comparison to the exemplary embodiment manipulator system 10, this corresponds to the attachments of load carrying straps 130*a,b* to the interior of column body rear 103 and to main arm unit 500, respectively. Load 1210 is used in place of main arm assembly 500. In FIG. 41A, pulley lift carriage 140 is positioned so that the centers of pulleys 142 are positioned a distance (1214) 2½ units above reference line 1206, and the overall length of load carrying strap 130 is such that load 1210 is a distance (1213) 1 unit below the centers of pulleys 142. Thus, load 1210 is located 2½−1=1½ units above reference line 1206. Suppose that piston 153, piston rod 152, and load carrying carriage 140 are all raised a distance (1211) of ½ units. Such raised position is illustrated in FIG. 41B. Distance 1214 between the centers of pulleys 142 and reference line 1206 accordingly has increased by ½ unit to 3 units. Because the overall length of carrying strap 130 cannot change, distance 1213 from the center of pulleys 142 to load 1210 must be reduced by ½ a unit, i.e. from 1 unit to ½ a unit. Load 1210 is now 3−½=2½ units above reference line 1206. Thus, load 1210 has moved a total distance 1212 of 2½−1½=1 units; whereas, piston 153, piston rod 152, and pulley lift carriage 140 have moved only ½ a unit. Accordingly, in this embodiment, the load 1210 moves twice the distance that piston 152 moves.

Thus, the arrangement illustrated schematically by FIGS. 40, 41A, and 41B enables a load to be moved a distance corresponding to twice the stroke of an actuator; that is to say, the actuator's stroke is doubled. However, the actuator must be capable of supporting twice the weight of the load. In the case of a fluid-operated actuator, the applied force is proportional to the surface area of the piston. Thus, the "cost" of this stroke-doubling approach is increasing the diameter of the actuator cylinder by approximately 1.414. Also, it will be apparent to those of reasonable skill that the technique is not limited to fluid-operated actuators. Other types of actuators including electrical and manual actuators could also be employed. It is also reasonably apparent that the concept could be extended to have a motion multiplication of greater than two.

Figures 42A, 42B, 42C:
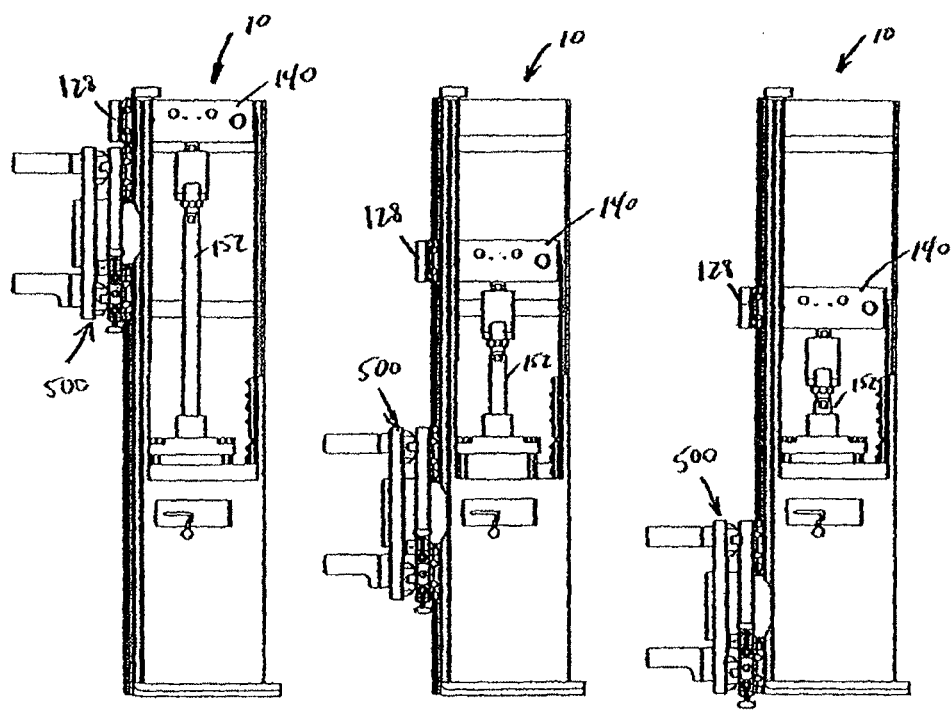
FIGS. 42A, 42B, and 42C are cut-away side views of the column assembly with the main arm in its lowermost, service and uppermost positions, respectively.

FIGS. 42A-42C illustrate the stroke-doubling feature in exemplary manipulator system 10. In particular, FIGS. 42A-C show, the relative positions of pulley carriage 140 and main arm assembly 500 with piston rod 152 fully extended, retracted to the service position, and fully retracted, respectively.

Figure 57:
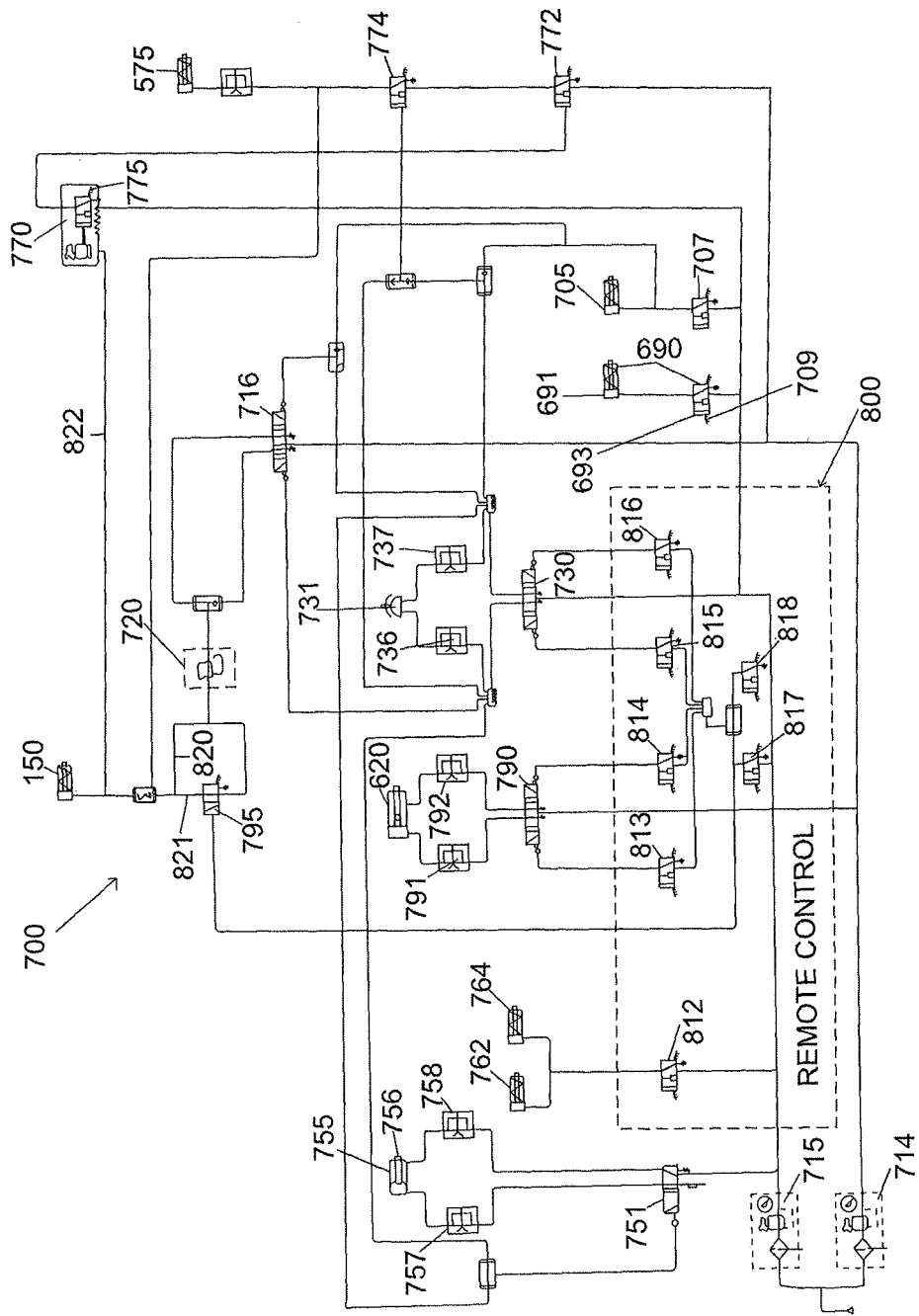
FIG. 57 is a schematic diagram of an illustrative pneumatic control system in accordance with an embodiment of the invention.

Having described a preferred embodiment of manipulator system 10, pneumatic control unit 700, which is a preferred embodiment of the present invention, will now be described with reference to FIGS. 43-57. FIG. 57 is a schematic diagram of the pneumatic control unit and is referenced at various points throughout the following description.

FIGS. 43-53 provide partial interior views (portions of the interior have been removed for clarity) of pneumatics control unit 700. Pneumatics control unit 700 is configured for use with manipulator system 10 described above, but may also be utilized with other manipulator systems and configurations. Control unit 700 includes mounting plate 710 and side plates 712*a* and 712*b*. Mounting plate 710 and side plates 712*a* and 712*b* may be formed from a single piece of sheet metal that is appropriately shaped and bent to orientate side plates 712*a* and 712*b* at right angles to mounting plate 710. Various air inlets 713 (e.g., a quick connect air inlet) are provided to facilitate air distribution into the unit from working pressure air supply 714 or control pressure air supply 715. Air regulator 720 is supported in the unit 700 and includes an inlet port 722 configured to receive air from working pressure air supply 714 and an outlet port 723 configured to provide a desired amount of pressure to main fluid-operated actuator 150 (piping, tubing and the like are not shown in the figures for clarity). An exemplary regulator 720 provided is SMC Model IR 3020-F03. Air supply control valve 716 is provided in the flow path between working pressure air supply 714 and regulator inlet port 722 and controls the direction of flow of working air pressure to regulator 720. As will be described in greater detail hereinafter, upon receipt of an up or down command, control pressure air will be directed to air supply control valve 716, whereupon, air supply control valve 716 will be actuated to an open position such that work pressure air flows to and through regulator 720. The amount of work pressure air that is regulated through regulator 720 is controlled by regulator adjusting shaft 725.

Regulator adjusting shaft 725 is pivoted or rotated to increase or decrease the pressure output of regulator 720. As described hereinafter, input drive wheel 734 is driven via the pneumatic control unit to provide automatic pivotal control of regulator adjusting shaft 725. Coupler 705 is attached to input drive wheel 734 and is coupled with regulator adjusting shaft 725 in a default condition, i.e. in a non-fluid energized condition. Pressure adjustment valve 707 controls flow of control pressure air to coupler 705. Referring to FIG. 57, pressure adjustment valve 707 has a default closed position. Depression of button 709 actuates pressure adjustment valve 707 to an open position wherein control pressure air flows to and actuates coupler 705 to an uncoupled position. Regulator adjusting shaft 725 is free to be rotated independent of coupler 705 and input drive wheel 734. Engagement slot 728 at the end of adjusting shaft 725 allows an operator to manually adjust the pressure output of regulator 720 by turning regulator adjusting shaft 725 (e.g., using a hex, slotted, or Phillips driver) either clockwise or counterclockwise. Such manual adjustment is generally provided to allow the operator to set or adjust the pressure to achieve an equilibrium state of the manipulator system 10 (i.e. to provide an air pressure approximately equal to, slightly less than, or slightly greater than the load on the piston 152).

As seen in FIG. 57, actuation of pressure adjustment valve 707 also provides control pressure air to secondary brake release valve 774. Secondary brake release valve 774 is part of a brake control safety system which generally maintains pneumatic lock module 575, described above, in a locked condition. Pneumatic lock module 575 has a default non-fluid energized locked position, i.e., if pneumatic lock module 575 does not receive fluid from work pressure air supply 714, pneumatic lock module 575 remains locked such that main arm assembly 500 is preventing from moving vertically relative to the column 100. Primary brake release valve 772 and secondary brake release valve 774 are positioned between working air pressure supply 714 and pneumatic lock module 575 and both valves 772 and 774 have a default closed position. Primary brake release valve 772 can only be actuated to an open position via safety valve 770. Safety valve 770 is a pressure actuated valve which opens when working pressure at main fluid-operated actuator 150, as determined by line 822 in FIG. 57, is above a threshold value. That is, if a sufficient working pressure is not in the system, safety valve 770 will remain closed and will not actuate primary brake release valve 772. Closed primary brake release valve 772 will prevent working air from reaching lock module 575 and such will remain locked. Once the system has a sufficient working pressure, safety valve 770 opens and control air pressure flows to primary brake release valve 772 and thereby actuates primary brake release valve 772. An adjustment control 775 is provided to facilitate setting of the desired minimum working pressure.

Secondary brake release valve 774 also has a default closed condition such that even if system pressure is sufficient and primary brake release valve 772 is open, working pressure air is prevented from reaching and releasing lock module 575 until secondary brake release valve 774 is actuated. Secondary brake release valve 774 is configured to be actuated when a definite command to allow movement of main arm assembly 500 is received. In the system illustrated in FIG. 57, these commands include either an up command or a down command, wherein control pressure air flows through up/down control valve 730, or a manual adjustment command, wherein control pressure air flows through pressure adjustment valve 707. In these desired movement conditions, control pressure air actuates secondary brake release valve 774 to an open position such that lock module 575 is actuated and released. At all other times, secondary brake release valve 774 remains closed such that lock module 575 remains in a locked condition.

Figure 44:
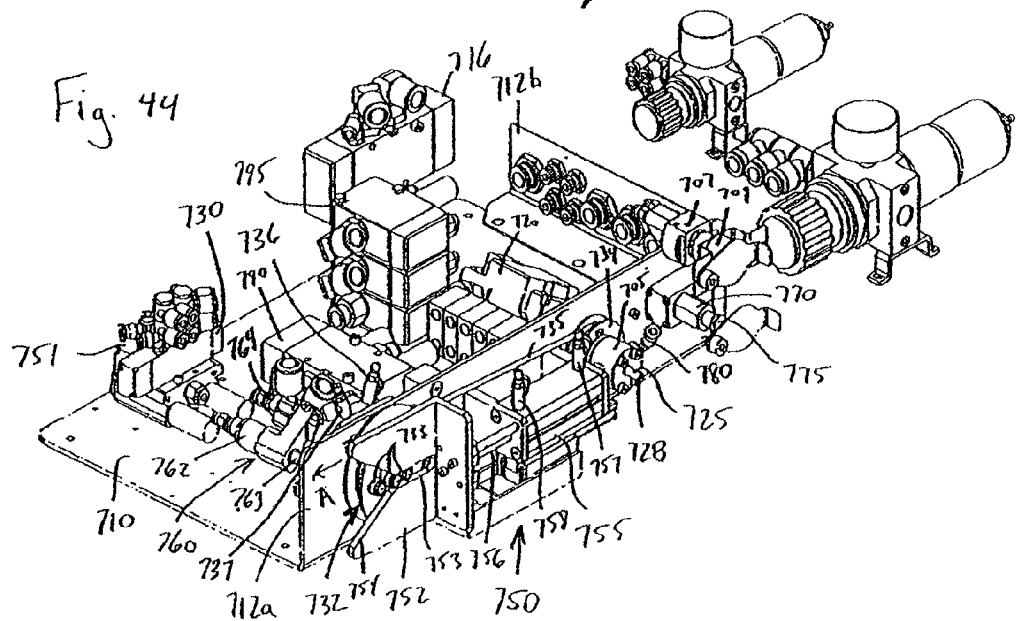

In addition to manual adjustment of the position of regulator adjusting shaft 725, the control unit 700 is also configured to facilitate remote control of the position of regulator adjusting shaft 725. Such remote control will generally be used to provide one of five operating conditions, namely, neutral mode, up mode, down mode, manual up mode and manual down mode, each described in more detail hereinafter. Pneumatically operated swivel actuator 731 is provided in control unit 700 to remotely control the position of regulator adjusting shaft 725. A suitable swivel actuator is the Swivel Module Type DSM available from Festo Corporation, Hauppauge, N.Y. The output shaft (not shown) of swivel actuator 731 extends through side plate 712a and is connected to output drive wheel 732 which in turn is drivingly connected to an input drive wheel 734 associated with regulator adjusting shaft 725. In the illustrated embodiment, output drive wheel 732 and input drive wheel 734 are both toothed and a tooth belt 735 extends therebetween. Other drive connections, for example, a linkage assembly, may alternatively be utilized. Accordingly, pivoting of the output shaft of swivel actuator 731 will cause a corresponding pivot or rotation of regulator adjusting shaft 725. As illustrated in FIG. 44, a gear ratio other than one-to-one between output drive wheel 732 and input drive wheel 734 may be utilized to achieve a desired relationship between the movement of the output shaft of swivel actuator 731 and the movement of regulator adjusting shaft 725.

Pivoting of the output shaft of swivel actuator 731 is pneumatically controlled. Swivel actuator 731 includes up inlet 736 and down inlet 737 which selectively receive air from control pressure air supply 715. In the present embodiment, the up inlet 736 and the down inlet 737 are each a one direction, speed/flow controller. Up/down control valve 730 is fluidly positioned between control pressure air supply 715 and the inlets 736 and 737. In general operation, upon receipt of an up command, either up mode or manual up mode, up/down control valve 730 supplies air pressure to up inlet 736, and upon receipt of a down command, either down mode or manual down mode, up/down control valve 730 supplies air pressure to down inlet 737. Control of up/down control valve 730 and associated actuation of swivel actuator 731 will be described in greater detail hereinafter.

Figure 43:
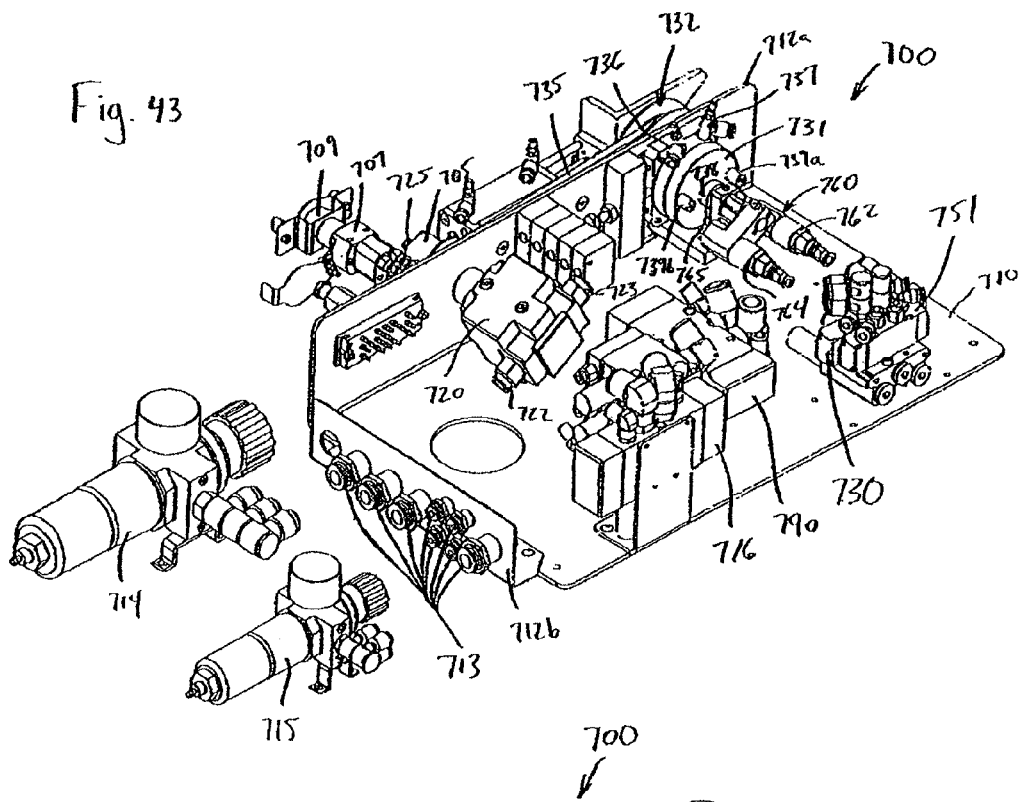
FIGS. 43 and 44 are partial internal views of a pneumatics control unit in accordance with an exemplary embodiment of the present invention with the unit in a neutral mode.

In the neutral mode, i.e. when regulator adjusting shaft 725 is in its pre-set position with manipulator system 10 in an equilibrium state, swivel actuator 731 must correspondingly be in a default neutral position wherein swivel actuator 731 does not pivot regulator adjusting shaft 725. This neutral mode condition is shown in FIGS. 43 and 44. No air pressure is supplied to either inlet 736 or 737 and rotating stop 738 on the inside surface of swivel actuator 731 is in a neutral position, preferably equidistant from up/down stops 739a/b. To ensure swivel actuator 731 is in this default position when the neutral mode is desired, neutral mode block assembly 750 is provided. Neutral mode block assembly 750 includes blocking member 752 which is linearly displaceable relative to output drive wheel 732. Blocking member 752 includes horizontal slot 753 with a tapered opening 754. Opening 754 is configured to guide alignment rollers 733 into horizontal slot 753 as blocking member 752 is moved linearly in the direction of arrow A in FIG. 44. Each alignment roller 733 is pivotally mounted on a front face of output drive wheel 732. Alignment rollers 733 are configured on output drive wheel 732 such that when alignment rollers 733 are aligned horizontally within horizontal slot 753, swivel actuator 731 is in the default neutral position. As such, linear movement of blocking member 752 in direction A positively positions swivel actuator 731 in the default neutral position.

In the present embodiment, linear movement of blocking member 752 is controlled via pneumatic actuator 755 with piston rod 756 connected to blocking member 752. Extend inlet 757 and retract inlet 758 are configured to selectively receive air from control air pressure supply 715 via block control valve 751. In the present embodiment, the extend inlet 757 and the retract inlet 758 are each a one direction, speed/flow controller. As shown in FIG. 57, block control valve 751 is such that the default flow of control air pressure from the valve is to extend inlet 757. As such, the default position of actuator 755 is with piston rod 756, and thereby blocking member 752, extended. As further illustrated in FIG. 57, when either an up or down command is provided to up/down control valve 730 via valves 815 or 816 in remote control unit 800, control air pressure is provided from up/down control valve 730 to an actuator of block control valve 751. Actuation of block control valve 751 redirects the control air supply to the retract inlet 758 such that block member 752 is retracted. With blocking member 752 retracted, as shown in FIG. 45, alignment rollers 733 are clear of horizontal slot 753 and output drive wheel 732 is free to pivot. In this preferred arrangement, blocking member 752 automatically moves to its retracted position upon receipt of either an up or down command. Without an up or down command, block control valve 751 is no longer actuated and blocking member 752 automatically returns to the extended position.

The up mode, down mode, manual up mode and manual down modes will now be described with reference to FIGS. 46-53. The up mode is illustrated in FIGS. 46, 46A and 47. Upon receipt of an "up" command from the remote controller (described hereinafter), block control valve 751 provides air pressure to retract inlet 758 of actuator 755 such that blocking member 752 is moved to the retracted position (see FIG. 47). Up/down control valve 730 similarly provides air pressure to up inlet 736. Since alignment rollers 733 are clear of horizontal slot 753, swivel actuator 731 is free to rotate output drive wheel 732. As seen in FIG. 47, output drive wheel 732 is rotated clockwise and thereby rotates input drive wheel 734 similarly such that regulator adjusting shaft 725 is rotated clockwise (see position of inlet 780, the function of which is described hereinafter, relative to its position in FIG. 44) to provide an increase in air pressure to main fluid-operated actuator 150. The amount of rotation of regulator adjusting shaft 725, and thereby the amount of air pressure increase, is selected such that the pressure in main fluid-operated actuator 150 will cause main arm assembly 500 to move upward automatically. As described hereinafter, the rate of movement may also be selectively controlled. Referring to FIG. 46A, swivel actuator 731 includes rotating stop 738 and up and down stops 739a and b. Rotating stop 738 rotates in correspondence to rotation of the output shaft of swivel actuator 731. Up stop 739a is fixedly positioned along the arcuate path of rotating stop 738 to define a maximum range of motion of rotating stop 738, and thereby the output shaft of swivel actuator 731, in the up direction. As such, this up stop 739a position defines a maximum amount of rotation of regulator adjustment shaft 725 in the increased pressure direction. Upon release of the "up" command, up/down control valve 730 stops the supply of air pressure to up inlet 736 and block control valve 751 automatically redirects air pressure from retract inlet 758 to extend inlet 757 such that blocking member 752 is moved linearly toward the block position and swivel actuator 731 is automatically moved to its default neutral position as shown in FIG. 44.

Referring to FIGS. 48, 48A and 49, the down mode operates in a similar fashion. Upon receipt of a "down" command from the remote controller, block control valve 751 provides air pressure to retract inlet 758 of actuator 755 such that blocking member 752 is moved to the retracted position (see FIG. 49). Up/down control valve 730 similarly provides air pressure to down inlet 737. Since alignment rollers 733 are clear of horizontal slot 753, swivel actuator 731 is free to rotate output drive wheel 732. As seen in FIG. 49, output drive wheel 732 is rotated counterclockwise and thereby rotates input drive wheel 734 similarly such that regulator adjusting shaft 725 is rotated counterclockwise (see the relative position of inlet 780) to provide a decrease in air pressure to main fluid-operated actuator 150. The amount of rotation of regulator adjusting shaft 725, and thereby the amount of air pressure decrease, is selected such that the pressure in main fluid-operated actuator 150 will allow main arm assembly 500 to move downward automatically. Referring to FIG. 48A, down stop 739b is fixedly positioned along the arcuate path of rotating stop 738 to define a maximum range of motion of rotating stop 738, and thereby the output shaft of swivel actuator 731, in the down direction. As such, this down stop 739b position defines a maximum amount of rotation of regulator adjustment shaft 725 in the decreased pressure direction. Upon release of the "down" command, up/down control valve 730 stops the supply of air pressure to down inlet 737 and block control valve 751 automatically redirects air pressure from retract inlet 758 to extend inlet 757 such that blocking member 752 is moved linearly toward the block position and swivel actuator 731 is automatically moved to its default neutral position as shown in FIG. 44.

In the up manual and down manual modes, only a slight pressure increase or decrease is desired such that main arm assembly 500 does not move up or down automatically, but instead the slight pressure change assists the operator in moving main arm assembly 500 manually either up or down. As such, regulator adjustment shaft 725 requires less rotation than in up mode or down mode operation. To limit rotation of swivel actuator 731, and thereby regulator adjustment shaft 725, in the manual modes, manual mode actuation assembly 760 is provided. Manual mode actuation assembly 760 includes linear actuators 762 and 764. Each linear actuator 762, 764 is configured to selectively extend a corresponding stop rod 763, 765 (see FIGS. 50 and 52, respectively) into the path of rotating stop 738 between its neutral position and the corresponding up or down stop 739a or b. Preferably, linear actuators 762 and 764 are pivotally adjusted so that the manual stop positions may be adjusted to, and set at, a desired location. Upon selection of manual mode on remote control unit 800 (see FIG. 55), manual valve 812 (see FIG. 56) provides air from control air pressure supply 715 to linear actuators 762 and 764, thereby extending stop rods 763 and 765. With both stop rods 763 and 765 extended, the operator is ready to select either manual up or manual down mode. If auto mode is thereafter desired, the knob 801 on remote control unit is switched and manual valve 812 stops providing air to linear actuators 762 and 764, whereby stop rods 763 and 765 retract.

Referring to FIGS. 50, 50A and 51, the manual up mode will be described. With the manual mode already selected, upon receipt of an "up" command from the remote controller, block control valve 751 provides air pressure to retract inlet 758 of actuator 755 such that blocking member 752 is moved to the retracted position (see FIG. 51). Up/down control valve 730 again provides air pressure to up inlet 736, however, contact of rotating stop 738 with stop rod 763 (see FIG. 50) limits rotation of swivel actuator 731. As seen in FIG. 51, output drive wheel 732 is rotated clockwise, however, to a lesser extent than in the up mode as seen in FIG. 47. Similarly, input drive wheel 734, and thereby regulator adjusting shaft 725, is rotated clockwise to a lesser extent (compare the position of inlet 780 in FIG. 51 to that in FIG. 47). Such limited rotation of regulator adjustment shaft 725 provides a slight increase in air pressure to main fluid-operated actuator 150 to assist an operator in moving main arm assembly 500 upward. Upon release of the "up" command, up/down control valve 730 stops the supply of air pressure to up inlet 736 and block control valve 751 automatically redirects air pressure from retract inlet 758 to extend inlet 757 such that blocking member 752 is moved linearly toward the block position and swivel actuator 731 is automatically moved to its default neutral position as shown in FIG. 44.

Referring to FIGS. 52, 52A and 53, the manual down mode will be described. With the manual mode already selected, upon receipt of a "down" command from the remote controller, block control valve 751 provides air pressure to retract inlet 758 of actuator 755 such that blocking member 752 is moved to the retracted position (see FIG. 51). Up/down control valve 730 again provides air pressure to down inlet 737, however, contact of rotating stop 738 with stop rod 765 (see FIG. 52) limits rotation of swivel actuator 731. As seen in FIG. 53, output drive wheel 732 is rotated counterclockwise, however, to a lesser extent than in the down mode as seen in FIG. 49. Similarly, input drive wheel 734, and thereby regulator adjusting shaft 725, is rotated counterclockwise to a lesser extent (compare the position of inlet 780 in FIG. 53 to that in FIG. 49). Such limited rotation of regulator adjustment shaft 725 provides a slight decrease in air pressure to main fluid-operated actuator 150 to assist an operator in moving main arm assembly 500 downward. Upon release of the "down" command, up/down control valve 730 stops the supply of air pressure to down inlet 737 and block control valve 751 automatically redirects air pressure from retract inlet 758 to extend inlet 757 such that blocking member 752 is moved linearly toward the block position and swivel actuator 731 is automatically moved to its default neutral position as shown in FIG. 44.

Having generally described the components of pneumatic control system 700 its operation via an exemplary remote control unit 800 will be described with reference to FIGS. 54-57. Referring to FIGS. 54 and 55, remote control unit 800 generally includes enclosed housing 802. Housing 802 may be provided with handle 804 or the like to facilitate holding thereof. As illustrated, various switches, knobs, buttons or the like are acuatable outside of housing 802. In the present embodiment, remote control unit 800 includes manual/auto knob 801; in/out switch 803; up/down switch 805 and slow/fast switch 807. More or fewer controls may be provided. Remote control unit 800 is fluidly connected to pneumatic control unit 700 via tubing or the like (not shown) with fluid entering remote control unit 800 from control air pressure supply 715 and exiting to the various components as explained below.

Referring to FIG. 56, which illustrates remote control unit 800 with a portion of housing 802 removed, manual/auto knob 801 is associated with and controls manual valve 812. As explained above, manual valve 812 provides fluid to linear actuators 762 and 764 upon selection of the manual mode.

In/out switch 803 is associated with and controls valves 813 and 814. Each of these valves 813, 814 is connected with in/out control valve 790. Upon receipt of control pressure air from valve 813, in/out control valve 790 is actuated to provide air from working pressure air supply 714 to inlet 791 at a near end of pneumatic cylinder 620 such that pneumatic cylinder 620 is retracted and base plate 605 is moved "in" along the Z-axis 1004. Conversely, upon receipt of control pressure air from valve 814, in/out control valve 790 is actuated to provide air from working pressure air supply 714 to inlet 792 at a far end of pneumatic cylinder 620 such that pneumatic cylinder 620 is extended and base plate 605 is moved "out" along the Z-axis 1004. In the present embodiment, inlets 791 and 792 are each a one direction, speed/flow controller. In/out switch 803 is biased to a neutral position wherein neither valve 813, 814 is actuated such that pneumatic cylinder 620 is not moved in either direction.

Up/down switch 805 is associated with and controls valves 815 and 816. Up/down switch 805 is biased to a neutral position wherein neither valve 815 nor valve 816 is actuated. Each of these valves 815, 816 controls fluid flow to up/down control valve 730. Upon receipt of fluid from valve 815, up/down control valve 730 provides air pressure to block control valve 751 which actuates block control valve 751 to provide air to retract inlet 758 to retract blocking member 752. Up/down control valve 730 also provides control pressure air to secondary brake release valve 774 such that pneumatic locking module 575 is released. Additionally, up/down control valve 730 provides control pressure air to air supply control valve 716 which is actuated to an open position in which working pressure air is provided to regulator 720. Finally, up/down control valve 730 provides air to up inlet 736 and control air pressure is supplied to actuate swivel actuator 731 in the up direction. These conditions remain as long as up/down switch 805 is maintained depressed to the up selection. Upon release of the switch 805, it returns to a neutral position and flow through up/down control valve 730 is terminated.

Similarly, upon receipt of fluid from valve 815, up/down control valve 730 provides air pressure to block control valve 751 which actuates block control valve 751 to provide air to retract inlet 758 to retract blocking member 752. Up/down control valve 730 also provides control pressure air to secondary brake release valve 774 such that pneumatic locking module 575 is released. Additionally, up/down control valve 730 provides control pressure air to air supply control valve 716 which is actuated to an open position in which working pressure air is provided to regulator 720. Finally, up/down control valve 730 provides air to down inlet 737 and control air pressure is supplied to actuate swivel actuator 731 in the down direction. These conditions remain as long as up/down switch 805 is maintained depressed to the down selection. Upon release of the switch 805, it returns to a neutral position and flow through up/down control valve 730 is terminated.

Slow/fast switch 807 is associated with and controls valves 817 and 818. Slow/fast or-gate 819 is associated with valves 817 and 818 and controls the flow of control pressure air based on the position of slow/fast switch 807. Referring to FIG. 57, if slow/fast switch 807 is in the slow position, control pressure air travels through valve 818 and slow/fast or-gate 819 directs the air only to the in/out valves 813, 814 and up/down valves 815, 816. The control pressure air reaching these valves is controlled as explained above. Alternatively, if slow/fast switch 807 is in the fast position, control pressure air travels through valve 817 from which it travels to the in/out valves 813, 814 and up/down valves 815, 816 for operation as described above, but also travels to fast control valve 795. Fast control valve 795 is positioned in secondary line 821 between regulator 720 and main fluid-operated actuator 150. Fast control valve 795 has a default closed position (the position when in the slow mode) such that working pressure air can only flow from regulator 720 to main fluid-operated actuator 150 over main supply line 820. However, when slow/fast switch 807 is in the fast position and control pressure air travels through valve 817 and actuates fast control valve 795, fast control valve 795 opens, thereby opening secondary line 821. The amount of fluid to main fluid-operated actuator 150 is now increased by the flow rate through secondary line 821, thereby increasing the operating rate of main fluid-operated actuator 150.

Figure 59:
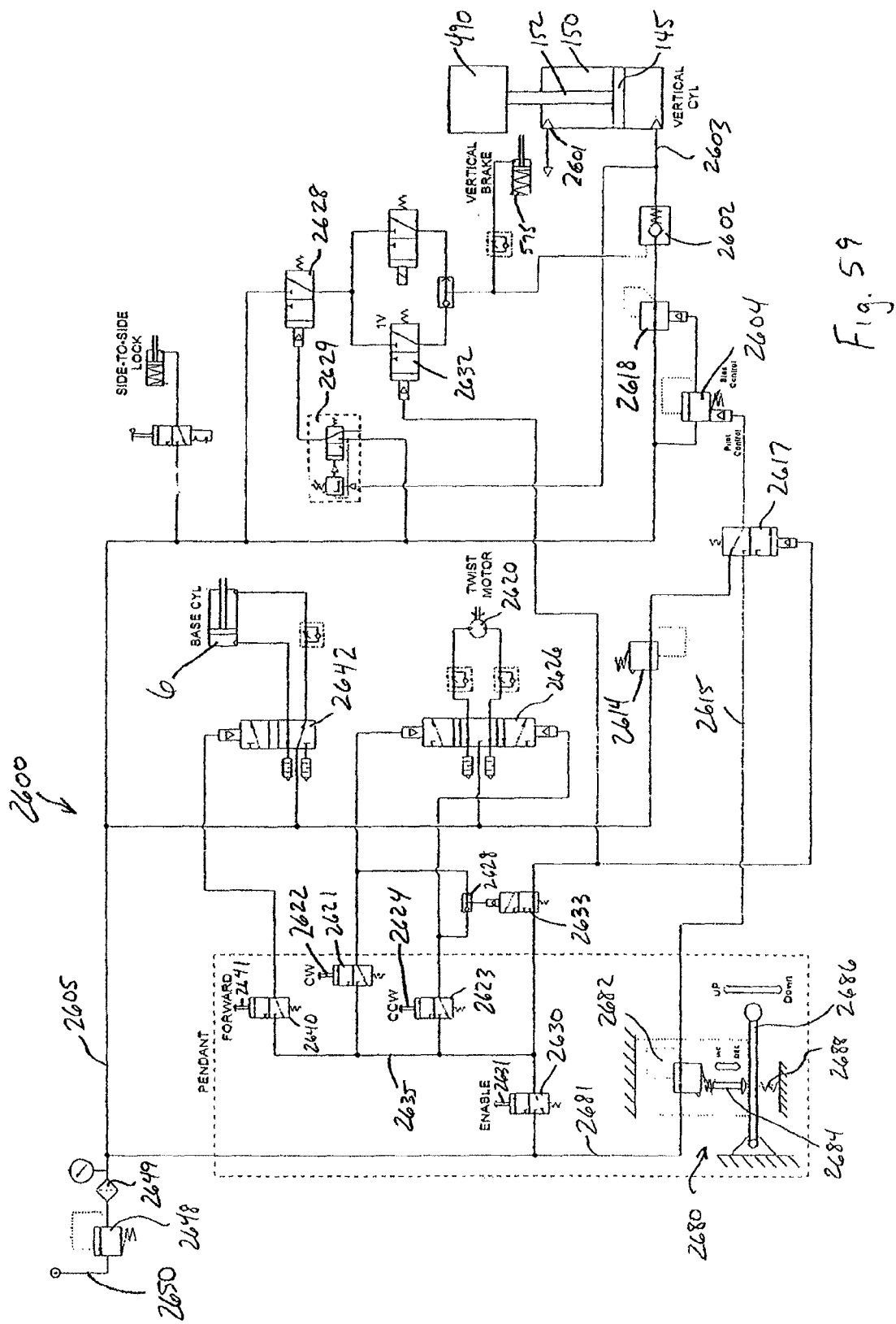
FIG. 59 is a schematic diagram of an illustrative pneumatic control system in accordance with another alternative embodiment of the invention.
Figure 60:
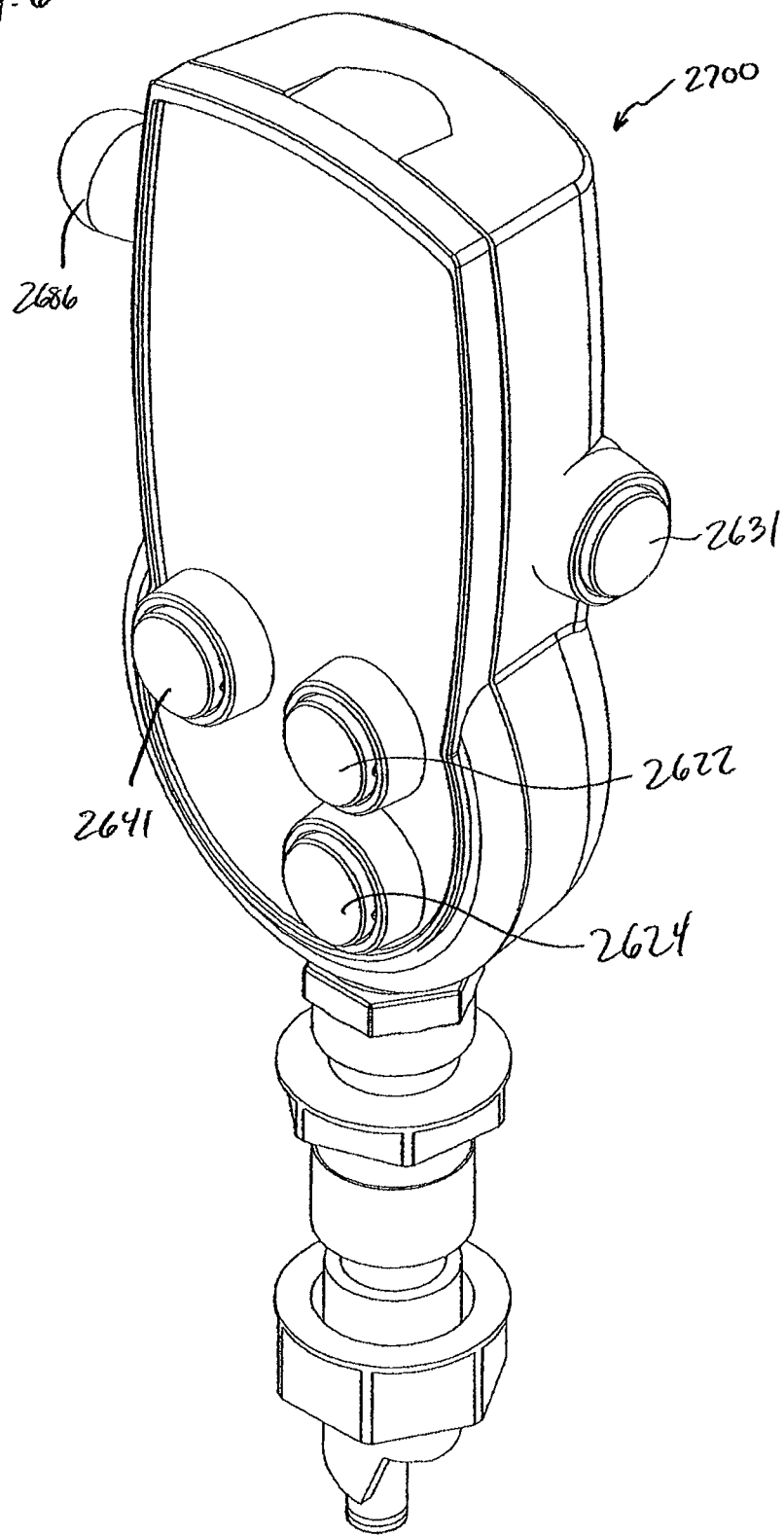
FIG. 60 is an isometric view of a remote control unit of the pneumatic control system of FIG. 59.
Figure 61:
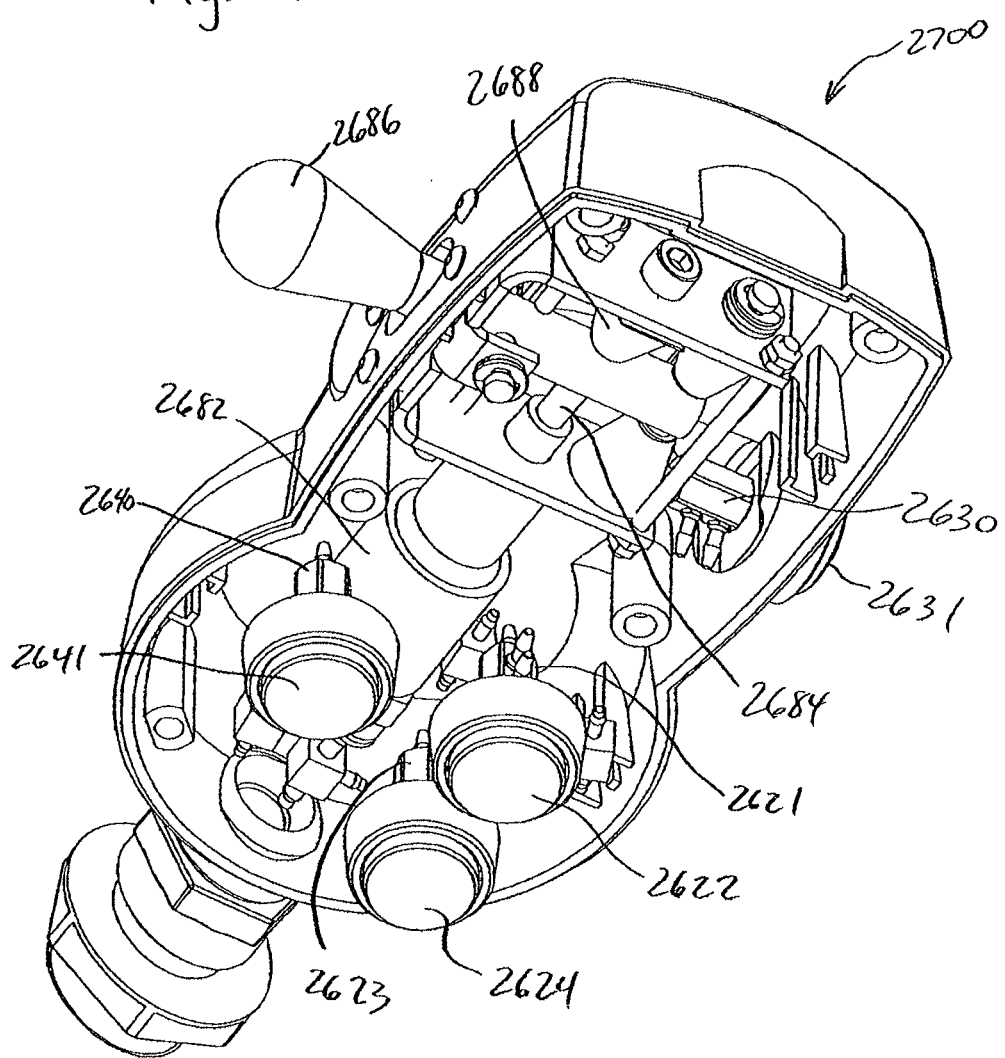
FIG. 61 is a view similar to FIG. 60 with the cover removed.

An alternative exemplary pneumatic control unit 2600 will be described with reference to FIGS. 59-61. The pneumatic control unit 2600 is configured to control the pressure and flow of fluid to fluid-operated actuator 150 to control the up and down motion of the piston rod 152 as well as its static and compliant behavior. Additional in and out and rotational control are also provided as described below. A pneumatic schematic diagram of the control unit 2600 is illustrated in FIG. 59 while an exemplary remote control unit 2700 is illustrated in FIGS. 60 and 61. Common elements are numbered alike in the figures. While the control unit 2600 is described herein as a pneumatic system utilizing air as the operating fluid, the invention system is not limited to such and other fluids, for example, oil, may be utilized.

In the present embodiment, the fluid-operated actuator 150 is a double acting cylinder which is vented to atmosphere at port 2601 on one side of the piston 145 and connected to a pneumatic feed line 2603 on the opposite side of the piston 45. A spring biased check valve 2602 is provided in feed line 2603 and is configured to close upon loss of pilot pressure in the system to prevent falling of the piston rod 152. A piloted, biased pressure regulator 2604 is positioned along the feed line 2603 and is configured to control the pressure (and consequently the rate of flow) of the fluid delivered to the fluid-operated actuator 150. The pressure regulator 2604 receives pressurized fluid from a pressure source 2650 along pressure feed line 2605. A pressure regulator 2648 is provided along the pressure feed line 2605 to regulate the fluid pressure to a desired pressure. Pressure regulator 2648 also includes a filter 2649 to clean the air as it enters the system.

Biased pressure regulator 2604 includes a biasing member, for example, a control knob, to allow mechanical adjustment of the pressure and fluid flow through regulator 2604 to initialize the system. The biasing member can also be subsequently adjusted to reset the system as necessary. The biasing member and pilot input port can be manipulated such that the fluid pressure passing through the biased pressure regulator 2604 provides an upwards force on piston 145 that is substantially equal to the downward force applied by the load on the piston rod 152. By equalizing such pressure, the pressure on the piston rod 152 is balanced such that the test head 490, is in a static or substantially weightless state. While in a weightless state, the heavy test head 490 may be manually positioned to dock (i.e., mate or engage) the test electronics of the heavy test head 490 with the IC under test disposed on the peripheral testing apparatus. As described in more detail in WO/05015245A2, due to friction and the breakaway force associated with piston 45, the upwards and downwards pressures acting on piston 45 do not need to be exactly equal to maintain a static position. As is further described in WO/05015245A2, the pressure provided by the system may be slightly adjusted higher or lower for added system functionality and capabilities.

A plunger throttle assembly 2680 is provided in the pneumatic control unit 2600 to allow an operator to control upward and downward movement of the piston rod 152. While a plunger throttle assembly is shown and described, other types of pneumatic components capable of modulating pressure (such as directional control valves) may be utilized. The plunger throttle assembly 2680 includes a plunger actuated pressure regulator 2682 which receives input pressure from the pressure source 2650 via line 2681 and supplies a supplemental pressure to the biased pressure regulator 2604 when enabled.

To prevent inadvertent movement of the test head 490, the pneumatic control unit 2600 includes an enablement valve 2630 which must be actuated before the lock module 575 is released to allow vertical motion and before the plunger throttle assembly 2680 is fluidly connected to the biased pressure regulator 2604. When the actuator 2631 of enablement valve 2630 is not depressed, no air flows through normally open system control valve 2633 and lock control valve 2632 remains closed, thus no air flows to the vertical lock module 575 or check valve 2602 and the piston rod 152 is restricted from moving. Also when enablement valve 2630 is not actuated, no air flows through normally open system control valve 2633 and regulator control valve 2617 remains in its initial position which allows regulated pressure from regulator 2614 to flow to the pilot input port of the biased pressure regulator 2604. The regulated pressure of regulator 2614 will always remain as a constant pressure P1. Pressure output P1 of regulator 2614 plus the bias control of the biased pressure regulator 2604 is sufficient to balance the load placed on the piston rod 152. The output of biased pressure regulator 2604 goes to the pilot input of volume booster regulator 2618. The volume booster regulator 2618 outputs the same pressure as received at the pilot input but at a higher flow capacity. Thus the pilot input of volume booster regulator 2618 is the same pressure as the output of volume booster regulator 2618. Check valve 2602 is between the regulator 2618 and the actuator 150 for safety to prevent sudden out rush of pressure from the actuator 150.

Pressing actuator 2631 allows air to flow through normally open system control valve 2633 and then to the pilot actuator of lock control valve 2632 which allows the lock module 575 and check valve 2602 to open, assuming the safety sensing valve 2629 is on and has opened lock safety valve 2628. Pressing actuator 2631 also allows air to flow through normally open system control valve 2633 and then to the pilot actuator of regulator control valve 2617 which then allows regulated pressure from the plunger actuated pressure regulator 2682 to flow to the pilot input port of biased pressure regulator 2604.

The present plunger actuated pressure regulator 2682 is continuously variable over a range from atmospheric pressure to a positive pressure via a plunger 2684. The plunger throttle assembly 2680 includes a handle 2686 or the like configured to engage the plunger 2684. A spring 2688 or the like biases the handle 2686 against the plunger 2684 so that the plunger 2684 is moved to a neutral position wherein a desired preload pressure flows through the regulator 2682. The preload pressure in the neutral position is the same pressure P1. The preload pressure can be any desired pressure, for example, 10 psi, to provide a sufficient range of increase or decrease in the set pressure. Movement of the handle 2686 toward the plunger 2684 causes an increased pressure more than the preload pressure to flow through the plunger actuated pressure regulator 2682 to the pilot control of the pressure regulator 2604. Movement of the handle 2686 away from the plunger 2684 causes a decreased pressure less than the preload pressure to flow through the plunger actuated pressure regulator 2682 to the pilot control of the pressure regulator 2604. The control of increased or decreased pressure is continuously variable over the range of, motion of the handle 2686 and provides the operator a means to control the vertical motion.

As set forth above, in the present embodiment, pneumatic control unit 2600 is also configured to control, in and out movement and rotational movement. Forward movement of the carriage is controlled by a forward control valve 2640 with an actuator 2641. Forward control valve 2640 receives input pressure over line 2635 which is output from enablement valve 2630. As such, enablement valve 2630 must be actuated to allow forward control. Pressing of the actuator 2641 when the enablement valve 2630 is actuated allows fluid to flow to the pilot control of normally closed forward actuation valve 2642. Forward actuation valve 2642 is opened and fluid pressure from line 2605 is provided to the horizontal motion control cylinder 6. In the present embodiment, the cylinder 6 is that of the embodiment shown and described with respect to FIGS. 17-32A, however; other configurations may also be utilized.

The control unit 2600 is also configured to control rotational movement via a twist motor 2620. Rotational movement is controlled by a clockwise control valve 2621 with an actuator 2622 and counterclockwise control valve 2623 with an actuator 2624. Both control valves 2621 and 2623 receive input pressure over line 2635 which is output from enablement valve 2630. As such, enablement valve 2630 must be actuated to allow rotational control. Pressing of the actuator 2622 when the enablement valve 2630 is actuated allows fluid to flow to the clockwise pilot control of three-way rotational actuation valve 2626. Rotational actuation valve 2626 is opened and fluid pressure from line 2605 is provided to the clockwise input of twist motor 2620. Alternatively, pressing of the actuator 2624 when the enablement valve 2630 is actuated allows fluid to flow to the counterclockwise pilot control of three-way rotational actuation valve 2626. Rotational actuation valve 2626 is opened and fluid pressure from line 2605 is provided to the counterclockwise input of twist motor 2620. As an additional safety feature, if either or both valves 2621, 2623 are actuated, the output of shuttle valve 2628 switches the position of normally open system control valve 2633, thus not allowing air to switch valves 2617 and 2632 which keep the vertical cylinder fixed during rotational movement.

Referring to FIGS. 62-68, an alternative manipulator system will be described. The manipulator system of the present embodiment is similar to the previous embodiment and components and items which are substantially the same will use the same reference numbers as the previous description while components and items which are similar but have changed will use the previous reference number with an "A" or "Alt" suffix appended to it.

Figure 62:
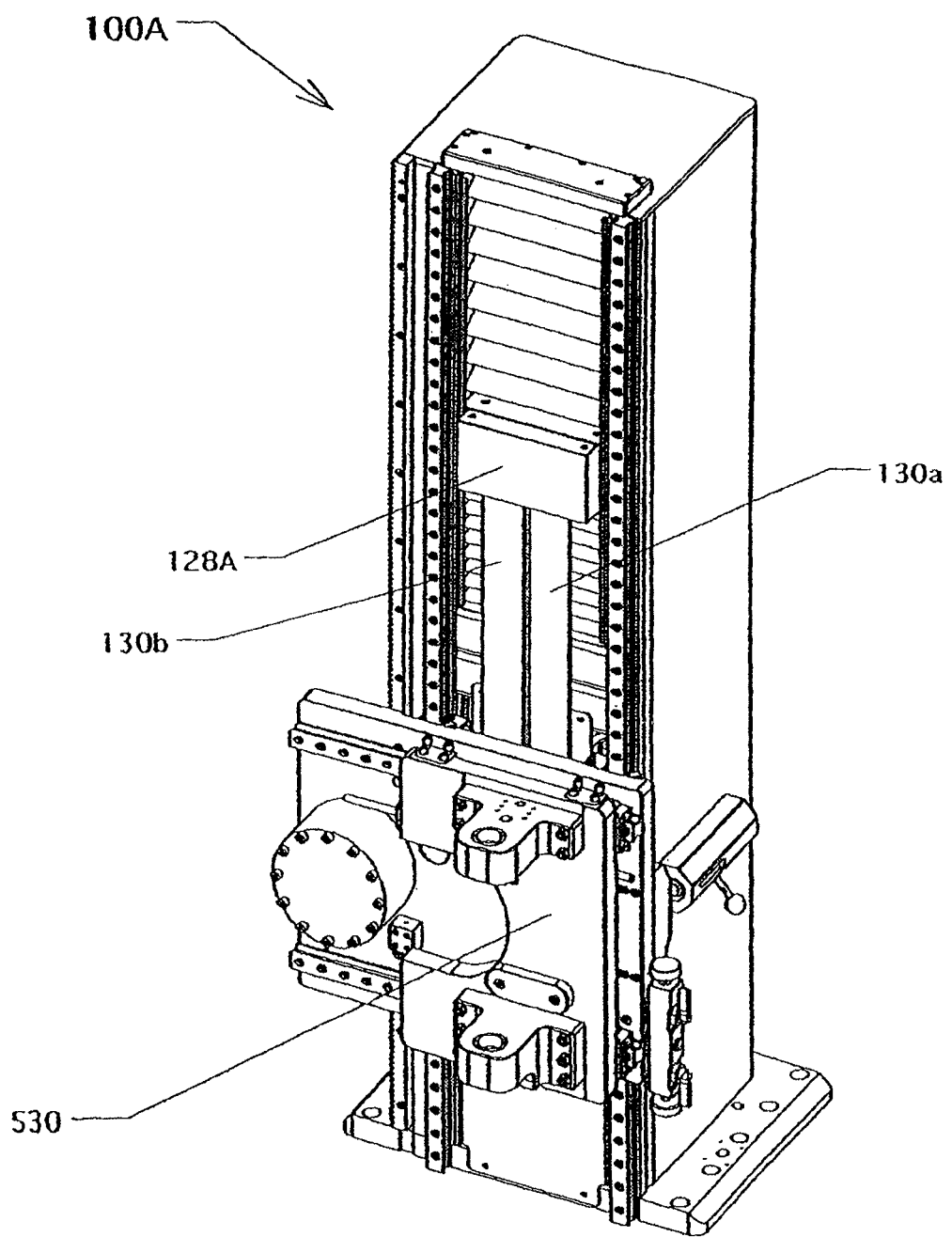
FIG. 62 is a front perspective view of a column assembly of an alternative embodiment of the manipulator system of the present invention with the main arm assembly in the service position.
Figure 64:
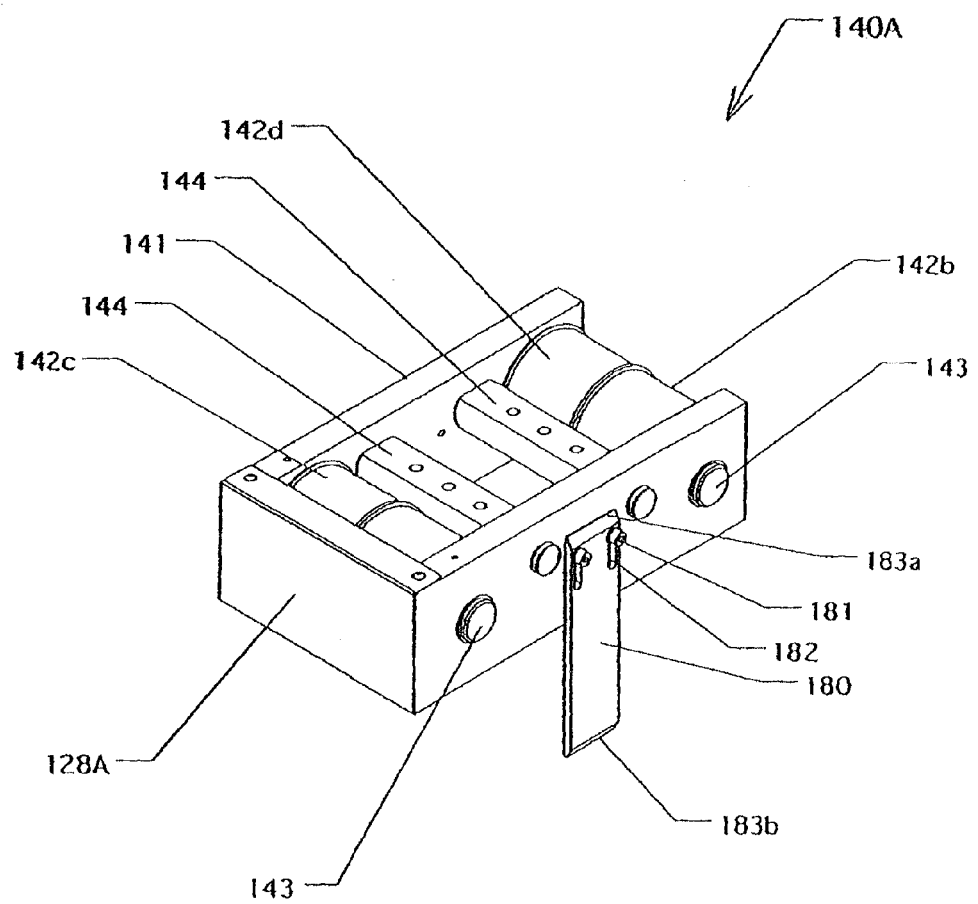
FIG. 64 is a perspective view of an alternative embodiment of the pulley lift carriage.

As shown in FIGS. 62 and 64, lift carriage 140A of column assembly 100A includes end cap 128A at the protruding end of lift carriage 140A. End cap 128A replaces the lift arm 128 of the previous embodiment. End cap 128A has a reduced width compared to lift arm 128 and does not require linear bearings 125a and 125b, as in the previous embodiment, which may result in less friction with respect to vertical motion. Such may be desirable in situations requiring compliant motion of the test head in response to external forces. End cap 128A is provided primarily for safety reasons; accordingly, end cap 128A may be fabricated from a reasonably heavy gauged sheet metal or other suitable material for such purpose. As shown in FIG. 64, lift carriage 140A includes pulleys 142a-142d and generally operates in a similar manner as lift carriage 140 shown and described with reference to FIG. 39.

Figure 63:
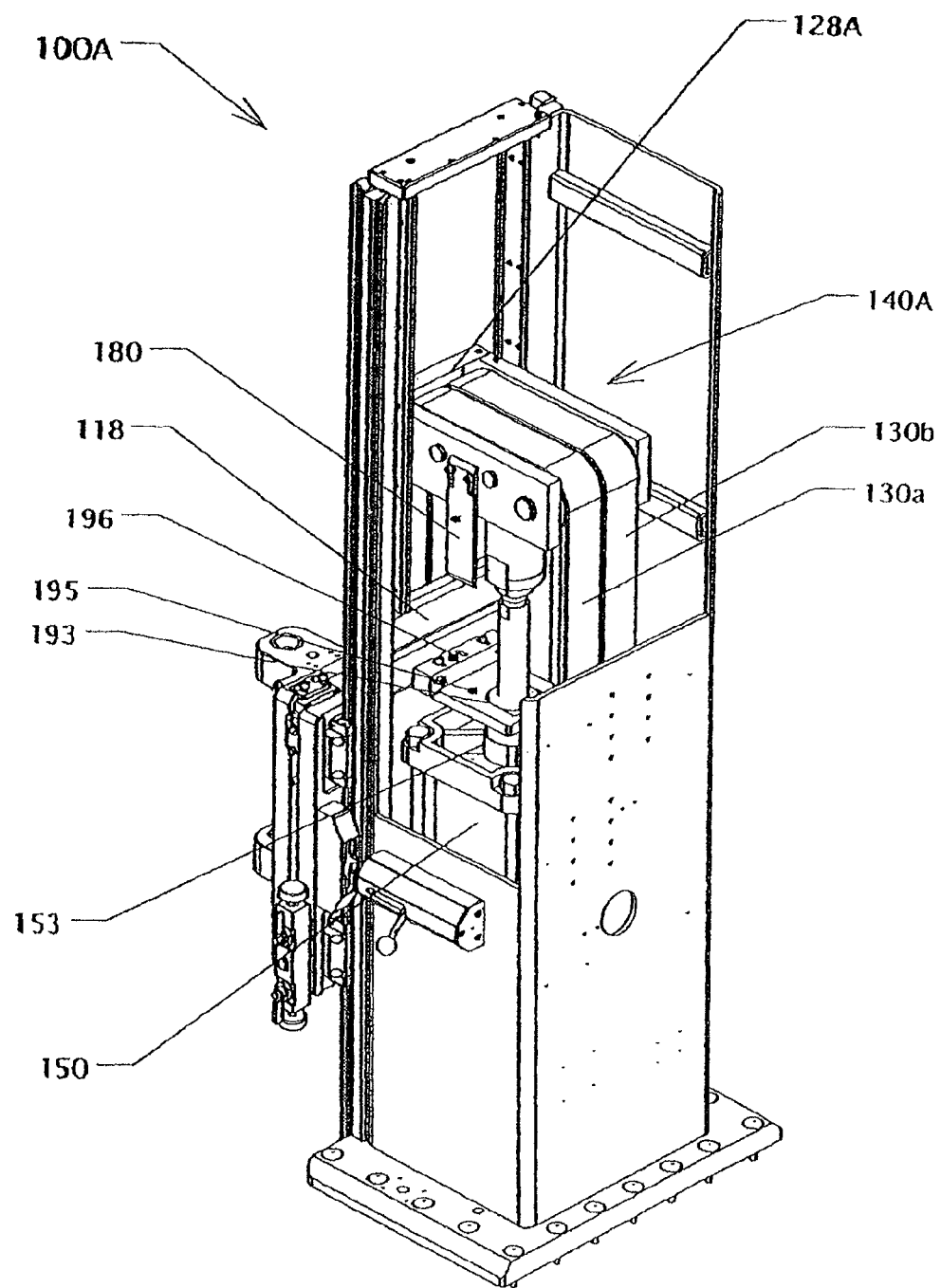
FIG. 63 is a right rear, cut-away perspective view of the column assembly of FIG. 62.

With the lift arm omitted, a support bracket may be included, as shown in FIG. 63, to minimize tipping of fluid-operated actuator 150. In the present embodiment, the support bracket comprises horizontal member 195 which is attached to front structural member 118 of column 100A via attachment member 196. Horizontal member 195 includes circular opening 193 which is configured to receive boss 153 (see FIG. 38) on the upper end of fluid-operated actuator 150. Boss 153 fits within circular opening 193 and thereby prevents fluid-operated actuator 150 from tipping in unloaded circumstances as described above.

Referring to FIGS. 58, 63, 64, 67 and 68, a speed control option which is incorporated into the present embodiment will be described. While the speed control option is described with reference to this embodiment, it is not limited to such and may be used with other embodiments of the manipulator system. Referring to FIGS. 63 and 64, valve actuator plate 180 is attached to lift carriage 140A. In the current embodiment, valve actuator plate 180 is attached with two screws 181 that are passed through slotted holes 182, which provides a means for adjustment, however, other connection means may be utilized. The opposed ends 183a, 183b of the exemplary actuator plate 180 are tapered.

Figure 67:
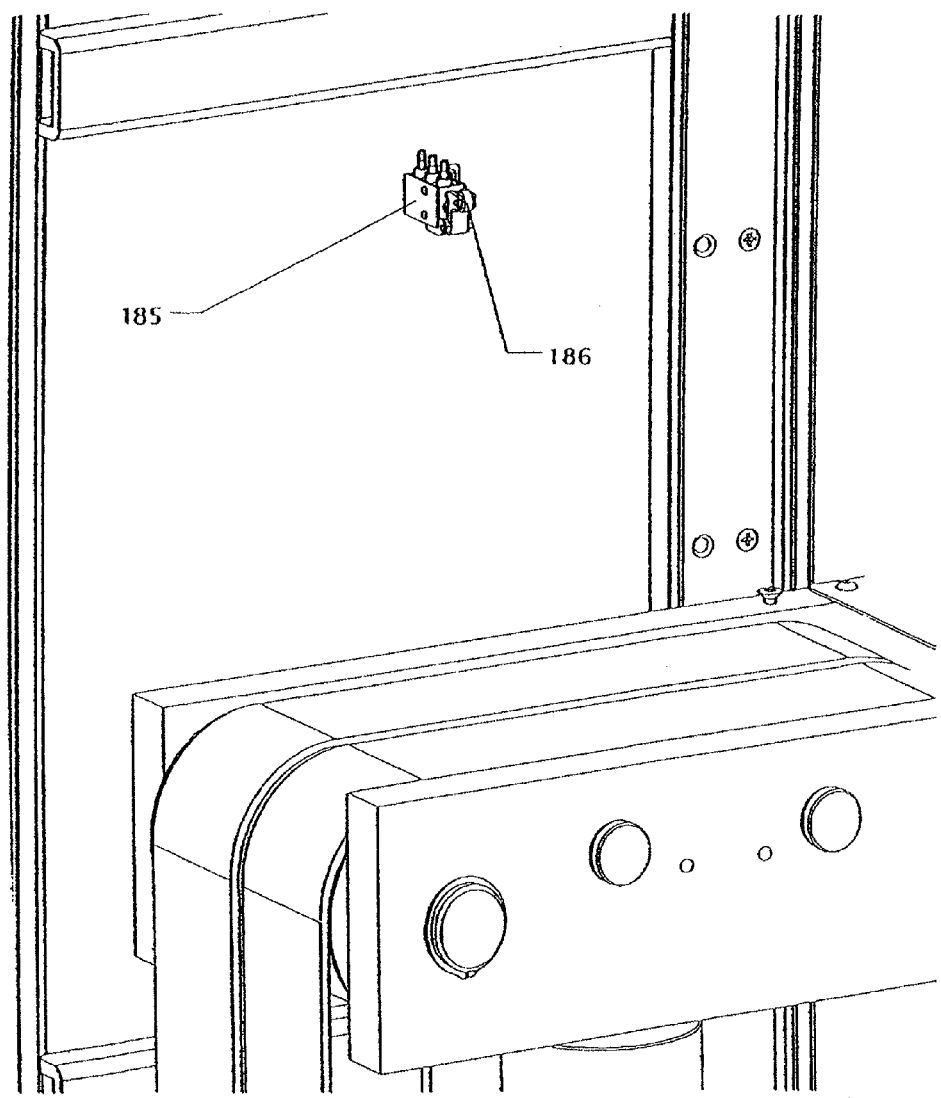
FIG. 67 is an expanded cut-away view of the interior of the column assembly of FIG. 66.
Figure 68:
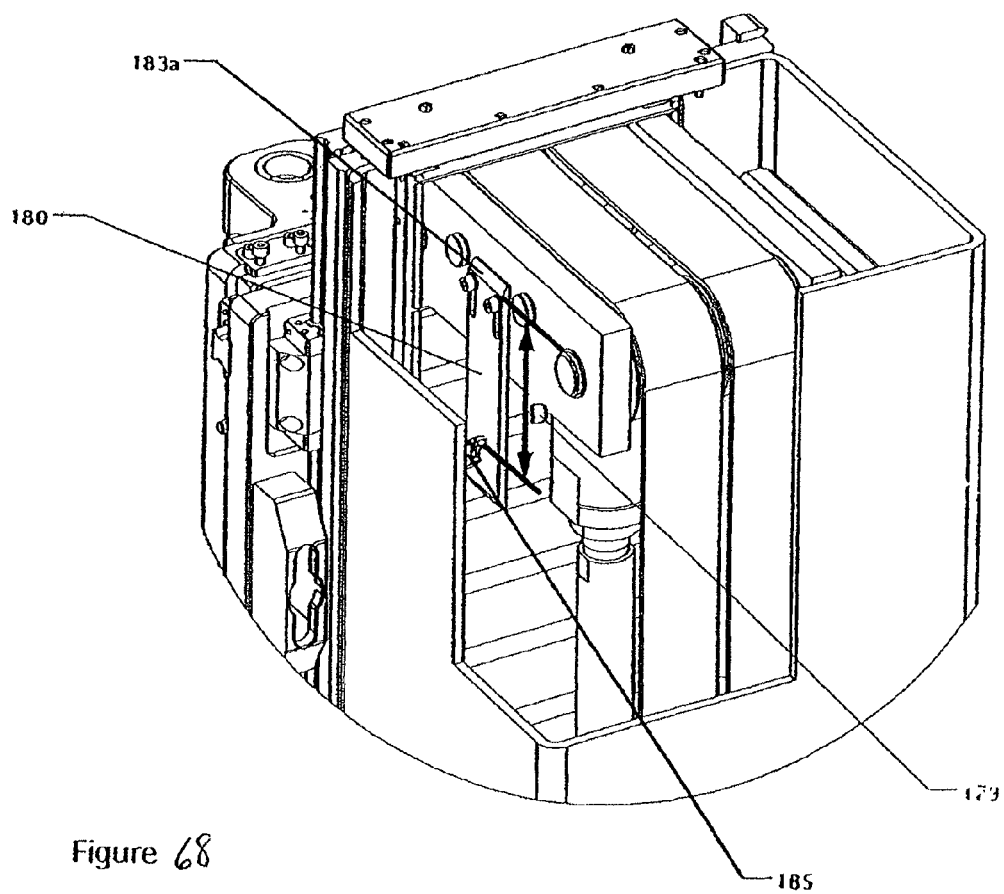
FIG. 68 is an expanded cut-away view of the column assembly of FIG. 62 with the main arm assembly in an upper position showing the interaction between the roller-actuated valve and the actuator plate.

Referring to FIGS. 67 and 68, roller-actuated 3/2 (3 ports/2 positions) valve 185 is provided on the interior of column assembly 100A. Roller-actuated valve 185 includes roller 186 which is movable between a first, non-contacted position in which valve 185 is not actuated and a second, depressed position in which valve 185 is actuated. Roller-actuated valve 185 is optional and is used with valve actuator plate 180. The use of valve actuator plate 180 and roller-actuated valve 185 is optional, depending upon application requirements. Valve-actuator plate 180 and roller-actuated valve 185 may also be optionally used in conjunction with the earlier described column 100 and lift carriage 140 of FIG. 39. Furthermore, while the present embodiment describes a fluid valve 185 acting as a switch, such valve may be replaced with an electrical switch or the like.

In FIG. 68, lift carriage 140A has been raised to it uppermost position. In this position, the valve-actuator plate 180 presses on roller 186 of roller-actuated valve 185, and, accordingly, valve 185 is switched into its second, actuated position. When lift carriage 140A is lowered from this position, roller 186 will first roll along actuator plate 180 for a distance D 179, remaining depressed and maintaining valve 185 in its actuated position. As carriage 140A is lowered further, roller 186 rolls off actuator plate 180 at tapered end 183a. Roller 186 then returns to its non-depressed position, and valve 185 switches to its first, non-actuated state. Conversely, when lift carriage 140A is moved in the opposite direction from the non-actuated state, as lift carriage 140A is raised, roller 186 eventually comes into initial engagement with tapered end 183a of actuator plate 180. As lift carriage 140A is further raised, roller 186 rolls onto actuator plate 180 and is depressed, thereby causing valve 185 to switch to its second, actuated state. Valve 185 remains in its actuated state as lift carriage 140A is raised to its uppermost position. Thus, the interaction of roller-actuated valve 185 and actuator plate 180 provides a signal indicating that lift carriage 140A is within a distance D 179 of its uppermost region of travel. This signal may be used by the fluid control signal to aid in the control of vertical motion of the load.

Again, the use of valve 185 and actuator plate 180 is optional and depends upon the circumstances of specific applications. Furthermore, although the arrangement just described is configured to detect motion near the upper (highest) limit of travel, valve 185 may be positioned elsewhere along the column and used to signal travel in other regions. For example, by locating a valve near the upper end of fluid-actuated cylinder 150, it would be possible to signal that the load is in the lower end of its range of travel. Also, valve 185 may be located at an intermediate position to indicate that the load is in an intermediate range of vertical travel that may be of interest, for example, in the vicinity of the service position or possibly in the vicinity of a docking position. Alternatively, multiple valves 185 may be provided at different positions to signal different positions of the lift carriage 140A.

Figure 58:
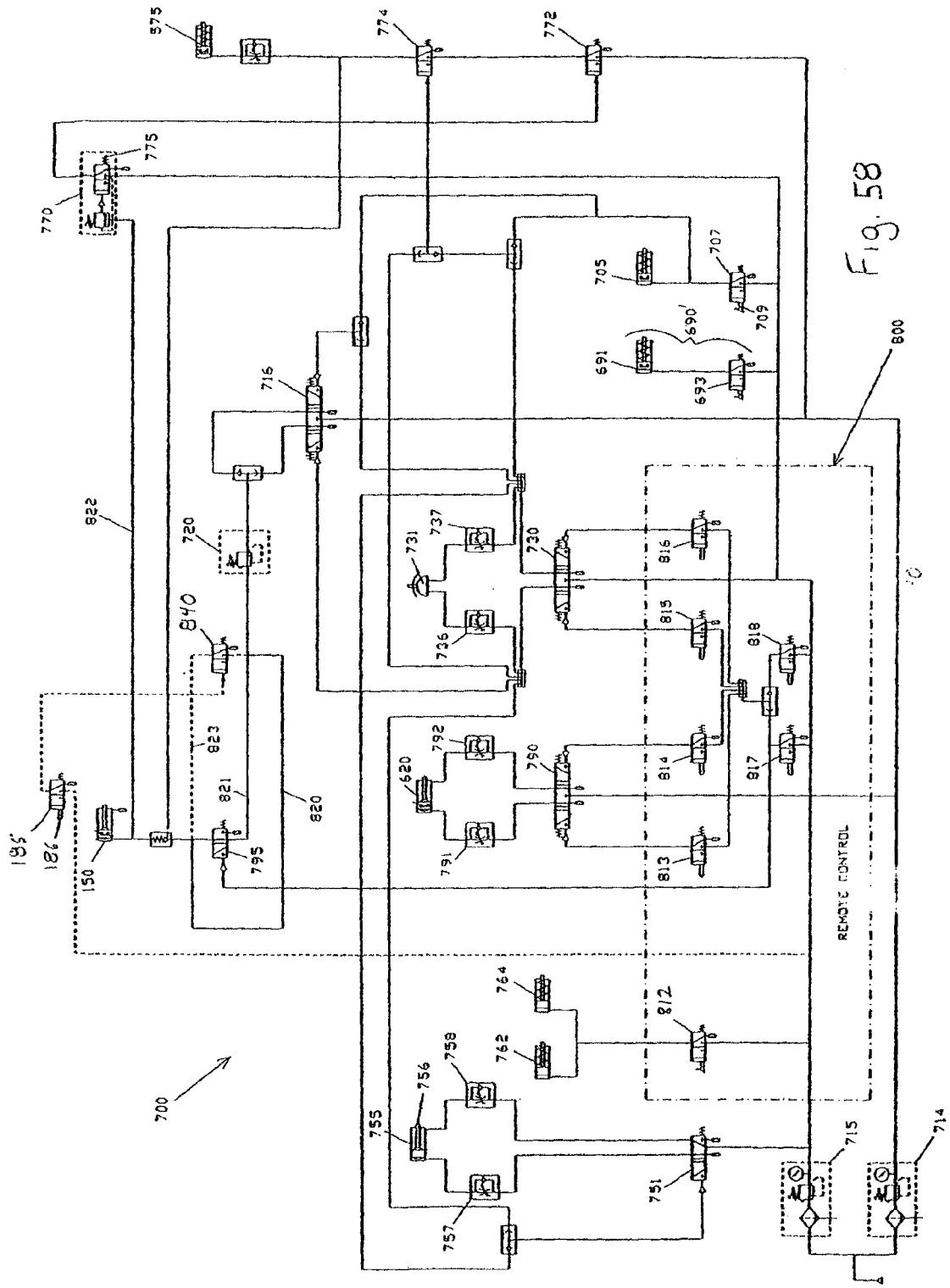
FIG. 58 is a schematic diagram of an illustrative pneumatic control system in accordance with an alternative embodiment of the invention.

Referring to FIG. 58, operation of the speed control option of the present embodiment will be described. Roller-actuated valve 185 receives control pressure air from control pressure air supply 715 and is configured to selectively provide control pressure air to supplemental air valve 840. Supplemental air valve 840 is an air actuated valve that is positioned in a supplemental line 823 between regulator 720 and fluid-operated actuator 150. Supplemental valve 840 has a normally closed position such that working pressure air does not flow therethrough, but instead flows to fluid-operated actuator 150 in the normal course as described above with reference to FIG. 57. In the first, non-actuated state, valve 185 is in a closed condition such that control pressure air does not pass thereby and supplemental valve 840 remains in the closed position. Upon movement of lift carriage 140A to the upper range of movement, i.e., within the range 179, roller 186 is depressed and valve 185 is actuated. Control pressure air passes through valve 185 and actuates supplemental air valve 840. Supplemental air valve 840 is opened and provides a supplemental flow path 823 between regulator 720 and fluid-operated actuator 150, thereby increasing the flow rate to fluid-operated actuator 150. In the present embodiment, the increased flow rate helps to maintain a constant motion of the fluid-operated actuator 150 as it extends to its outer limit. Other configurations may also be provided.

Although the present invention has been described primarily in terms of a test head attachment unit situated on a column where pneumatics are used to provide vertical motion in a substantially weightless condition, the novel concepts described herein may also be used with other types of manipulators, including, but not limited to counterbalanced manipulators. The invention does not depend upon the means of providing vertical support and motion.

Various aspects of the present invention have been described using pneumatic systems operating on compressible fluids. As used herein, the term "fluid" refers to a broad category of fluids including both gases and liquids.

As used herein, the term "compliant mechanism" refers to a mechanism (e.g., a spring, a pneumatic actuator, etc.) that at least partially provides a force for supporting a load in a substantially weightless condition in a direction or about an axis.

Although the present invention has primarily been described in terms of a test head for testing integrated circuits, it is not limited thereto. Various aspects of the invention may be applied to any of a number of different loads, particularly heavy loads that require precise manipulation and/or positioning.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A fluid control system for controlling a test head manipulator system which includes a main fluid actuator configured to vertically position a test head relative to a base structure, the fluid control system including: a regulator configured to controllably provide an output pressure to the main fluid actuator; a second fluidly controlled actuator configured to adjust the regulator to modify the output pressure provided to the main fluid actuator, the second actuator configured to be positively positioned in a plurality of operating modes, each operating mode causing the regulator to provide a different output pressure to the main fluid actuator.

2. A fluid control system according to claim 1, wherein the test head manipulator system comprises: a base structure; a main arm unit configured to support a test head and to be moved along a first axis relative to the base structure; an actuator having a range of motion of L along an axis parallel to the first axis; and an enhancement mechanism positioned between the main arm unit and the actuator and configured such that movement of the actuator a first distance causes the main arm unit to move along the first axis a second distance that is greater than the first distance.

3. The test head manipulator system according to claim 2 wherein the enhancement mechanism includes a lift carriage which is associated with and moves with the actuator.

4. The test head manipulator system according to claim 3 wherein the enhancement mechanism further includes a strap which is looped about the lift carriage and which has a first end secured relative to the base structure and a second end secured relative to the main arm unit.

5. The test head manipulator system according to claim 4 wherein the lift carriage includes at least one pulley which supports the strap.

6. The test head manipulator system according to claim 3 wherein the lift carriage includes a lift arm which travels along the first axis and guides the lift carriage.

7. The test head manipulator system according to claim 2 wherein the second distance is at least twice the first distance.

8. The fluid control system according to claim 1 wherein the second actuator is configured to be positively positioned in at least three operating modes.

9. The fluid control system according to claim 1 wherein the second actuator is configured to be positively positioned in at least four operating modes.

10. The fluid control system according to claim 9 wherein the second actuator is configured to be positively positioned in a fifth operating mode which is a neutral mode.

11. The fluid control system according to claim 1 further comprising a fluidly actuated safety lock configured to lock the vertical position of the test head relative to the base structure if a fluid pressure in the main fluid actuator is below a threshold value.

12. The fluid control system according to claim 1 further comprising a fluid rate control including at least one directional control valve which is fluidly or mechanically actuable between an open and closed position to increase or decrease, respectively, a rate of fluid flow to the main fluid actuator.

13. The fluid control system according to claim 1 wherein one of the operating modes is a manual up mode wherein the output pressure is slightly greater than the pressure required to balance the load such that the amount of external force required to move the load upwards is reduced but the output pressure is not enough for the load to move unassisted.

14. The fluid control system according to claim 1 wherein one of the operating modes is a manual down mode wherein the output pressure is slightly less than the pressure required to balance the load such that the amount of external force required to move the load downwards is reduced but the output pressure is not enough for the load to move unassisted.

15. The fluid control system according to claim 1 wherein one of the operating modes is an up mode wherein the output pressure is greater than the pressure required to balance the load such that the load moves upward unassisted.

16. The fluid control system according to claim 1 wherein one of the operating modes is a down mode wherein the output pressure is less than the pressure required to balance the load such that the load moves downward unassisted.

17. A fluid control system according to claim 1, further comprising: a supplemental flow path extending between the regulator and the main fluid actuator; a supplemental valve positioned along the supplemental flow path and configured to control flow therealong; and a controller configured to determine a vertical extension of the main fluid actuator and control the supplemental valve when the main fluid actuator is vertically extended within a given range.

18. The fluid control system of claim 17 further comprising at least a second supplemental flow path with a corresponding supplemental valve, and wherein the controller is configured to determine the vertical extension of the main fluid actuator over multiple ranges and control a respective supplemental valve in response to a determined range, the load may be substantially balanced with respect to rotation about the given axis.

* * * * *